(12) United States Patent
Endo et al.

(10) Patent No.: US 8,093,136 B2
(45) Date of Patent: Jan. 10, 2012

(54) METHOD FOR MANUFACTURING SOI SUBSTRATE

(75) Inventors: Yuta Endo, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 282 days.

(21) Appl. No.: 12/340,869

(22) Filed: Dec. 22, 2008

(65) Prior Publication Data
US 2009/0170287 A1   Jul. 2, 2009

(30) Foreign Application Priority Data

Dec. 28, 2007   (JP) ................................. 2007-338907
Dec. 28, 2007   (JP) ................................. 2007-339378

(51) Int. Cl.
*H01L 21/30* (2006.01)
*H01L 21/46* (2006.01)

(52) U.S. Cl. ........ 438/458; 438/455; 438/479; 438/679; 257/E21.568; 257/E21.561; 257/E21.567

(58) Field of Classification Search .................. 438/458, 438/455, 479, 697; 257/E21.568, E21.561, 257/E21.567
See application file for complete search history.

(56) References Cited

U.S. PATENT DOCUMENTS

| | | | |
|---|---|---|---|
| 6,555,443 B1 | 4/2003 | Artmann et al. | |
| 6,627,519 B2 | 9/2003 | Kwon et al. | |
| 7,119,365 B2 | 10/2006 | Takafuji et al. | |
| 7,615,466 B2 * | 11/2009 | Kononchuk | 438/458 |
| 2005/0136554 A1 * | 6/2005 | Okita et al. | 438/3 |
| 2005/0218463 A1 * | 10/2005 | Hao et al. | 257/411 |
| 2006/0220063 A1 * | 10/2006 | Kurachi et al. | 257/194 |
| 2006/0255341 A1 * | 11/2006 | Pinnington et al. | 257/79 |
| 2006/0264004 A1 * | 11/2006 | Tong et al. | 438/455 |
| 2007/0020947 A1 * | 1/2007 | Daval et al. | 438/758 |

(Continued)

FOREIGN PATENT DOCUMENTS

DE   19936941   5/2000

(Continued)

OTHER PUBLICATIONS

Chinese Office Action (Application No. 200810189735.8) Dated Aug. 25, 2011.

*Primary Examiner* — Thanh V Pham
*Assistant Examiner* — Maria Ligai
(74) *Attorney, Agent, or Firm* — Eric J. Robinson; Robinson Intellectual Property Law Office, P.C.

(57) ABSTRACT

A single crystal semiconductor substrate and a base substrate are prepared; a first insulating film is formed over the single crystal semiconductor substrate; a separation layer is formed by introducing ions at a predetermined depth through a surface of the single crystal semiconductor substrate; plasma treatment is performed on the base substrate so as to planarize a surface of the base substrate; a second insulating film is formed over the planarized base substrate; a surface of the first insulating film is bonded to a surface of the second insulating film by making the surface of the single crystal semiconductor substrate and the surface of the base substrate face each other; and a single crystal semiconductor film is provided over the base substrate with the second insulating film and the first insulating film interposed therebetween by performing separation at the separation layer.

34 Claims, 34 Drawing Sheets

U.S. PATENT DOCUMENTS

| | | |
|---|---|---|
| 2007/0063281 A1 | 3/2007 | Takafuji et al. |
| 2007/0117281 A1 * | 5/2007 | Endo et al. .................... 438/149 |
| 2007/0170503 A1 | 7/2007 | Allibert et al. |
| 2008/0224274 A1 | 9/2008 | Yamazaki et al. |
| 2008/0248629 A1 | 10/2008 | Yamazaki |

FOREIGN PATENT DOCUMENTS

| | | |
|---|---|---|
| JP | 09-162088 | 6/1997 |
| JP | 2002-231910 | 8/2002 |
| JP | 2004-087606 | 3/2004 |
| JP | 2007-201429 | 8/2007 |

* cited by examiner

FIG. 3A PROCESS A
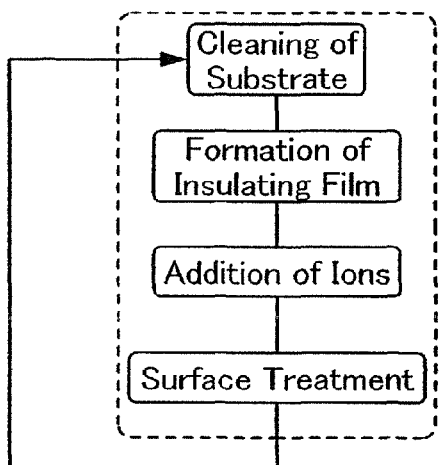
FIG. 3B PROCESS B
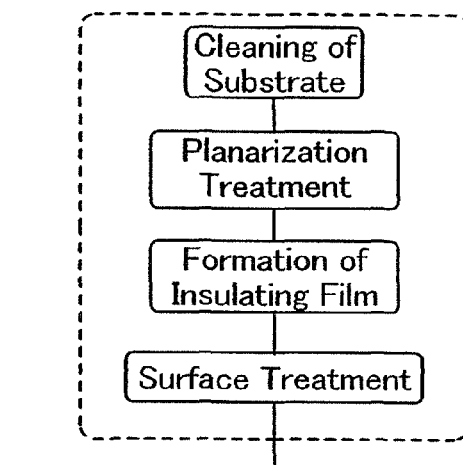
FIG. 3C PROCESS C
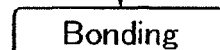
FIG. 3D PROCESS D
Reuse
FIG. 3E PROCESS E
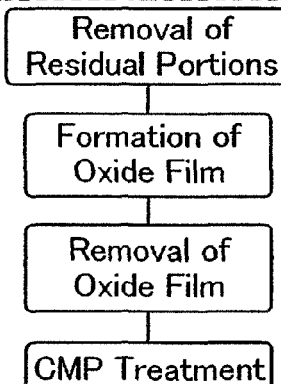
FIG. 3F PROCESS F
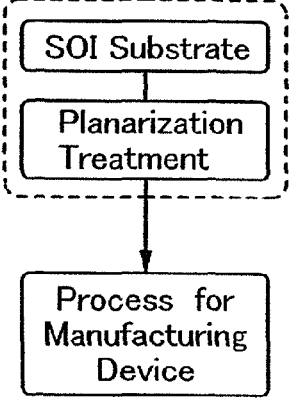

FIG. 4A
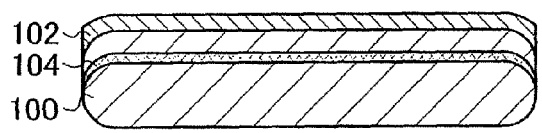
FIG. 4B
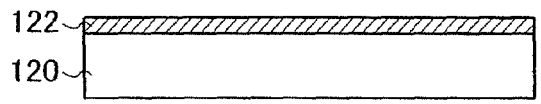
FIG. 4C Bonding
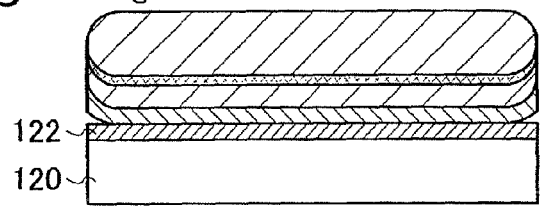
FIG. 4D
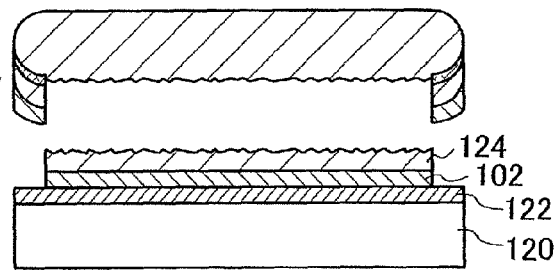
FIG. 4E-1
FIG. 4F-1
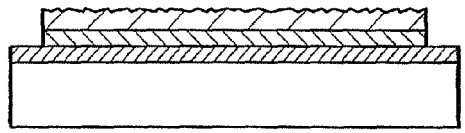
FIG. 4E-2
FIG. 4F-2
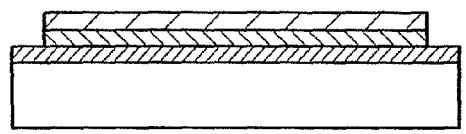
↓
Process for Manufacturing Device
FIG. 4E-3
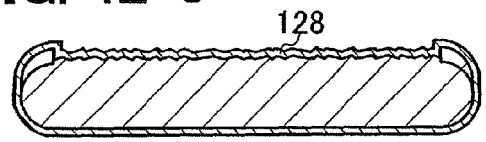
FIG. 4E-4
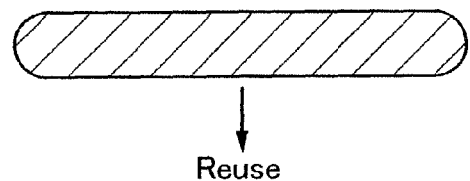
↓
Reuse

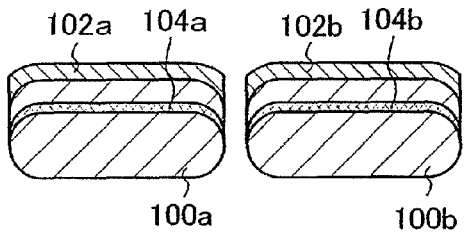
FIG. 5A-1
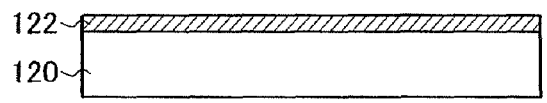
FIG. 5B
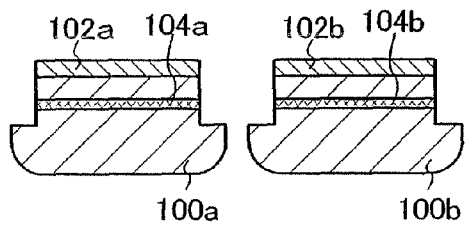
FIG. 5A-2
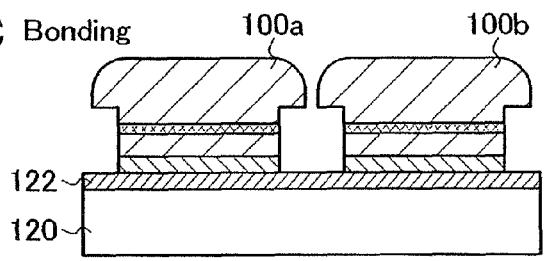
FIG. 5C Bonding
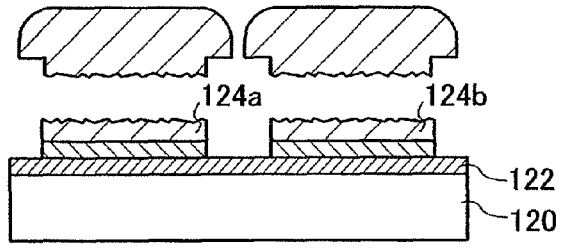
FIG. 5D Heat Treatment, Separation FIG. 12A
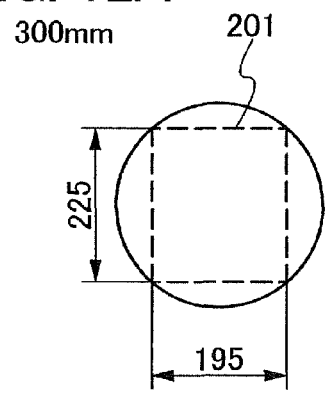
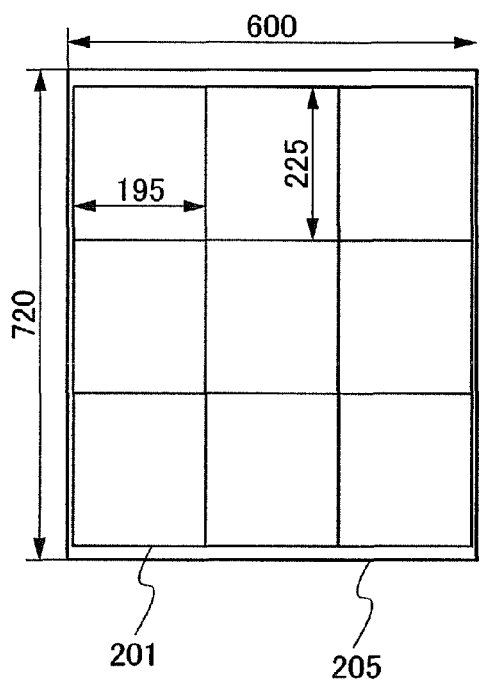
FIG. 12B
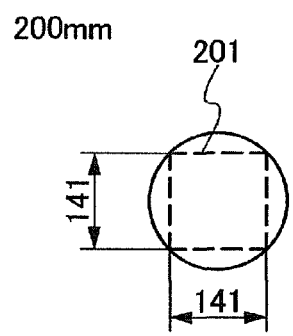
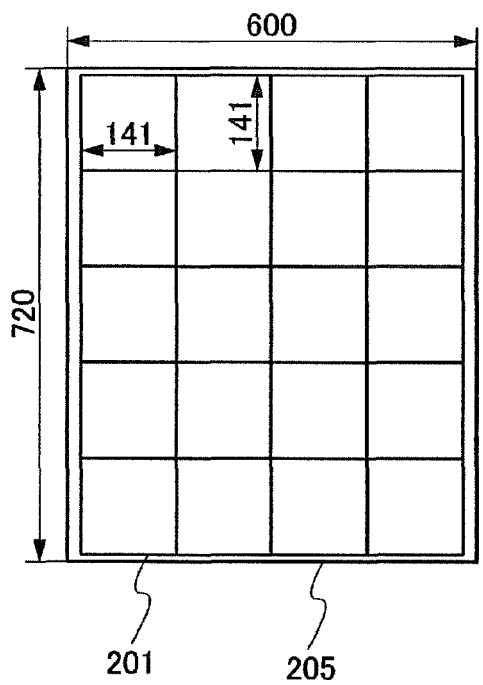

FIG. 13A
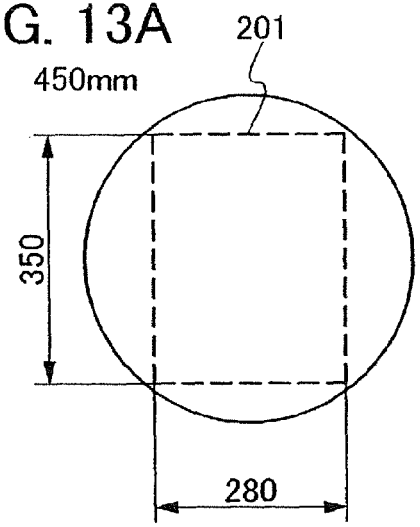
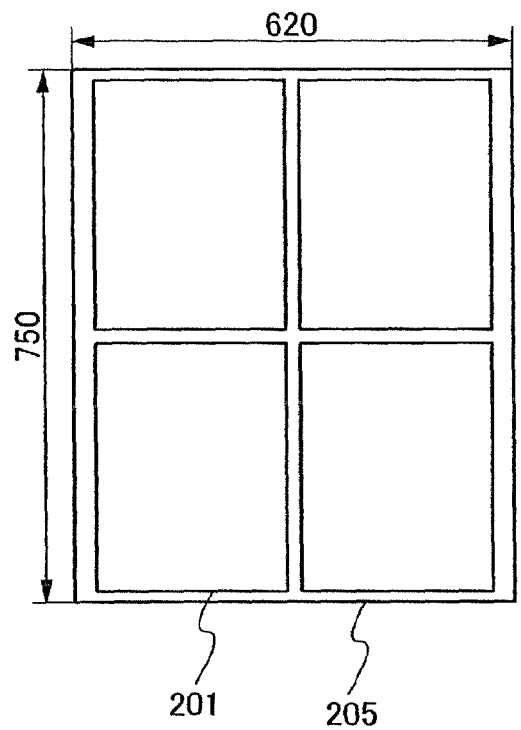
FIG. 13B
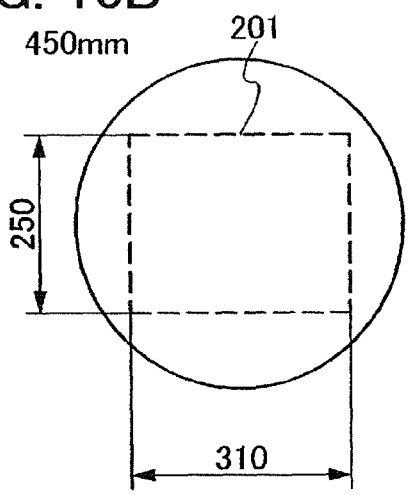
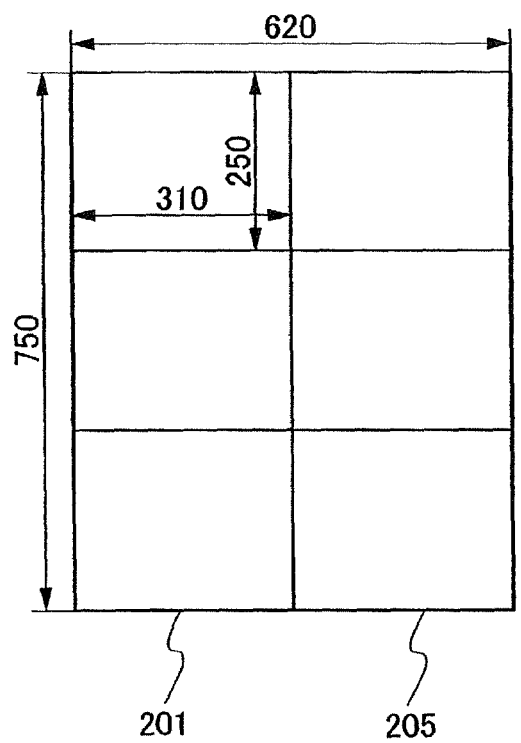

FIG. 15A
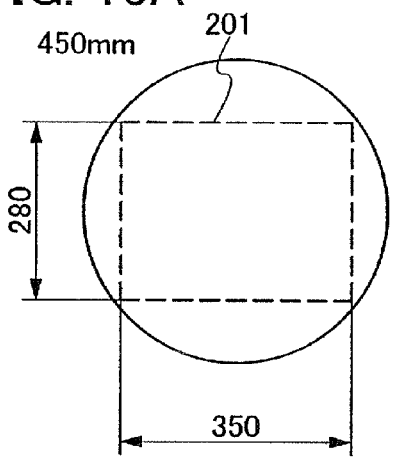
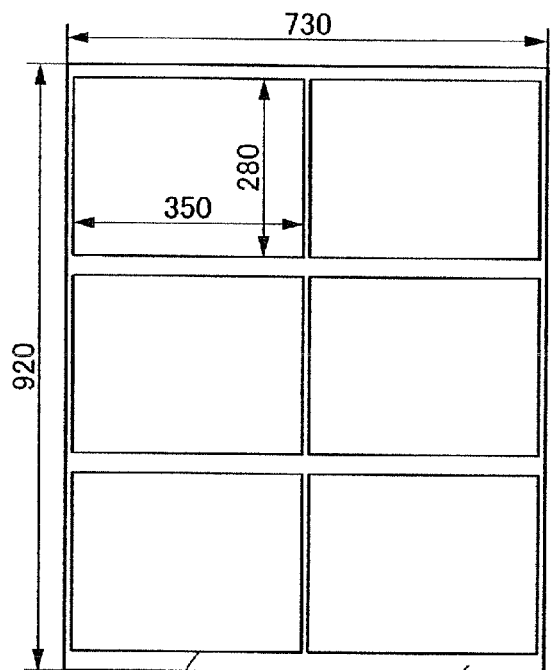
FIG. 15B
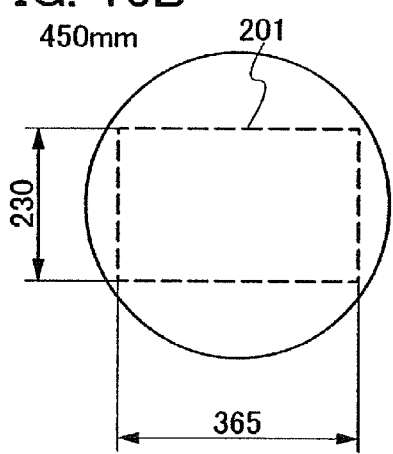
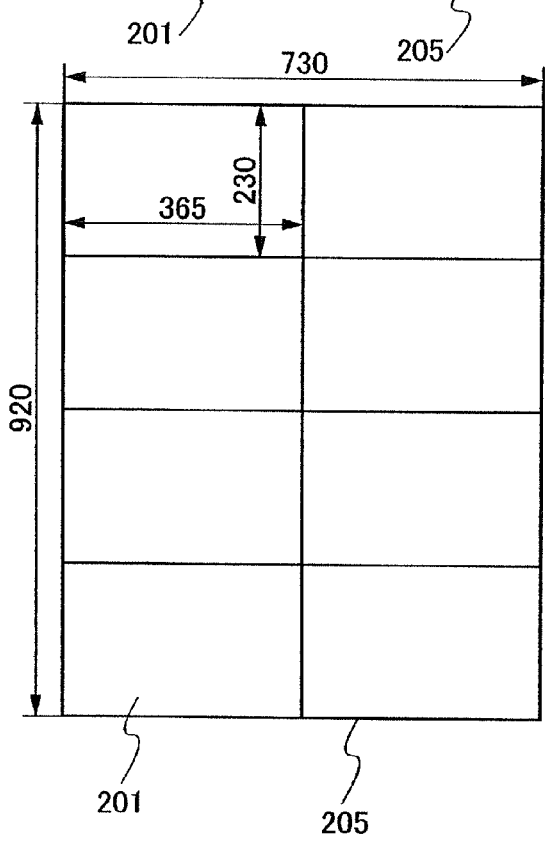

FIG. 16A
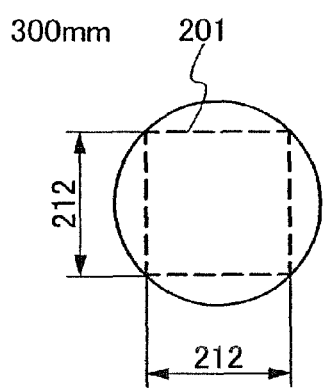
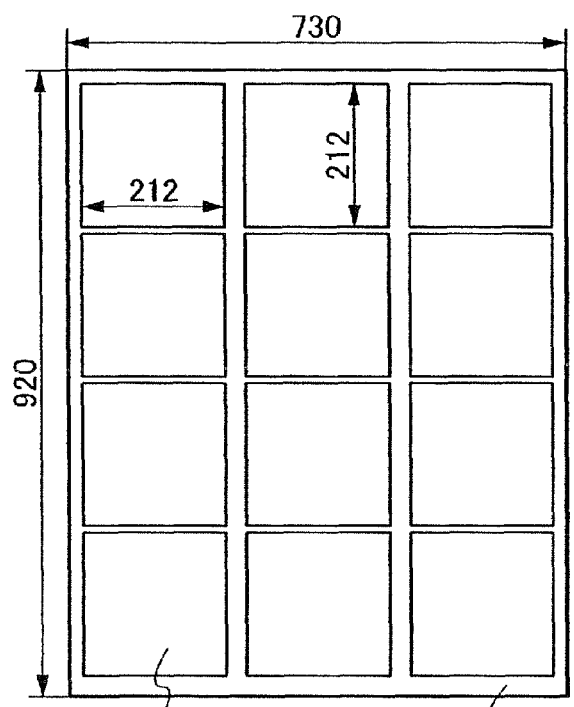
FIG. 16B
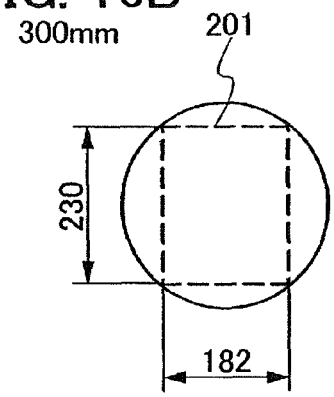
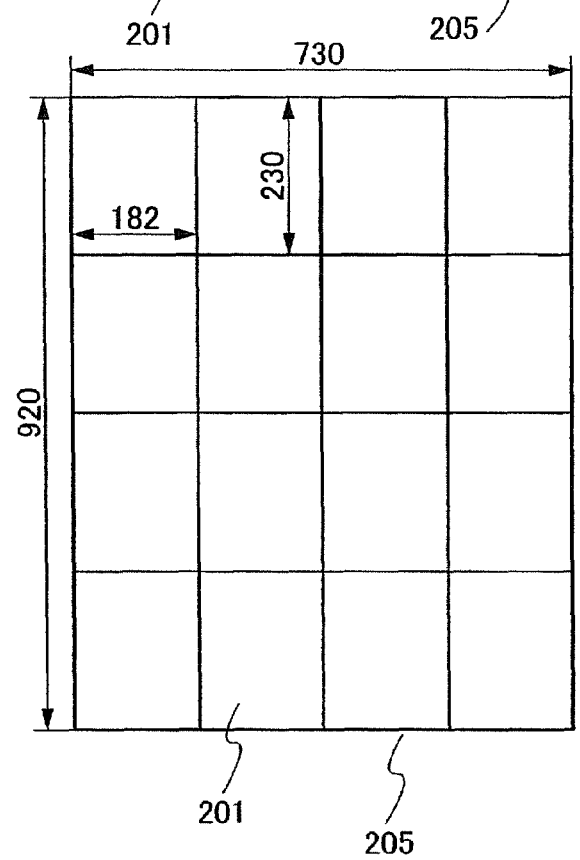

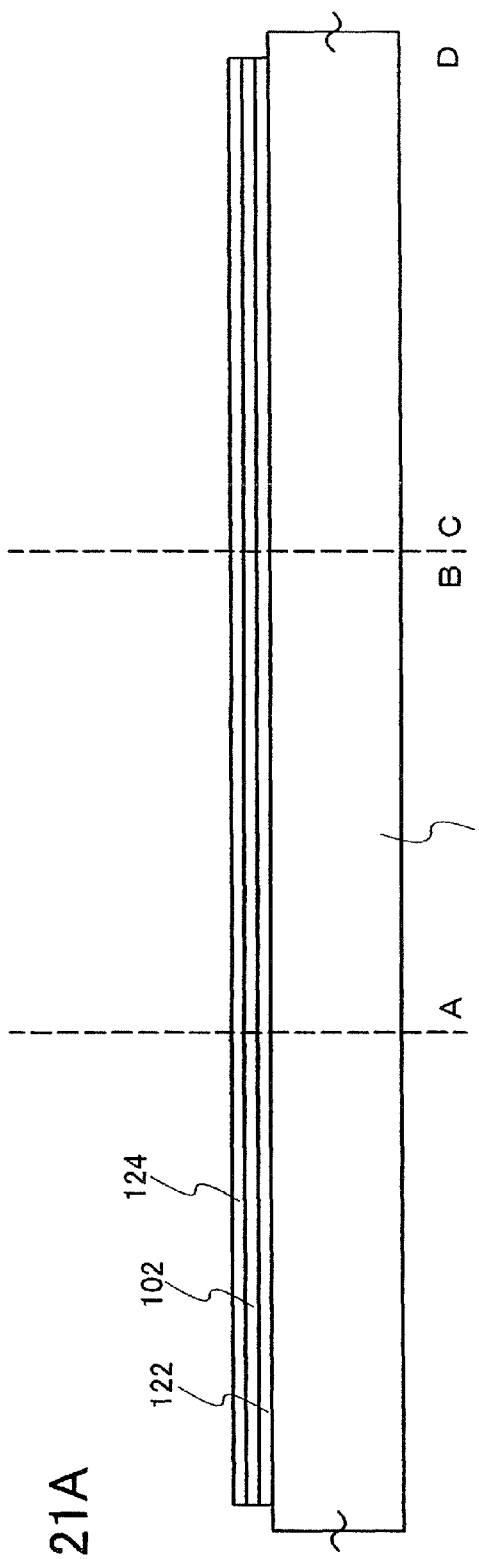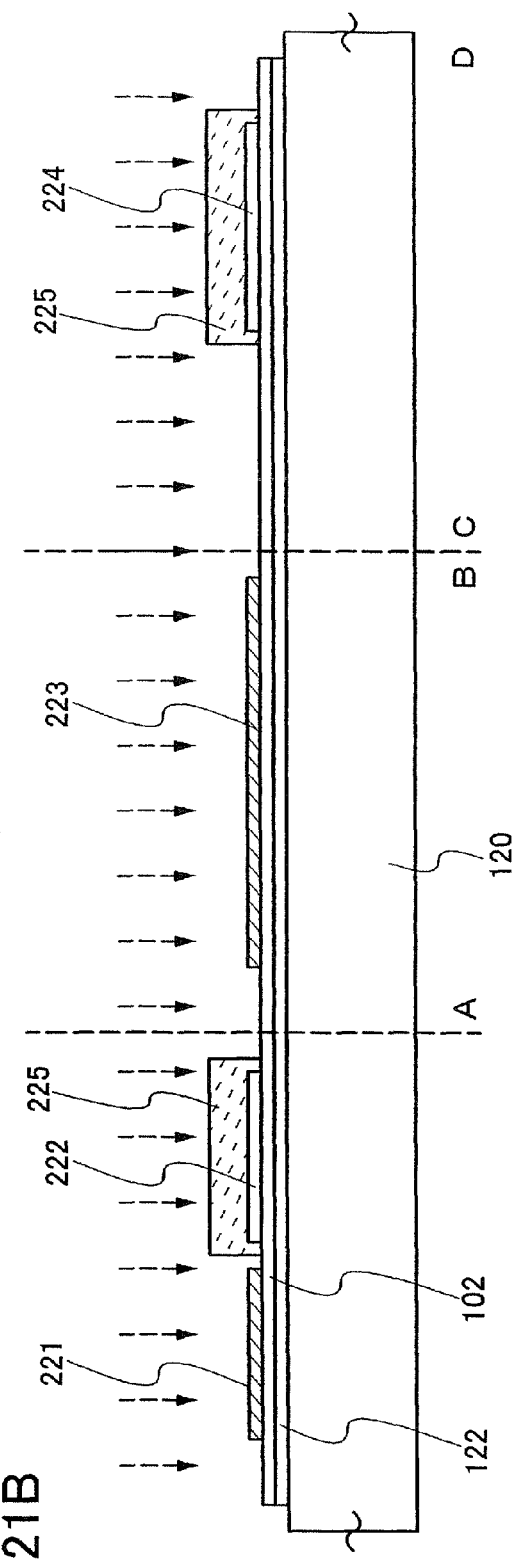

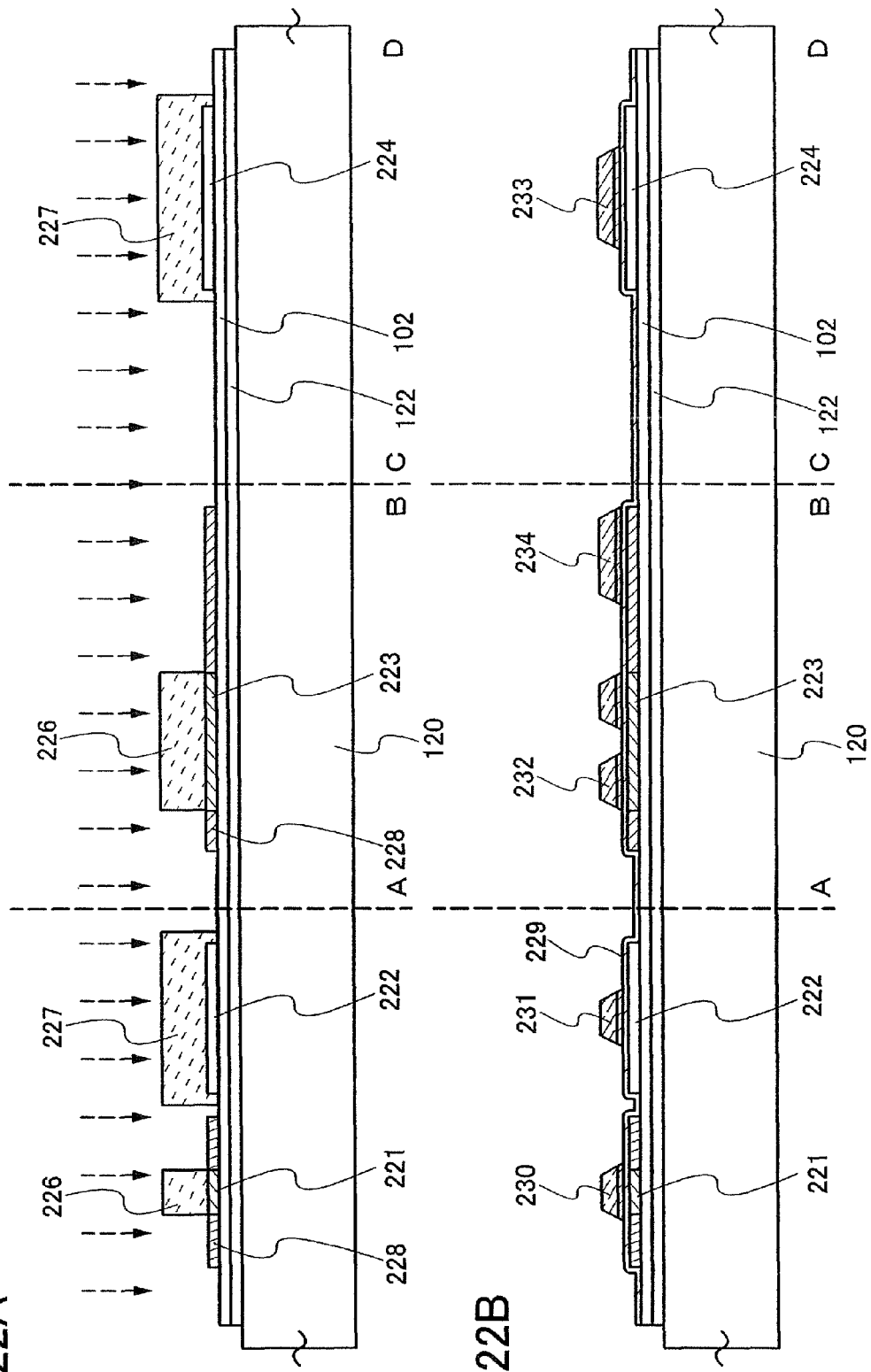

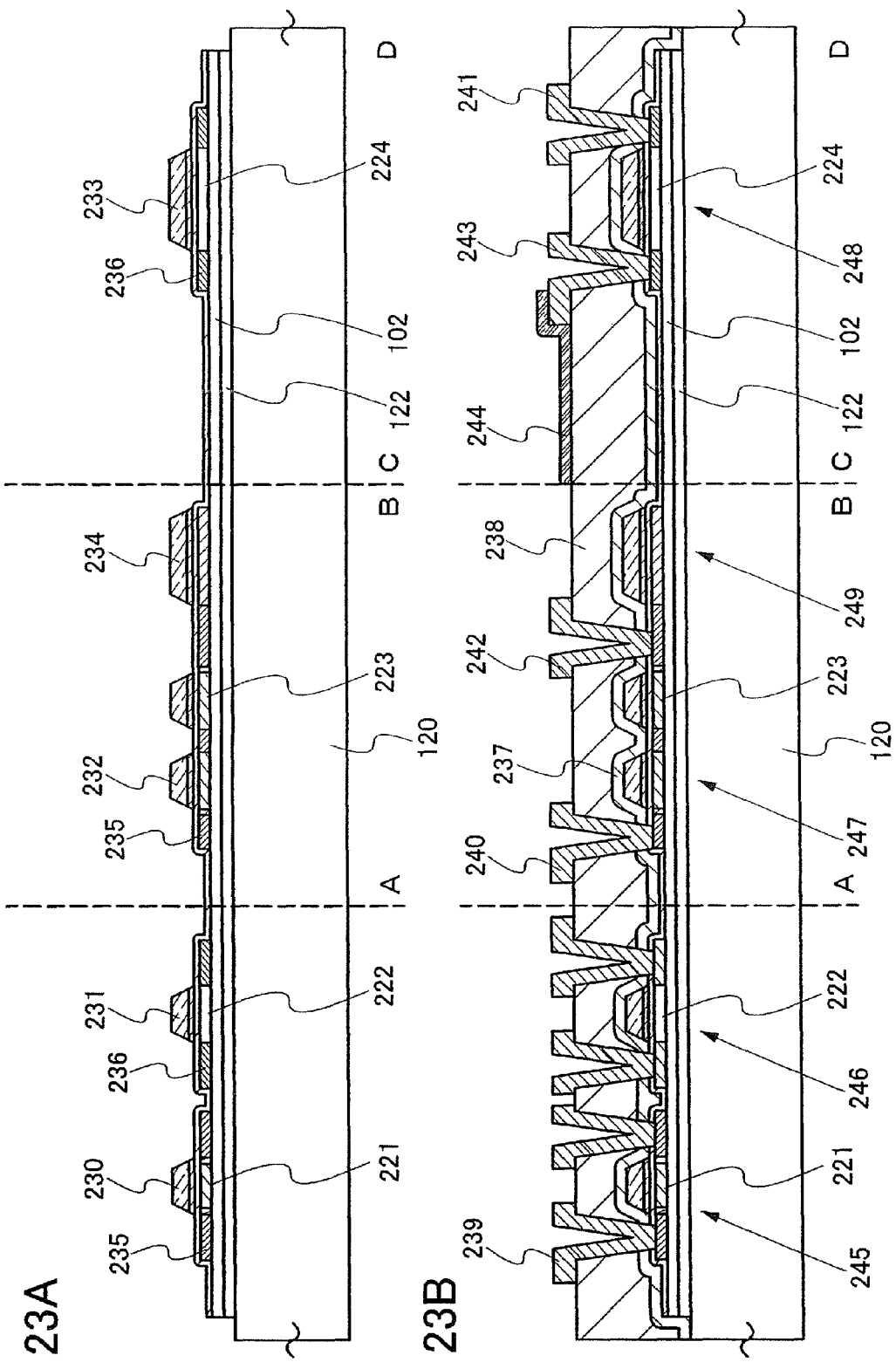

FIG. 28A-1
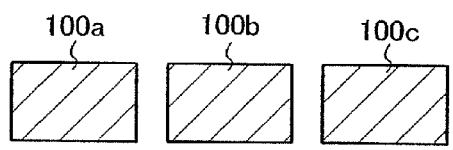
FIG. 28B-1
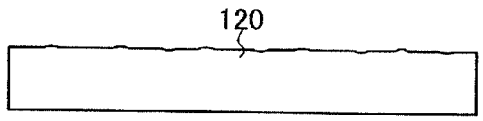
FIG. 28A-2
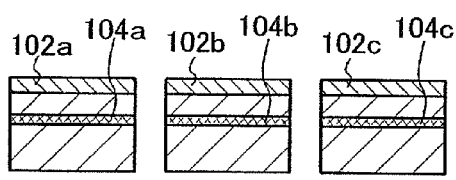
FIG. 28B-2 Planarization Treatment
FIG. 28B-3
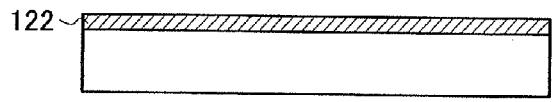
FIG. 28C
Bonding
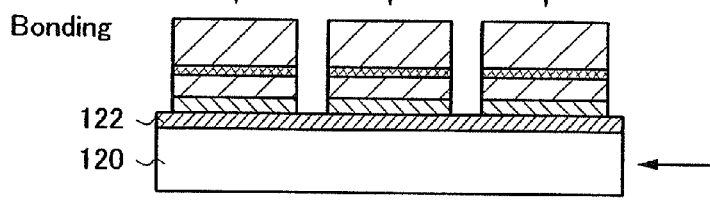
FIG. 28D Heat Treatment, Separation
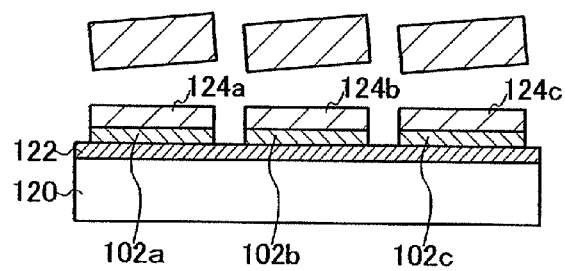

Before Planarization Treatment

Ra=0.34nm
P-V=9.4nm

After Planarization Treatment

Ra=0.22nm
P-V=3.0nm

FIG. 31A Sample A
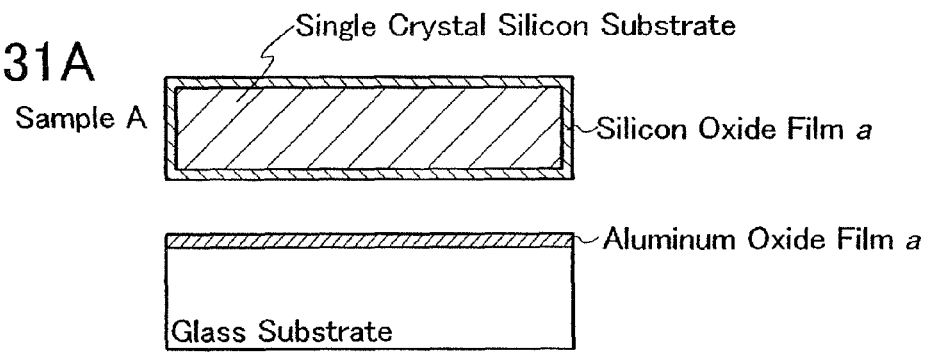
FIG. 31B Sample B
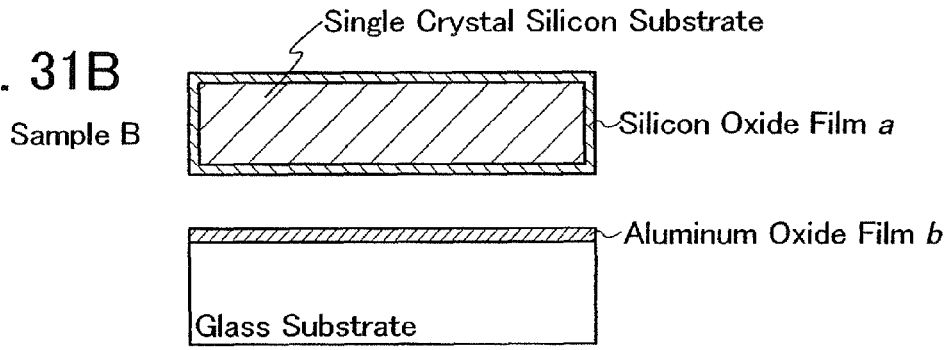
FIG. 31C Sample C
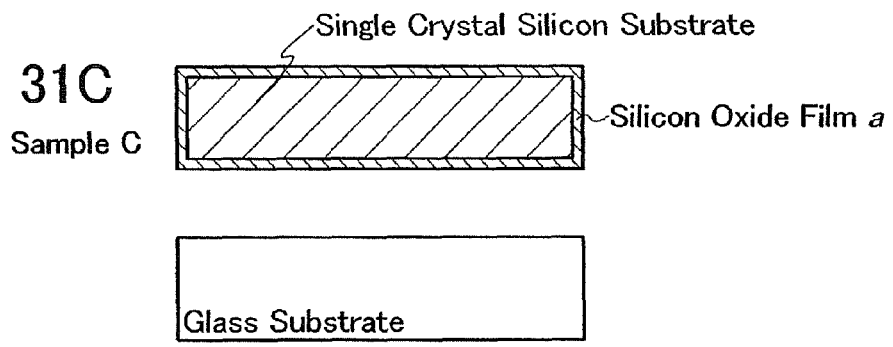
FIG. 31D Sample D
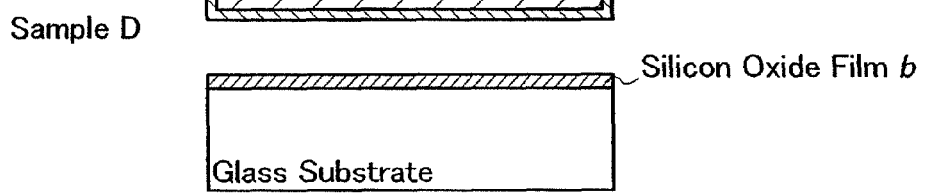

METHOD FOR MANUFACTURING SOI SUBSTRATE

BACKGROUND OF THE INVENTION

1. Field of the Invention

The present invention relates to a silicon-on-insulator (SOI) substrate, a manufacturing method thereof, a semiconductor device using the SOI substrate, and a manufacturing method thereof.

2. Description of the Related Art

In recent years, integrated circuits using a silicon-on-insulator (SOI) substrate where a thin single crystal semiconductor film is present over an insulating surface, instead of using a bulk silicon wafer, have been developed. Because parasitic capacitance between a drain of a transistor and a substrate is reduced by use of an SOI substrate, SOI substrates are attracting attention as substrates which improve performance of semiconductor integrated circuits.

One of known methods for manufacturing SOI substrates is a Smart Cut® method. A summary of a method for manufacturing an SOI substrate by a Smart Cut method is described below. First, by implantation of hydrogen ions into a silicon wafer serving as a substrate for separation by an ion implantation method, an ion-implanted layer is formed at a predetermined depth from the surface. Next, the silicon wafer into which hydrogen ions are implanted is bonded to another silicon wafer with a silicon oxide film interposed therebetween. Then, through heat treatment, the ion-implanted layer serves as a cleavage plane and the silicon wafer for separation into which hydrogen ions are implanted is separated to be a thin film. Accordingly, a single crystal silicon film can be formed over the silicon wafer for separation. The Smart Cut method may also be referred to as an ion implantation separation method.

A method for forming a single crystal silicon film over a supporting substrate made of glass by using such a Smart Cut method has been proposed (e.g., see Reference 1: Japanese Published Patent Application No. 2004-87606).

SUMMARY OF THE INVENTION

Since glass substrates can have larger areas and are less expensive than silicon wafers, the glass substrates are mainly used for manufacturing various electronic devices such as display devices, for example, liquid crystal display devices and the like. With the use of glass substrates as base substrates, inexpensive large-area SOI substrates can be manufactured.

However, in the case of using a base substrate which has an uneven surface, defective bonding occurs when the base substrate and a single crystal semiconductor substrate are bonded to each other. As a result, a region (defect) where a single crystal silicon film is not formed over the base substrate is caused. In the case where a semiconductor element such as a transistor is formed using an SOI substrate which has such a defect, an operation defect may occur. In particular, it is thought that such a problem becomes more prominent as the size of the base substrate is increased.

In addition, in the case of using a material with low heat resistance such as glass as a base substrate, a low temperature process is necessary. However, in the case where a semiconductor substrate and a base substrate are bonded to each other through a low temperature process, even if an insulating film (insulating film based on silicon such as a silicon oxide film) formed on the semiconductor substrate side and a surface (insulating film based on silicon) of the base substrate are bonded to each other, sufficient adhesion can not be obtained and defective bonding may occur.

In view of the above-described problem, an object of the present invention is to improve adhesion between a semiconductor substrate and a base substrate and to reduce occurrence of defective bonding even when the semiconductor substrate and the base substrate are bonded to each other through a low temperature process.

As a feature of the present invention, a first insulating film based on silicon is provided over a surface to be bonded of a semiconductor substrate, a second insulating film containing aluminum is provided over a surface to be bonded of a base substrate, and the first insulating film based on silicon and the second insulating film containing aluminum are bonded to each other. Further, before the second insulating film containing aluminum is formed over the base substrate, planarization treatment is performed on the base substrate. Specific structures of the present invention are described below.

An aspect of the present invention is a method for manufacturing an SOI substrate in which a single crystal semiconductor substrate and a base substrate made of an insulator are prepared, a first insulating film based on silicon is formed over the single crystal semiconductor substrate, a separation layer is formed in the single crystal semiconductor substrate by introducing ions through a surface of the single crystal semiconductor substrate, planarization treatment is performed on the base substrate, a second insulating film containing aluminum oxide is formed over the base substrate on which planarization treatment is performed, a surface of the first insulating film is bonded to a surface of the second insulating film by making the single crystal semiconductor substrate and the base substrate face each other, and a single crystal semiconductor film is formed over the base substrate with the second insulating film and the first insulating film interposed therebetween by performing separation at the separation layer.

Another aspect of the present invention is a method for manufacturing an SOI substrate in which a plurality of single crystal semiconductor substrates and a base substrate made of an insulator are prepared, a first insulating film based on silicon is formed over each of the plurality of single crystal semiconductor substrates, a separation layer is formed in each of the plurality of single crystal semiconductor substrates by introducing ions through a surface of each of the plurality of single crystal semiconductor substrates, planarization treatment is performed on the base substrate, a second insulating film containing aluminum oxide is formed over the base substrate on which planarization treatment is performed, a surface of the first insulating film is bonded to a surface of the second insulating film by making the plurality of single crystal semiconductor substrates and the base substrate face each other, and a plurality of stacked layer bodies each including the first insulating film and a single crystal semiconductor film is provided over the second insulating film provided over the base substrate by performing separation at the separation layer.

The term "single crystal" in this specification refers to a crystal in which crystal faces and crystal axes are aligned and atoms or molecules which are included in the single crystal are aligned in a spatially ordered manner. However, although a single crystal is structured by orderly aligned atoms, a single crystal may include a lattice defect in which part of the alignment is disordered or a single crystal may include intended or unintended lattice distortion.

The term "insulating film based on silicon" refers to a silicon oxide film, a silicon oxynitride film, a silicon nitride film, and a silicon nitride oxide film. Note that in addition to these insulating films, an insulating film based on silicon may include an insulating film containing silicon as its main component such as silicon carbide (SiC) film.

Note that, in this specification, average surface roughness ($R_a$) of a surface is obtained by expanding, into three dimensions, center line average roughness that is defined by JIS B 0601 so as to be able to apply it to a measurement surface. The $R_a$ can be expressed as an "average value of the absolute values of deviations from a reference surface to a specific surface" and is defined by the following formula (1).

$$R_a = \frac{1}{S_0} \int_{y1}^{y2} \int_{x1}^{x2} |f(x, y) - Z_0| dx dy \quad \text{[formula 1]}$$

Note that, in formula (1), $S_0$ represents the area of a measurement surface (a rectangular region which is defined by four points represented by the coordinates $(x_1, y_1)$, $(x_1, y_2)$, $(x_2, y_1)$, and $(x_2, y_2)$), and $Z_0$ represents average height of a measurement surface.

Moreover, the term "maximum height difference (P–V)" refers to a difference between the height $Z_{max}$ of the highest point and the height $Z_{min}$ of the lowest point in the measurement surface.

The term "semiconductor device" in this specification refers to devices in general that can operate by utilizing semiconductor characteristics, and an electro-optical device, a semiconductor circuit, and an electronic device are all included in the semiconductor device.

The term "display device" in this specification includes a light emitting device and a liquid crystal display device. A light emitting device includes a light emitting element, and a liquid crystal display device includes a liquid crystal element. A light emitting element includes, in its scope, an element whose luminance is controlled by a current or a voltage, and specifically includes an inorganic electroluminescent (EL) element, an organic EL element, and the like.

According to the present invention, adhesion between a semiconductor substrate and a base substrate can be improved and occurrence of defective bonding can be reduced, even when an SOI substrate is manufactured by bonding the semiconductor substrate and the base substrate through a low temperature process.

BRIEF DESCRIPTION OF THE DRAWINGS

FIGS. 2A-1 to 2A-3, 2B-1 to 2B-3, 2C, and 2D are diagrams showing an example of a method for manufacturing an SOI substrate of the present invention.

FIGS. 3A to 3F are diagrams showing an example of a method for manufacturing an SOI substrate of the present invention.

FIGS. 4A to 4D, 4E-1 to 4E-4, and 4F-1 and 4F-2 are diagrams showing an example of a method for manufacturing an SOI substrate of the present invention.

FIGS. 5A-1 and 5A-2, and 5B to 5D are diagrams showing an example of a method for manufacturing an SOI substrate of the present invention.

FIG. 8A is a diagram showing an enlarged corner portion, and FIG. 8B is a diagram showing a cross-sectional shape of a peripheral end portion.

FIGS. 12A and 12B are diagrams each showing a mode in which a semiconductor substrate for transfer is cut out of a silicon wafer of 200 mm or 300 mm in diameter and transferred on a base substrate of 600 mm×720 mm.

FIGS. 13A and 13B are diagrams each showing a mode in which a semiconductor substrate for transfer is cut out of a silicon wafer of 450 mm in diameter and transferred on a base substrate of 620 mm×750 mm.

FIGS. 15A and 15B are diagrams each showing a mode in which a semiconductor substrate for transfer is cut out of a silicon wafer of 450 mm in diameter and transferred on a base substrate of 730 mm×920 mm.

FIGS. 16A and 16B are diagrams each showing a mode in which a semiconductor substrate for transfer is cut out of a silicon wafer of 300 mm in diameter and transferred on a base substrate of 730 mm×920 mm.

FIGS. 21A and 21B are cross-sectional views showing a process for manufacturing a display panel using a single crystal semiconductor film.

FIGS. 22A and 22B are cross-sectional views showing a process for manufacturing a display panel using a single crystal semiconductor film.

FIGS. 23A and 23B are cross-sectional views showing a process for manufacturing a display panel using a single crystal semiconductor film.

FIGS. 28A-1 and 28A-2, FIGS. 28B-1 to 28B-3, 28C, and 28D are diagrams showing an example of a method for manufacturing an SOI substrate of the present invention.

FIGS. 31A to 31D are diagrams each showing samples manufactured in Embodiment 2.

DETAILED DESCRIPTION OF THE INVENTION

Embodiment Mode

Figures 1, 1A:
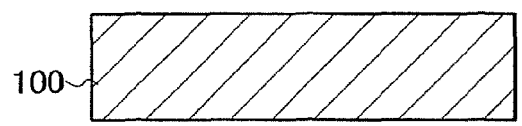
FIGS. 1A-1 and 1A-2, 1B-1 to 1B-3, 1C, and 1D are diagrams showing an example of a method for manufacturing an SOI substrate of the present invention.

Embodiment modes and embodiments of the present invention will be hereinafter described based on the accompanying drawings. Note that the present invention can be carried out in many different modes, and it will be readily appreciated by those skilled in the art that modes and details of the present invention can be modified in various ways without departing from the sprit and scope thereof. Therefore, the present invention should not be interpreted as being limited to the description of the embodiment modes and embodiments. In the drawings for describing the embodiment modes and embodiments, the same reference numerals are commonly given to like components, and the components will not be described repeatedly.

Embodiment Mode 1

This embodiment mode describes an example of a method for manufacturing an SOI substrate of the present invention with reference to drawings. Specifically, a method is described in which an insulating film based on silicon is formed on a semiconductor substrate side, an insulating film containing aluminum is formed on a base substrate side, and the semiconductor substrate and the base substrate are bonded to each other.

First, a semiconductor substrate 100 is prepared (see FIG. 1A-1).

As the semiconductor substrate 100, a commercially available semiconductor substrate can be used. For example, a single crystal silicon substrate, a single crystal germanium substrate, and a compound semiconductor substrate of gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, and 12 inches (300 mm) in diameter. Note that the shape is not limited to a circular shape, and a silicon substrate processed into a rectangular shape or the like can also be used. A case in which a single crystal silicon substrate is used as the semiconductor substrate 100 is described below.

Figures 1, 1A, 2:
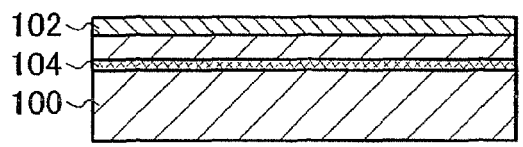

Next, a separation layer 104 is provided at a predetermined depth from a surface of the semiconductor substrate 100, and a first insulating film 102 is provided over the surface of the semiconductor substrate 100 (see FIG. 1A-2).

An insulating film based on silicon can be provided as the first insulating film 102, for example, a film which is formed of a single layer or a stacked layer of a silicon oxide film, a silicon oxynitride film, a silicon nitride film, a silicon nitride oxide film, or the like can be used. These films can be formed by a thermal oxidation method, a CVD method, a sputtering method, or the like. Further, in the case where the first insulating film 102 is formed by a CVD method, a silicon oxide film which is manufactured by a CVD method using organosilane such as tetraethoxysilane (abbreviation: TEOS) (chemical formula: $Si(OC_2H_5)_4$) can be used as the first insulating film 102. Furthermore, alternatively, an insulating film containing silicon as its main component, such as silicon carbide (SiC) film may be used.

Note that the term "silicon oxynitride film" refers to a film which has a larger number of oxygen atoms than that of nitrogen atoms and which contains oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Further, the term "silicon nitride oxide film" refers to a film which has a larger number of nitrogen atoms than that of oxygen atoms and which contains oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively. A case in which a silicon oxide film is used as the first insulating film 102 is described below.

The separation layer 104 can be formed in a region at a predetermined depth from the surface of the semiconductor substrate 100 by addition of ions.

The depth of the region where the separation layer 104 is formed can be controlled by the accelerating energy of added ions and the incidence angle thereof. The accelerating energy can be controlled by an acceleration voltage, a dosage, or the like. The separation layer 104 is formed in a region at the same or substantially the same depth as the average penetration depth of the ions. The thickness of a semiconductor film separated from the semiconductor substrate 100 in a later step depends on the depth at which the ions are added. The depth at which the separation layer 104 is formed is set to be in the range of 10 nm to 500 nm inclusive, preferably in the range of 50 nm to 200 nm inclusive.

As examples of a gas used for addition of ions, a hydrogen gas, a rare gas, or the like are given. In this embodiment mode, a hydrogen gas is preferably used. In the case where a hydrogen gas is used in an ion doping method, ion species $H^+$, $H_2^+$, and $H_3^+$ are produced. It is preferable that the largest amount of $H_3^+$ be added among these ion species. Since $H_3^+$ has higher efficiency of addition of ions than $H^+$ and $H_2^+$, the time necessary for addition of ions can be shortened. Further, a crack is likely to be caused in the separation layer in a later step.

Figures 1, 1B:
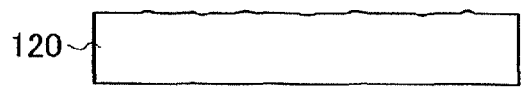
Figures 1, 1B, 2:

Next, a base substrate 120 is prepared (see FIG. 1B-1).

As the base substrate 120, a substrate made of an insulator is used. Specific examples of the base substrate 120 include a variety of glass substrates used in the electronics industry, such as substrates using aluminosilicate glass, aluminoborosilicate glass, and barium borosilicate glass. Cost reduction can be achieved when a glass substrate which can have a larger size and is inexpensive is used as the base substrate 120 as compared to when a silicon wafer is used.

Next, planarization treatment is performed on a surface of the base substrate 120 by plasma treatment (see FIG. 1B-2).

Here, planarization treatment is performed in a plasma sate by introducing an inert gas (e.g., argon (Ar) gas) and/or a reactive gas (e.g., oxygen ($O_2$) gas or nitrogen ($N_2$) gas) into a vacuum chamber and applying a bias voltage to a surface to be processed (the surface of the base substrate 120 in this embodiment mode). In plasma, an electron and a cation of Ar are present, and the cation of Ar is accelerated in a cathode direction (the base substrate 120 side). The cation of Ar, which is accelerated, collides with the surface of the base substrate 120, whereby the surface of the base substrate 120 is etched by sputtering. At this time, a projection of the surface of the base substrate 120 is preferentially etched by sputtering; thus, planarity of the surface of the base substrate 120 can be improved. In the case where a reactive gas is introduced, a defect caused when the surface of the base substrate 120 is etched by sputtering can be repaired.

By performing planarization treatment by plasma treatment, the surface of the base substrate 120 is set as follows: average surface roughness ($R_a$) is preferably 0.5 nm or less, more preferably 0.3 nm or less; and maximum height difference (P–V) is preferably 6 nm or less, more preferably 3 nm or less.

Specific conditions can be set as follows: an electric power used for treatment is 100 W to 1000 W (RF), a pressure is 0.1 Pa to 2.0 Pa, a gas flow rate is 5 sccm to 150 sccm, and a bias voltage of 200 V to 600 V is to be applied to the substrate.

Further, when the above-described plasma treatment is performed, by performing precoating treatment on an inside of the chamber, a metal constituting the chamber (iron (Fe), nickel (Ni), chromium (Cr), or the like) can be prevented from being attached to the surface of the base substrate 120 as an impurity. For example, by covering an inner wall of the chamber with an insulating film such as a silicon oxide film, a silicon film, an aluminum oxide film, or a silicon carbide (SiC) film, contamination of the surface of the base substrate 120, which is accompanied with planarization treatment, can be suppressed.

As described above, by performing planarization treatment, planarity of the surface of the base substrate 120 can be improved. Even in the case where a substrate polished by chemical mechanical polishing (CMP) or the like is used as the base substrate 120, by removing abrasive particles ($CeO_2$ or the like), which are left over the base substrate 120, the surface of the base substrate 120 can be planarized. As a result, planarity of a film formed over the base substrate 120 can be improved.

Note that cleaning may be performed before performing planarization treatment of the base substrate 120. Specifically, ultrasonic cleaning is performed on the base substrate 120 using a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), or the like. For example, ultrasonic cleaning is preferably performed on the surface of the base substrate 120 using a hydrochloric acid/hydrogen peroxide mixture. Through such cleaning treatment, the surface of the base substrate 120 can be planarized and abrasive particles left on the surface of the base substrate 120 can be removed to some extent.

Next, a second insulating film 122, which is not an insulating film based on silicon, is formed over the base substrate 120 (see FIG. 1B-3). As the second insulating film 122, an oxide film or a nitride film containing one or a plurality of elements selected from aluminum, magnesium, strontium, titanium, tantalum, zirconium, and yttrium can be used.

In this embodiment mode, an insulating film containing aluminum oxide is used as the second insulating film 122. The insulating film containing aluminum oxide may include a metal oxide film other than aluminum, for example, an insulating film containing either one or both of magnesium oxide and strontium oxide in addition to aluminum oxide may be employed. Alternatively, aluminum oxide containing nitrogen may be used as the second insulating film 122.

The second insulating film 122 can be formed by a sputtering method. As a material of a target used for the sputtering method, for example, a metal containing aluminum (Al) or metal oxide such as aluminum oxide can be used. Note that a material of a target can be selected appropriately in accordance with a film to be formed.

In addition, it is preferable that the above-described planarization treatment and formation of the second insulating film 122 by a sputtering method be performed successively without being exposed to the atmosphere. By performing the processes successively, throughput can be improved. Further, after the surface of the base substrate 120 is planarized by plasma treatment, the surface of the base substrate 120 is activated and an impurity such as an organic substance is likely to be attached to the surface of the base substrate 120. By performing the processes successively, attachment of an impurity to the base substrate 120 can be suppressed.

In the case where a metal is used for a sputtering target, sputtering is performed while a reactive gas (e.g., oxygen) is introduced (a reactive sputtering method), whereby the second insulating film 122 is formed. As a metal, aluminum; magnesium (Mg); an alloy containing aluminum and magnesium; an alloy containing aluminum and strontium (Sr); or an alloy containing aluminum, magnesium, and strontium can be used. In this case, sputtering can be performed using a direct current (DC) power source or a high-frequency (RF) power source.

For example, sputtering can be performed under the following conditions: aluminum is used for a target, a gas flow rate of argon is 0 sccm to 100 sccm, a gas flow rate of oxygen is 5 sccm to 100 sccm, a film formation pressure is 0.1 Pa to 2.0 Pa, a film formation power is 0.5 kW to 4 kW (DC or RF), and a distance between a target and a substrate (also referred to as a T-S distance) is 50 mm to 185 mm. Note that by performing sputtering using an inert gas (e.g., argon) before formation of the second insulating film 122 or by forming a film over a dummy substrate in advance, dust generated when the second insulating film 122 is formed over the base substrate 120 can be reduced.

In the case where metal oxide is used for a sputtering target, by performing sputtering using a high-frequency (RF) power source (an RF sputtering method), the second insulating film 122 is formed. As metal oxide, aluminum oxide, magnesium oxide, strontium oxide, oxide containing aluminum and magnesium, oxide containing aluminum and strontium, or oxide containing aluminum, magnesium, and strontium can be used.

For example, sputtering can be performed under the following conditions: aluminum oxide is used for a target, a gas flow rate of argon is 0 sccm to 100 sccm, a gas flow rate of oxygen is 5 sccm to 100 sccm, a film formation pressure is 0.1 Pa to 2.0 Pa, a film formation power is 0.5 kW to 4 kW (RF), and a distance between a target and a substrate (T-S distance) is 50 mm to 185 mm.

Alternatively, a bias sputtering method may be employed in order to form the second insulating film 122. In a bias sputtering method, a bias voltage is applied to a surface to be processed (the surface of the base substrate 120 in this embodiment mode) and ions are injected to the surface to be processed; thus, the surface to be processed is etched and substances separated from the surface to be processed when the surface to be processed is etched are reattached thereto, at the same time as deposition from a target. Because a projection of the surface of the base substrate 120 is preferentially etched, the second insulating film 122 can be deposited while the surface of the base substrate 120 is planarized. Thus, in the case where a bias sputtering method is employed, planarization treatment performed on the base substrate 120 before formation of the second insulating film 122 may be omitted.

A bias sputtering method can be employed under the following conditions: aluminum is used for a target, a gas flow rate of argon is 0 sccm to 100 sccm, a gas flow rate of oxygen is 5 sccm to 100 sccm, a film formation pressure is 0.1 Pa to 2.0 Pa, a film formation power is 0.5 kW to 4 kW (DC), a distance between a target and a substrate (T-S distance) is 50 mm to 185 mm, and a high frequency power of 50 W to 300 W is applied to a treated substrate side.

By providing an insulating film containing aluminum oxide over the base substrate 120 by any one of the above-described methods, impurities such as movable ions and moisture, which are contained in the base substrate 120, can be prevented from being diffused into a single crystal semiconductor film formed over the base substrate 120.

Figure 10:
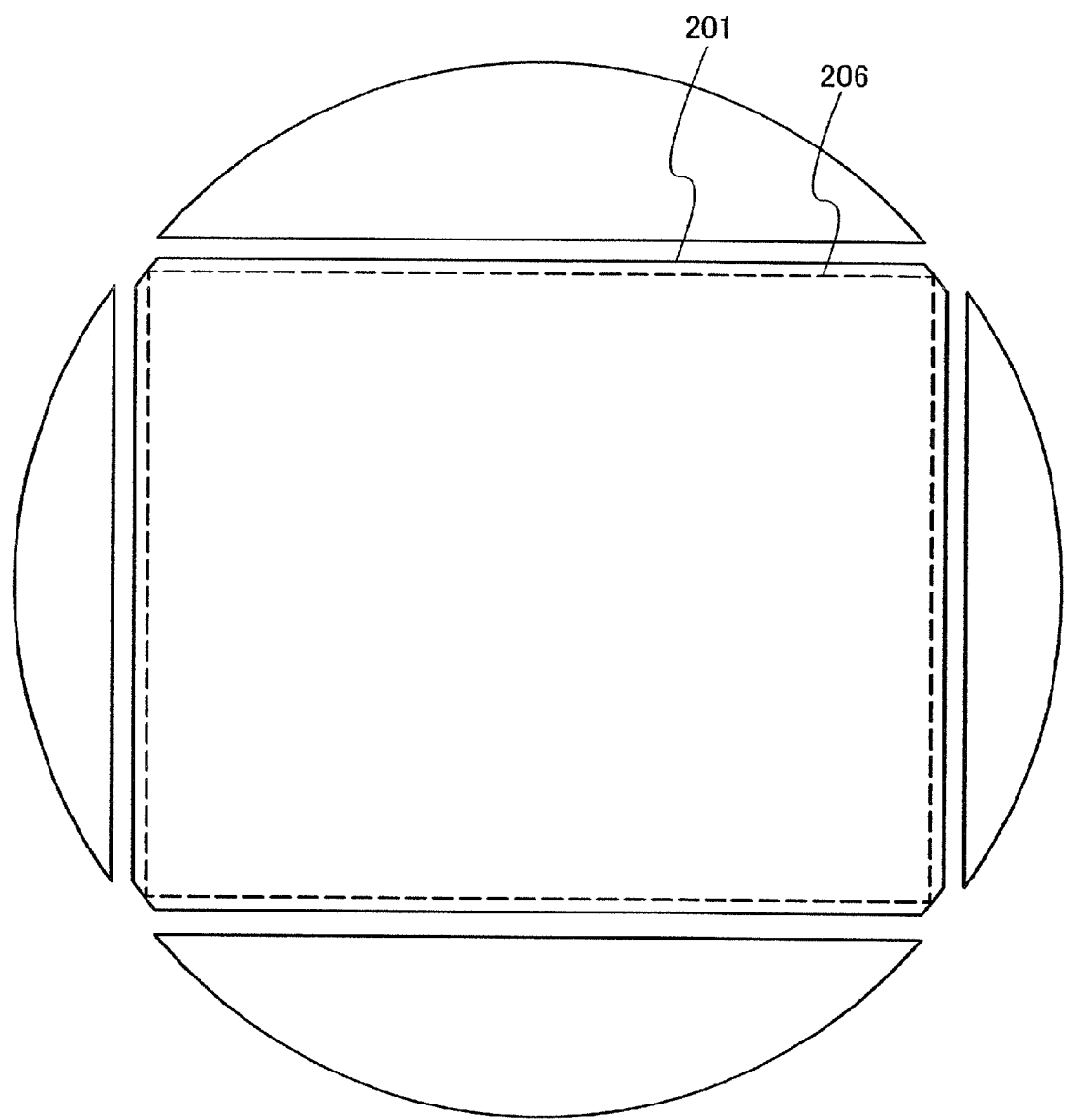
FIG. 10 is a diagram showing a mode in which a semiconductor substrate for transfer with a predetermined external dimension has been cut out of a circular single crystal semiconductor substrate.

Next, the semiconductor substrate 100 is made to face the base substrate 120, and a surface of the first insulating film 102 and a surface of the second insulating film 122 are bonded to each other (see FIG. 10). The surface of the first insulating film 102 formed over the semiconductor substrate 100 and the surface of the second insulating film 122 formed over the base substrate 120 are disposed in close contact with each other, whereby a bond is formed. This bond is formed under the action of van der Waals forces, and the semiconductor substrate 100 and the base substrate 120 are disposed in close contact with each other, whereby a bond can be formed by hydrogen bonding using Si—OH bond, Al—OH bond, or the like.

Here, a silicon oxide film which is an insulating film based on silicon is provided over a surface to be bonded of the semiconductor substrate 100, and an insulating film containing aluminum oxide is provided over a surface to be bonded of the base substrate 120. Thus, a bond between the semiconductor substrate 100 and the base substrate 120 is formed using the insulating film based on silicon and the insulating film which is not an insulating film based on silicon (heterobonding). By forming a bond using such materials, adhesion between the semiconductor substrate 100 and the base substrate 120 can be improved.

Note that it is preferable that surface treatment be performed on the second insulating film 122 formed over the base substrate 120 before the semiconductor substrate 100 and the base substrate 120 are bonded to each other. As surface treatment, ozone treatment (e.g., cleaning with ozone water) or megasonic cleaning and cleaning with ozone water can be performed. Further, cleaning with ozone water and cleaning with hydrofluoric acid may be repeated plural times. Through such surface treatment, dust such as an organic substance on the surface of the second insulating film 122 can be removed and the surface of the second insulating film 122 can be made hydrophilic. It is needless to say that surface treatment can also be performed on the first insulating film 102 formed over the semiconductor substrate 100.

Figures 1, 1B, 2, 3:
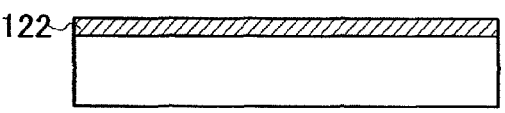
Figure 1C:
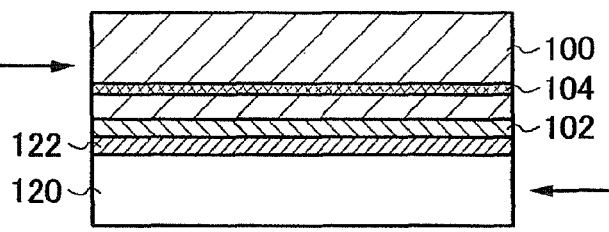
Figure 1D:
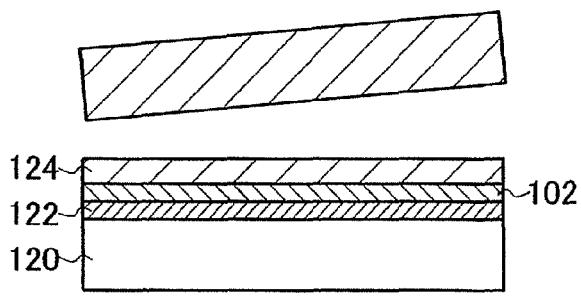

Next, separation (cleavage) is caused at the separation layer 104 by performing heat treatment, whereby a single crystal semiconductor film 124 is formed over the base substrate 120 with the first insulating film 102 and the second insulating film 122 interposed therebetween (see FIG. 1D). Here, heat treatment is performed at 400° C. to 650° C., whereby a change occurs in the volume of microvoids of the ions (e.g., hydrogen ions) contained in the separation layer 104 and separation can be caused along the separation layer 104. As a result, a part of the semiconductor substrate 100 (the single crystal semiconductor film 124) is provided over the base substrate 120.

Note that for heat treatment, after the semiconductor substrate 100 and the base substrate 120 are bonded to each other, it is preferable that an apparatus that is capable of performing rapid heating, such as a rapid thermal annealing (RTA) apparatus, be used. By using such an apparatus, the heat treatment time can be shortened. Further, the heat treatment can be performed at a temperature higher than the strain point of the base substrate 120. Note that as an RTA apparatus, a gas rapid thermal annealing (GRTA) apparatus which performs heat treatment using a high-temperature gas or a lamp rapid thermal annealing (LRTA) apparatus which performs heat treatment using lamp light can be used.

Through the above process, an SOI substrate in which the single crystal semiconductor film 124 is provided over the base substrate 120 with the second insulating film 122 containing aluminum oxide and the first insulating film 102 interposed therebetween can be manufactured.

By providing an aluminum oxide film between the base substrate 120 and the single crystal semiconductor film 124, impurities such as movable ions and moisture, which are contained in the base substrate 120, can be prevented from being diffused into the single crystal semiconductor film 124. Further, by using the second insulating film 122 formed over the base substrate 120 as a film to be bonded to the first insulating film 102 formed over the semiconductor substrate 100, adhesion between the semiconductor substrate 100 and the base substrate 120 can be improved and occurrence of defective bonding between the semiconductor substrate 100 and the base substrate 120 can be reduced.

Note that in the above process, planarization treatment may be performed on a surface of the obtained SOI substrate. By performing the planarization treatment, even when the single crystal semiconductor film 124 provided over the base substrate 120 has an uneven surface after separation, the surface of the SOI substrate can be planarized.

Planarization treatment can be performed using CMP treatment, etching treatment, laser light irradiation, or the like. For example, after either one of dry etching and wet etching or etching using a combination of both of them (etch-back treatment) is performed, the single crystal semiconductor film 124 is irradiated with laser light, whereby the single crystal semiconductor film 124 can be recrystallized and planarized.

By laser light irradiation to the upper surface of the single crystal semiconductor film, the upper surface of the single crystal semiconductor film can be melted. After melting, the single crystal semiconductor film is cooled down and solidified, whereby the single crystal semiconductor film whose upper surface has improved planarity can be obtained. By using laser light for irradiation, the increase in temperature of the base substrate 120 can be suppressed because the base substrate 120 is not directly heated. Accordingly, even when a substrate with low heat resistance such as a glass substrate is used as the base substrate 120, the single crystal semiconductor film can be melted and planarized.

Note that it is preferable that the single crystal semiconductor film be partially melted by laser light irradiation. This is because in the case where the single crystal semiconductor film is completely melted, microcrystallization of the single crystal semiconductor film is accompanied with disordered nucleation of the single crystal semiconductor film in a liquid phase and crystallinity of the single crystal semiconductor film is lowered. On the other hand, by partial melting, crystals are grown from a solid phase portion which is not melted. Through the above process, defects in the single crystal semiconductor film can be reduced. Here, the term "complete melting" means that the single crystal semiconductor film is melted to the lower part thereof in the vicinity of an interface with another film and becomes a liquid phase. On the other hand, in this case, the term "partial melting" means that an upper part of the single crystal semiconductor film is melted and becomes a liquid phase but a lower part is not melted and remains in a solid phase.

For the above-described laser light irradiation, a pulsed laser is preferably used. This is because a pulsed laser light with high energy can be emitted instantaneously and a liquid phase can be easily obtained. The oscillation frequency is approximately greater than or equal to 1 Hz and less than or equal to 10 MHz.

After performing laser light irradiation as described above, a thinning step in which the thickness of the single crystal semiconductor film is reduced may be performed. In order to reduce the thickness of the single crystal semiconductor film, either one of dry etching and wet etching or etching using a combination of both of them (etch-back treatment) may be employed. For example, in the case where the single crystal semiconductor film is a layer formed using a silicon material, the thickness of the single crystal semiconductor film can be reduced by dry etching using $SF_6$ and $O_2$ as process gases.

Note that planarization treatment may also be performed on the semiconductor substrate 100 which has been separated, in addition to the SOI substrate. By planarizing the surface of the semiconductor substrate 100 which has been separated, the semiconductor substrate 100 can be reused in a process for manufacturing the SOI substrate.

Further, although this embodiment mode describes a case in which one semiconductor substrate 100 is bonded to one base substrate 120, the present invention is not limited thereto. A plurality of semiconductor substrates may be bonded to one base substrate 120. A case in which a plurality of semiconductor substrates 100a to 100c is bonded to one base substrate 120 is described with reference to FIGS. 28A-1 and 28A-2, FIGS. 28B-1 to 28B-3, 28C, and 28D.

First, a plurality of semiconductor substrates is prepared. Here, a case is described in which the semiconductor substrates 100a to 100c are used (see FIG. 28A-1).

Next, a separation layer 104a is provided at a predetermined depth from a surface of the semiconductor substrate 100a, and a first insulating film 102a is provided over the surface of the semiconductor substrate 100a (see FIG. 28A-2). Further, similarly, separation layers 104b and 104c are provided at a predetermined depth from surfaces of the semiconductor substrates 100b and 100c, respectively, and first insulating films 102b and 102c are provided over the surfaces of the semiconductor substrates 100b and 100c, respectively. Note that the first insulating films 102a to 102c are formed using insulating films based on silicon.

Next, the base substrate 120 is prepared (see FIG. 28B-1), planarization treatment is performed by plasma treatment on the surface of the base substrate 120 (see FIG. 28B-2), and then the second insulating film 122 is formed using an insulating film which is not an insulating film based on silicon (see FIG. 28B-3).

Next, the plurality of semiconductor substrates 100a to 100c is made to face the base substrate 120, and surfaces of the first insulating films 102a to 102c and the surface of the base substrate 120 are bonded to each other (see FIG. 28C). The surfaces of the first insulating films 102a to 102c formed over the semiconductor substrates 100a to 100c, respectively and the surface of the second insulating film 122 formed over the base substrate 120 are disposed in close contact with each other, whereby bonds are formed. This bond is formed under the action of van der Waals forces, and the semiconductor substrates 100a to 100c and the base substrate 120 are disposed in close contact with each other, whereby bonds can be formed by hydrogen bonding using Si—OH bond, Al—OH bond, or the like as bonding species Next, separation (cleavage) is caused at the separation layers 104a to 104c by performing heat treatment, whereby a stacked layer body of the first insulating film 102a and a single crystal semiconductor film 124a is formed over the second insulating film 122 provided over the base substrate 120. Similarly, a stacked layer body of the first insulating film 102b and a single crystal semiconductor film 124b, and a stacked layer body of the first insulating film 102c and a single crystal semiconductor film 124c are formed over the second insulating film 122 with a space therebetween (see FIG. 28D). Here, heat treatment is performed at 400° C. to 650° C., whereby a change occurs in the volume of microvoids of the ions (e.g., hydrogen ions) contained in the separation layers 104a to 104c and separation can be caused along the separation layers 104a to 104c. As a result, a part of each of the semiconductor substrates 100a to 100c (the single crystal semiconductor films 124a to 124c) is provided over the base substrate 120 with a space therebetween. The second insulating film 122 and the first insulating films 102a to 102c are interposed between the single crystal semiconductor films 124a to 124c and the base substrate 120.

Through the above process, an SOI substrate can be manufactured in which the single crystal semiconductor films 124a to 124c are provided over the second insulating film 122 containing aluminum oxide, which is provided over the base substrate 120, with the first insulating films 102a to 102c interposed therebetween, respectively.

Note that the method for manufacturing an SOI substrate of this embodiment mode can be appropriately combined with any of the manufacturing methods described in other embodiment modes of this specification.

Embodiment Mode 2

This embodiment mode describes a method for manufacturing an SOI substrate which is different from that in the above-described embodiment mode with reference to drawings. Specifically, a case is described in which an insulating film based on silicon is formed over a semiconductor substrate through thermal oxidation treatment.

Figures 1, 2A:
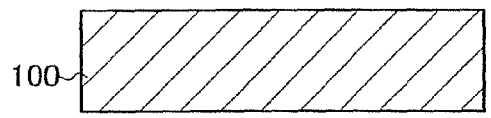
Figures 2, 2A:
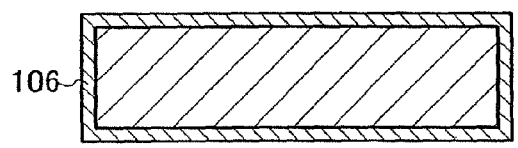
Figures 2, 2A, 3:
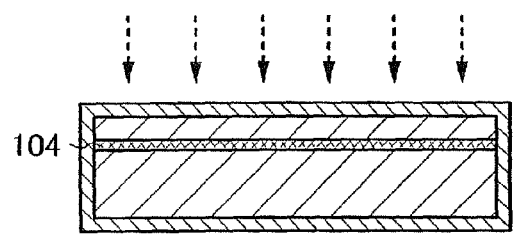

First, the semiconductor substrate 100 is prepared (see FIG. 2A-1). Note that it is preferable that the semiconductor substrate 100 be cleaned using a sulfuric acid/hydrogen peroxide mixture (SPM), an ammonium hydroxide/hydrogen peroxide mixture (APM), a hydrochloric acid/hydrogen peroxide mixture (HPM), dilute hydrogen fluoride (DHF), or the like as appropriate.

Next, thermal oxidation treatment is performed on the semiconductor substrate 100 in order to form an oxide film 106 (see FIG. 2A-2).

Thermal oxidation treatment may be performed by dry oxidation; however, it is preferable that thermal oxidation treatment be performed in an oxidation atmosphere to which halogen is added. For example, the thermal oxidation treatment is performed on the semiconductor substrate 100 in an oxidation atmosphere to which chlorine (Cl) is added, whereby the oxide film 106 is formed through chlorine oxidation. As an example of such thermal oxidation treatment, it is preferable that thermal oxidation be performed in an atmosphere containing hydrogen chloride (HCl) at 0.5 vol. % to 10 vol. % (preferably, 3 vol. %) with respect to oxygen and at a temperature of 900° C. to 1150° C. (typically, 1000° C.). The treatment time may be 0.1 to 6 hours, preferably 0.5 to 1 hour. The thickness of the oxide film to be formed is 10 nm to 1000 nm (preferably, 50 nm to 200 nm), for example, 100 nm.

When heat treatment is performed in such a temperature range, a gettering effect to the semiconductor substrate 100 can be obtained by the halogen element. As the gettering effect, an effect of removing a metal impurity is obtained. That is, by action of chlorine, an impurity such as a metal is turned into volatile chloride and then is diffused into the gas phase to be removed. In particular, the gettering is effective for the semiconductor substrate 100 whose surface is subjected to chemical mechanical polishing (CMP) treatment. In addition, hydrogen has an action of compensating defects at an interface between the semiconductor substrate 100 and the oxide film 106 so as to lower a local level density of the interface.

Note that a gas used for thermal oxidation treatment is not limited to HCl, and one or a plurality of kinds selected from HF, $NF_3$, HBr, $Cl_2$, $ClF_3$, $BCl_3$, $F_2$, $Br_2$, and the like can be employed as a gas used for thermal oxidation treatment.

When halogen is contained in the oxide film 106, an effect that a heavy metal that is an extrinsic impurity is captured so as to prevent contamination of the single crystal semiconductor film can be obtained. Metals such as Fe, Cr, Ni, and Mo are given as examples of such heavy metals. These are introduced into the single crystal semiconductor film in a step of forming a separation layer through doping with ions without mass separation. That is, when halogen is contained in the oxide film 106 through HCl oxidation or the like, the oxide film 106 can getter an impurity such as a heavy metal which gives an adverse effect to the single crystal semiconductor film. For example, by heat treatment performed after formation of the oxide film 106, a metal as an impurity included in the single crystal semiconductor film is separated out to the oxide film 106, is reacted with halogen (e.g., chlorine), and is captured. Thus, the impurity captured in the oxide film 106 can be fixed and contamination of the semiconductor substrate 100 can be prevented. That is, the oxide film 106 captures a metal element serving as a life time killer of a semiconductor so that the metal element is not diffused again, whereby performance of a transistor can be improved.

Halogen is contained in the oxide film 106 at a concentration of $1 \times 10^{17}$ atoms/cm$^3$ to $5 \times 10^{20}$ atoms/cm$^3$, so that the oxide film 106 can have a function as a protective film which captures an impurity such as a metal, so as to prevent contamination of the semiconductor substrate 100.

Next, ions of hydrogen, halogen, or the like are introduced in order to form the separation layer 104 (see FIG. 2A-3). The ions accelerated by an electric field are added at a predetermined depth through the surface of the semiconductor substrate 100, whereby the separation layer 104 is formed in the semiconductor substrate 100.

The depth of the region where the separation layer 104 is formed can be controlled by the accelerating energy of ions and the incidence angle thereof. The accelerating energy can be controlled by an acceleration voltage, a dosage, or the like. The separation layer 104 is formed in a region at the same or substantially the same depth as the average penetration depth of the ions. The thickness of a semiconductor film separated from the semiconductor substrate 100 in a later step depends on the depth at which the ions are added. The depth at which the separation layer 104 is formed is set to be in the range of 10 nm to 500 nm inclusive, preferably in the range of 50 nm to 200 nm inclusive.

As examples of a gas used for addition of ions, a hydrogen gas, a rare gas, or the like are given. In this embodiment mode, a hydrogen gas is preferably used. In the case where a hydrogen gas is used in an ion doping method, ion species $H^+$, $H_2^+$, and $H_3^+$ are produced. It is preferable that the largest amount of $H_3^+$ be added among these ion species. Since $H_3^+$ has higher efficiency of addition of ions than $H^+$ and $H_2^+$, the time necessary for addition of ions can be shortened. Further, a crack is likely to be caused in the separation layer in a later step.

When an ion doping method is employed, since the ion doping apparatus performs addition of ions without mass separation, metal ions are added to the semiconductor substrate 100 together with hydrogen ions in some cases. Since a metal ion has the large mass number, most metal ions are distributed on an outermost surface to which ions are added. In this embodiment mode, the oxide film 106 is formed over a surface of the semiconductor substrate 100. When the oxide film 106 is formed thicker than the depth at which the metal ions are added, the distribution of the metal can be kept within the oxide film 106. When halogen is contained in the oxide film 106 by HCl oxidation or the like, the oxide film 106 has an effect of gettering an impurity such as a heavy metal which gives an adverse effect to the semiconductor substrate 100. Thus, the impurity captured in the oxide film 106 can be fixed to prevent contamination of the semiconductor substrate 100.

Figures 1, 2B:
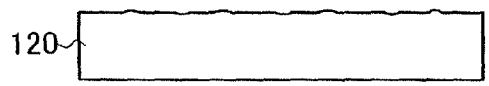
Figures 2, 2B:
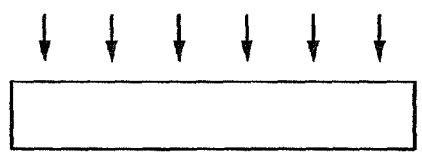
Figures 2, 2B, 3:
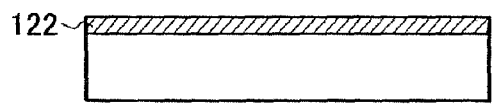

Next, the base substrate 120 is prepared (see FIG. 2B-1), planarization treatment is performed on the surface of the base substrate 120 by plasma treatment (see FIG. 2B-2), and then the second insulating film 122 is formed using an insulating film which is not an insulating film based on silicon (see FIG. 2B-3).

Figure 2C:
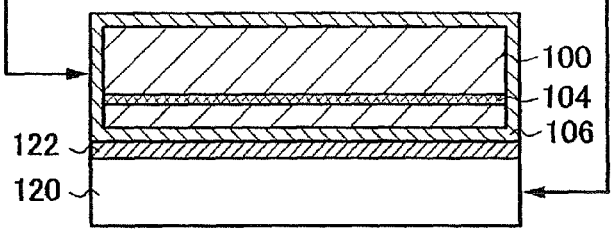
Figure 2D:
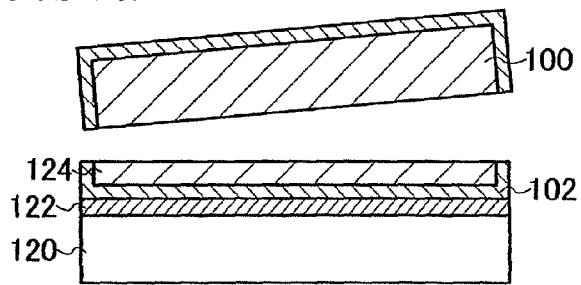

Next, the semiconductor substrate 100 is made to face the base substrate 120, the oxide film 106 is bonded to the second insulating film 122 (see FIG. 2C), and then separation is performed at the separation layer 104 by performing heat treatment, whereby the single crystal semiconductor film 124 can be formed over the base substrate 120 with the second insulating film 122 and the oxide film 106 interposed therebetween (see FIG. 2D).

Further, it is preferable that surface treatment be performed on the second insulating film 122 formed over the base substrate 120 and the oxide film 106 formed over the semiconductor substrate 100 before the semiconductor substrate 100 and the base substrate 120 are bonded to each other. As surface treatment, ozone treatment (e.g., cleaning with ozone water), megasonic cleaning or cleaning with ozone water can be performed. Through such surface treatment, dust such as an organic substance on the surfaces of the second insulating film 122 and the oxide film 106 can be removed and the surfaces of the second insulating film 122 and the oxide film 106 can be made hydrophilic.

Note that the detailed description of the process shown in FIGS. 2B-1 to 2B-3, 2C, and 2D is omitted because the process can be performed in a similar manner to that shown in FIGS. 1B-1 to 1B-3, 1C, and 1D.

Through the above process, an SOI substrate can be manufactured in which the single crystal semiconductor film 124 is provided over the base substrate 120 with the second insulating film 122 containing aluminum oxide and the oxide film 106 interposed therebetween.

By providing an aluminum oxide film between the base substrate 120 and the single crystal semiconductor film 124, impurities such as movable ions and moisture, which are contained in the base substrate 120, can be prevented from being diffused into the single crystal semiconductor film 124. Further, by using a manufacturing process of this embodiment mode, a film formation process by a CVD method becomes unnecessary. Thus, generation of dust due to a CVD method can be prevented and occurrence of defective bonding between the semiconductor substrate and the base substrate can be suppressed.

In addition, although this embodiment mode describes a case in which one semiconductor substrate 100 is bonded to one base substrate 120, the present invention is not limited thereto. A plurality of semiconductor substrates may be bonded to one base substrate 120.

Note that the method for manufacturing an SOI substrate of this embodiment mode can be appropriately combined with any of the manufacturing methods described in other embodiment modes of this specification.

Embodiment Mode 3

This embodiment mode describes a method for manufacturing an SOI substrate in which a semiconductor substrate is repeatedly used (reused) with reference to drawings. Further, this embodiment mode describes a case in which the semiconductor substrate 100 which has rounded corners (end portions) (with edge roll-off (ERO)) is used.

First, a process A is performed in which the semiconductor substrate 100 (single crystal semiconductor substrate in this embodiment mode) which is provided with the first insulating film 102 over the surface and in which the separation layer 104 is formed at a predetermined depth from the surface is prepared (see FIG. 3A and FIG. 4A). In the process A, cleaning of the semiconductor substrate 100, formation of the first insulating film 102, addition of ions to the semiconductor substrate 100, surface treatment on the first insulating film 102, and the like are performed. The detailed description of these processes is omitted because the method shown in FIGS. 1A-1 and 1A-2 or FIGS. 2A-1 to 2A-3 can be employed.

In this embodiment mode, end portions of the semiconductor substrate 100 have a round shape and they are not planarized: thus, the first insulating film 102 is formed along the surfaces of the end portions.

Next, a process B is performed in which the base substrate 120 (glass substrate in this embodiment mode) provided with the second insulating film 122 over the surface is prepared (see FIG. 3B and FIG. 4B). In the process B, cleaning of the base substrate 120, planarization treatment on the base substrate 120, formation of the second insulating film 122, surface treatment on the second insulating film 122, and the like are performed. The detailed description of these processes is omitted because the method shown in FIGS. 1B-1 to 1B-3 or FIGS. 2B-1 to 2B-3 can be employed.

Then, a process C is performed in which the surface of the semiconductor substrate 100 is made to face the surface of the base substrate 120, and the first insulating film 102 and the second insulating film 122 are bonded to each other (see FIG. 3C and FIG. 4C).

Next, a process D is performed in which separation is performed at the separation layer 104 by performing heat treatment, whereby the single crystal semiconductor film 124 is formed over the base substrate 120 with the second insulating film 122 and the first insulating film 102 interposed therebetween (see FIG. 3D and FIG. 4D).

Through the processes A to D, an SOI substrate can be manufactured (see FIG. 4F-1). Note that in the case where an SOI substrate has an uneven surface, it is preferable that planarization treatment be performed on the surface before formation of a device with the use of the SOI substrate (see FIG. 3F and FIG. 4F-2). Planarization treatment can be performed through laser light irradiation as described in Embodiment Mode 1.

Then, a process E is described in which the semiconductor substrate 100 which has been separated is repeatedly used (reprocessing treatment of a semiconductor substrate) (see FIG. 3E). In the process E, removal of residual portions, formation of an oxide film, removal of the oxide film, CMP treatment, and the like are performed.

First, the semiconductor substrate 100 which has been separated is taken out (FIG. 4E-1). Sometimes the end portions of the semiconductor substrate 100 are not sufficiently bonded to the base substrate 120 due to the influence of edge roll-off. As a result, in some cases, the end portions of the semiconductor substrate 100 are not separated at the separation layer 104 and the first insulating film 102 or the like is left.

Next, residual portions 126 at the end portions of the semiconductor substrate 100 are removed (see FIG. 4E-2). The residual portions 126 can be removed by performing wet etching. Specifically, wet etching is performed using a mixture containing hydrofluoric acid, ammonium fluoride, and a surfactant as an etchant (e.g., product name: LAL 500 manufactured by STELLA CHEMIFA CORPORATION).

Further, the separation layer 104 to which hydrogen ions are added can be removed by performing wet etching using an organic alkaline solution typified by tetramethylammonium hydroxide (TMAH). Through such treatment, steps due to residues on the end portions of the semiconductor substrate 100 can be suppressed.

Next, by oxidizing the semiconductor substrate 100 in a halogen atmosphere, an oxide film 128 is formed (see FIG. 4E-3), and then the oxide film 128 is removed. As halogen, HCL can be used. By forming the oxide film 128 through such thermal oxidation treatment and then removing the oxide film 128, a gettering effect by a halogen element can be obtained. As the gettering effect, an effect of removing a metal impurity can be obtained. That is, by action of chlorine, an impurity such as a metal is turned into volatile chloride and then is diffused into the gas phase to be removed.

Then, CMP treatment is performed on the semiconductor substrate 100. As a result, a step at the end portions of the semiconductor substrate 100 can be removed and the surface of the semiconductor substrate 100 can be planarized (see FIG. 4E-4). After that, the obtained semiconductor substrate 100 is reused in the process A.

As described in this embodiment mode, by repeatedly using a semiconductor substrate through reprocessing treatment of the semiconductor substrate, cost reduction can be achieved. Further, by performing the reprocessing treatment of a semiconductor substrate described in this embodiment mode, a surface of a semiconductor substrate is sufficiently planarized even when the semiconductor substrate is repeatedly used. Thus, adhesion between the semiconductor substrate and a base substrate can be improved, and occurrence of defective bonding can be reduced.

Furthermore, although this embodiment mode describes a case in which one semiconductor substrate 100 is bonded to one base substrate 120, the present invention is not limited thereto. A structure in which a plurality of semiconductor substrates is bonded to one base substrate 120 and the plurality of semiconductor substrates is reused may be employed.

Note that the method for manufacturing an SOI substrate of this embodiment mode can be appropriately combined with any of the manufacturing methods described in other embodiment modes of this specification.

Embodiment Mode 4

This embodiment mode describes another method for forming the single crystal semiconductor films 124 over the base substrate 120 using the semiconductor substrates 100 in Embodiment Mode 3. Note that this embodiment mode describes a case in which the plurality of semiconductor substrates 100a and 100b is bonded to the base substrate 120.

First, the semiconductor substrate 100a which is provided with the first insulating film 102a over the surface and in which the separation layer 104a is formed at a predetermined depth from the surface, and the semiconductor substrate 100b which is provided with the first insulating film 102b over the surface and in which the separation layer 104b is formed at a predetermined depth from the surface are prepared (see FIG. 5A-1).

Next, peripheral portions of the semiconductor substrates 100a and 100b are etched deeper than the separation layers 104a and 104b to be removed (see FIG. 5A-2). By removing the peripheral portions of the semiconductor substrates 100a and 100b in such a manner, bonding surfaces formed over the semiconductor substrates 100a and 100b (the surfaces of the first insulating films 102a and 102b in this embodiment mode) can each have a flat surface.

Then, the base substrate 120 (glass substrate in this embodiment mode) provided with the second insulating film 122 over the surface is prepared (see FIG. 5B).

Next, the surfaces of the semiconductor substrates 100a and 100b are made to face the surface of the base substrate 120, and the first insulating films 102a and 102b are bonded to the second insulating film 122 (see FIG. 5C). Then, separation is performed at the separation layers 104a and 104b by performing heat treatment, whereby the single crystal semiconductor films 124a and 124b can be formed over the second insulating film 122 provided over the base substrate 120 with the first insulating films 102a and 102b interposed therebetween, respectively (see FIG. 5D).

Note that reprocessing treatment shown in FIGS. 3A to 3F, FIGS. 4A to 4D, 4E-1 to 4E-4, 4F-1, and 4F-2 may be performed on the semiconductor substrates 100a and 100b which have been separated. Because residual portions are not generated at end portions of the semiconductor substrates 100a and 100b which have been separated in this embodiment mode, a process for removing residues on the periphery through reprocessing treatment of a semiconductor substrate can be omitted.

Note that the method for manufacturing an SOI substrate of this embodiment mode can be appropriately combined with any of the manufacturing methods described in other embodiment modes of this specification.

Embodiment Mode 5

This embodiment mode describes a mode in which a semiconductor region with an approximately rectangular shape is cut out of a circular semiconductor substrate, for example, a silicon wafer, to be bonded to a base substrate provided with an insulating film containing aluminum for the purpose of forming a display panel in which an active element such as a pixel region is formed using a single crystal semiconductor.
(First Method for Processing Single Crystal Semiconductor Substrate)

Figure 6:
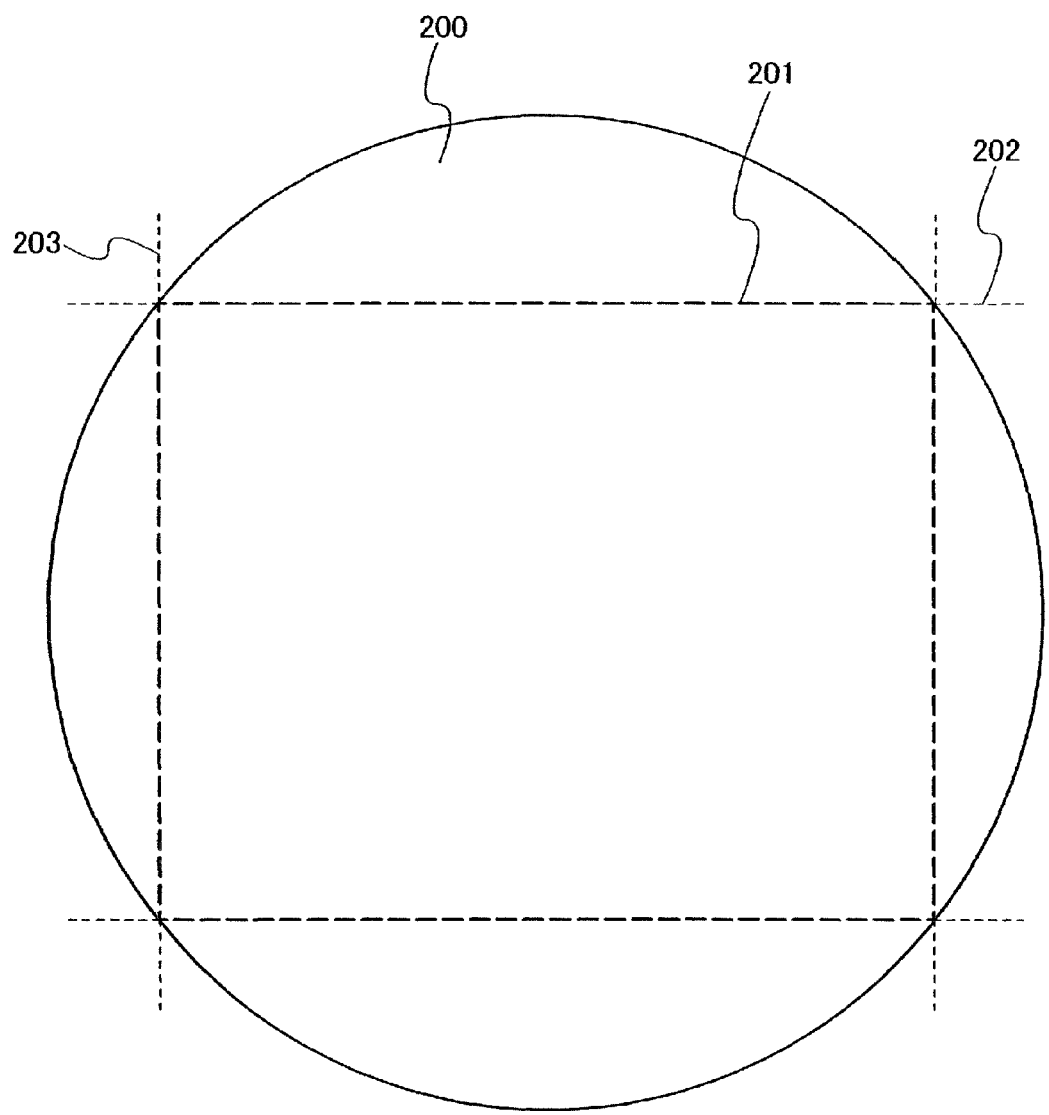
FIG. 6 is a diagram showing a mode in which a semiconductor substrate for transfer with a predetermined external dimension is cut out of a circular single crystal semiconductor substrate.

FIG. 6 shows a mode in which a semiconductor substrate 201 for transfer with a predetermined external dimension is cut out of a single crystal semiconductor substrate 200, typically a silicon wafer, with a certain size. The semiconductor substrate 201 for transfer can be maximized up to the point of each vertex inscribed in the single crystal semiconductor substrate 200. However, the semiconductor substrate 201 for transfer is not necessary to be square. This is because 4:3 or 16:9 aspect ratio is employed as the standard for a screen of the display panel, and the external dimension of the display panel fits the aspect ratio by itself. The size of the silicon wafer is preferably 300 mm or more in diameter. For example, a silicon wafer of 400 mm or 450 mm in diameter (18-inch silicon wafer) can be employed.

Figure 7:
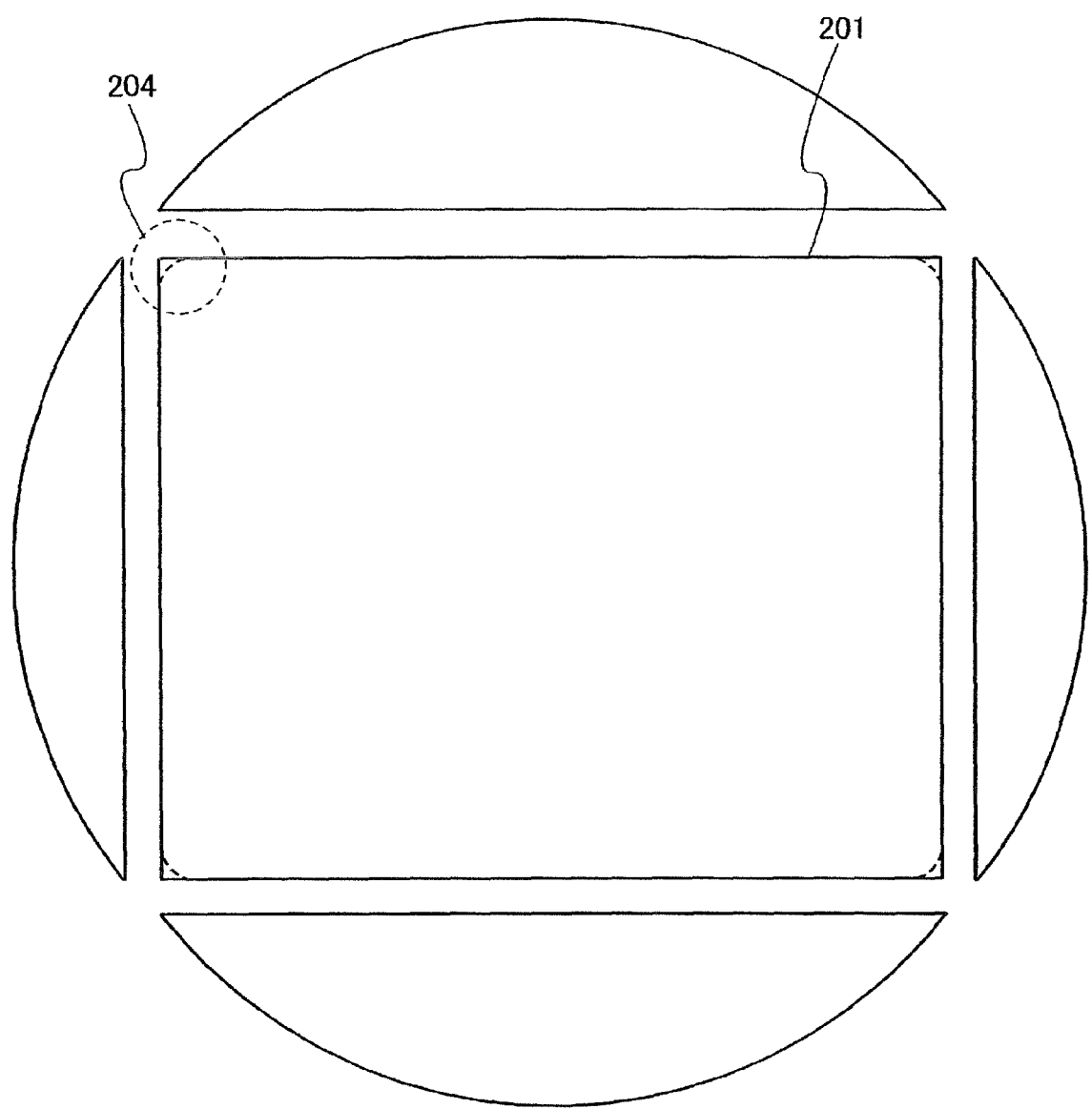
FIG. 7 is a diagram showing a mode in which a semiconductor substrate for transfer with a predetermined external dimension has been cut out of a circular single crystal semiconductor substrate.

As shown in FIG. 7, in the case where the semiconductor substrate 201 for transfer is cut out, with its vertexes inscribed in the form of the single crystal semiconductor substrate 200 to be a rectangular along cutoff lines 202 and 203, the degree of a vertex of a corner portion 204 shown in a dashed circle in the figure is approximately 90 degrees. In addition, the same can be said in the case where the semiconductor substrate 201 for transfer is cut out from a point inside of the single crystal semiconductor substrate 200.

Figure 8A:
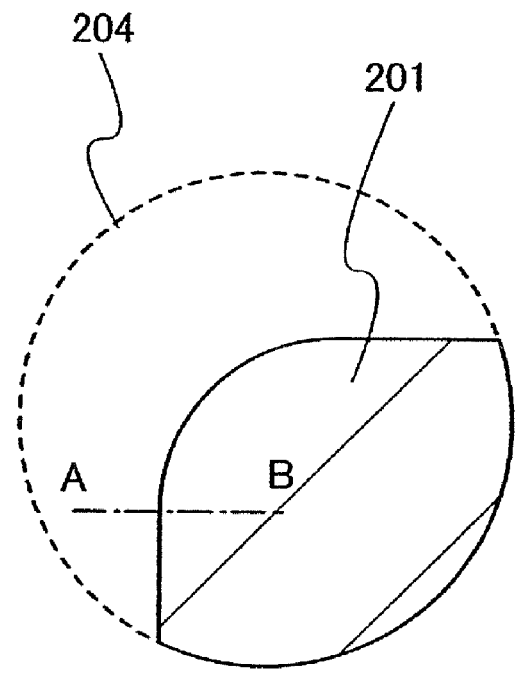
FIGS. 8A and 8B are diagrams showing a structure of a semiconductor substrate for transfer.
Figure 8B:
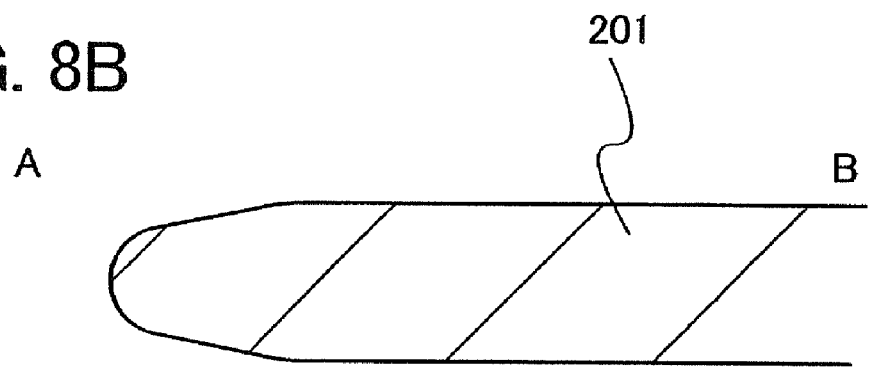

In this case, the corner portion 204 is preferably processed to have a curved surface so as not to be a sharp end portion. FIG. 8A is an enlarged diagram of the corner portion 204 and processing into a curved surface in such a manner can prevent the semiconductor substrate 201 for transfer from being damaged. As shown in FIG. 8B, it is preferable that a cross-sectional shape of a peripheral end portion of the semiconductor substrate 201 for transfer be chamfered by shaving a sharp angle so as to be processed into a shape with a curved surface or a shape with a multiple-step angle. This can reduce waste of silicon resources by preventing damage to the substrate. Note that cut ends after cutting-out can be reproduced by being melted. Further, the cut ends can also be used when a small single crystal semiconductor film is formed.
(Second Method for Processing Single Crystal Semiconductor Substrate)

Figure 9:
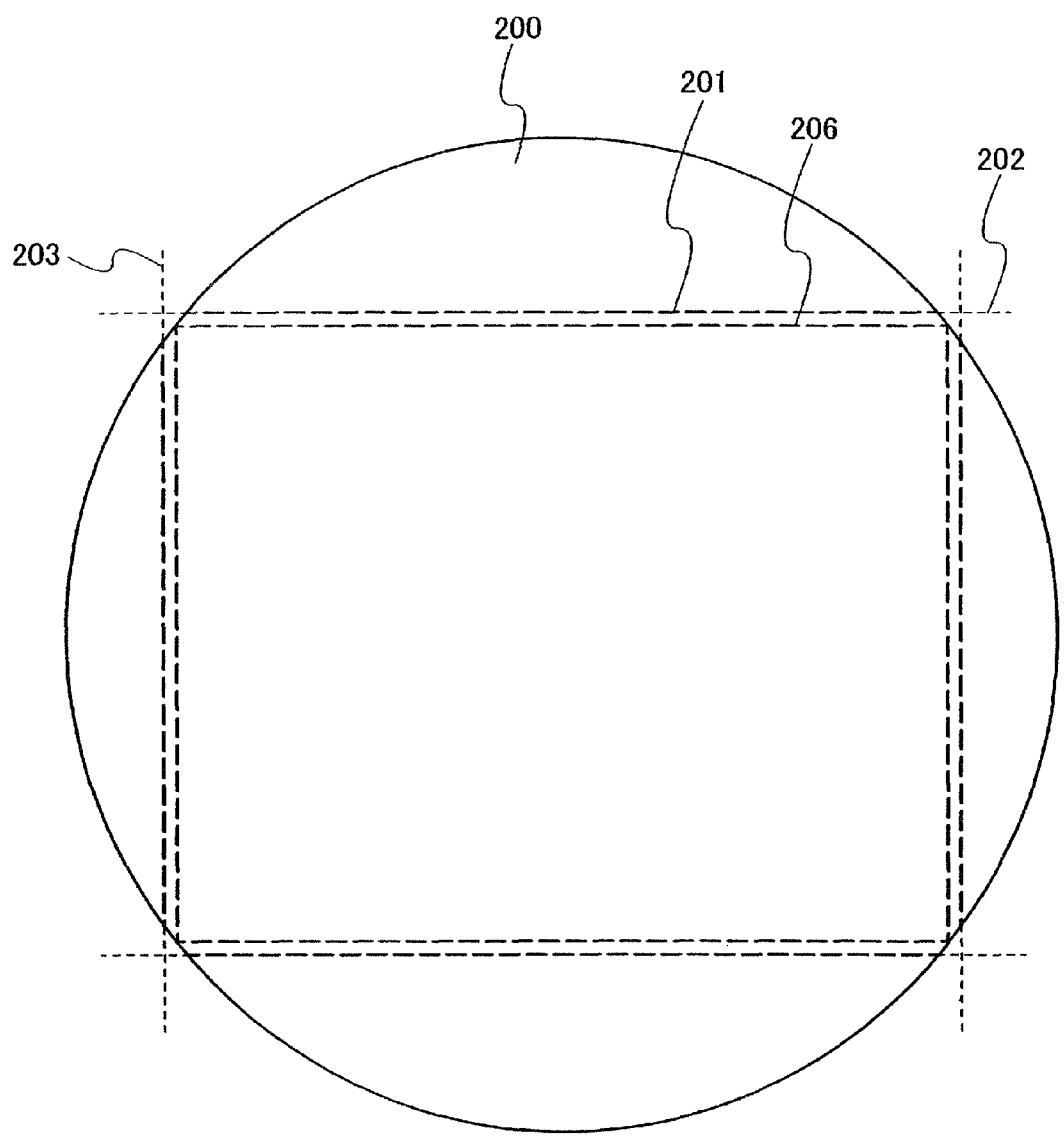
FIG. 9 is a diagram showing a mode in which a semiconductor substrate for transfer with a predetermined external dimension is cut out of a circular single crystal semiconductor substrate.

FIG. 9 shows a mode in which a semiconductor substrate 201 for transfer with a predetermined external dimension is cut out of a single crystal semiconductor substrate 200, typically a silicon wafer, with a certain size. The semiconductor substrate 201 for transfer can be maximized up to the point of each vertex inscribed in the single crystal semiconductor substrate 200. However, the semiconductor substrate 201 for transfer is not necessary to be square. This is because 4:3 or 16:9 aspect ratio is employed as the standard for a screen of the display panel, and the external dimension of the display panel fits the aspect ratio by itself. The size of the silicon wafer is preferably 300 mm or more in diameter. For example, a silicon wafer of 400 mm or 450 mm in diameter (18-inch silicon wafer) can be employed.

As shown in FIG. 10, the semiconductor substrate 201 for transfer is cut out such that respective distances between two opposite pairs of sides of the semiconductor substrate 201 for transfer are longer than those of a rectangular region inscribed in the single crystal semiconductor substrate 200. That is, the semiconductor substrate 201 for transfer can be cut out so that vertexes of the rectangle are not 90 degrees by cutting the single crystal semiconductor substrate 200 along the cutoff lines 202 and 203. Through such processing, an area necessary for manufacturing a display panel can be secured in the semiconductor substrate 201 for transfer and the substrate whose corner portions are not 90 degrees or acute angles can be manufactured. Because the corner portion of the semiconductor substrate 201 for transfer is not approximately 90 degrees, the substrate can be prevented from being damaged when it is handled. Further, as described in FIG. 8B, it is preferable that the peripheral end portion of the semiconductor substrate 201 for transfer be chamfered by shaving a sharp angle so as to be processed into a shape with a curved surface or a shape with a multiple-step angle. This can reduce waste of silicon resources by preventing damage to the substrate. Note that cut ends after cutting-out can be reproduced by being melted. Further, the cut ends can also be used when a small single crystal semiconductor film is formed.

(Use Efficiency of Single Crystal Semiconductor Substrate)

In order to efficiently utilize the approximately circular single crystal semiconductor substrate 200, typically a silicon wafer, the external dimension of the wafer and the dimension of the semiconductor substrate 201 for transfer to be cut out of the wafer are necessary to be considered. This is because, even when a large glass substrate is used, the number of panels to be obtained cannot be maximized as long as the size of the semiconductor substrate 201 for transfer does not fit the external dimension of a display panel.

The external dimension of the display panel is determined in accordance with the size of a screen and a peripheral region (also referred to as a frame region) accompanied with the screen. The accompanied peripheral region includes an area necessary for formation of an input/output terminal of signals, an area necessary for formation of a driver circuit, and the like.

The size of a glass substrate used for manufacturing a display panel varies depending on specification of a production line of a display panel of the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

Here, Table 1 shows a relation between the size of a display panel and the use efficiency of a silicon wafer in the case where a glass substrate of the 3.5th generation to the 4th generation is employed. Note that the use efficiency of a wafer shows a value on percentage obtained by dividing the area of a semiconductor substrate for transfer by the area of a silicon wafer.

TABLE 1

| A | B | C ※1 | D ※1 | E | 15 inch 253 × 317 (4:3) | | 11.5 inch 160 × 265 (16:9) | | 7 inch 98 × 162 (16:9) | | 3.7 inch 86 × 62 (4:3) | | 2.4 inch 58 × 43 (4:3) | |
|---|---|---|---|---|---|---|---|---|---|---|---|---|---|---|
| <1> 600 × 720 | 126 × 126 | 6 | 59.9% | 20 | — | — | — | — | — | — | 1 | 20 | 4 | 80 |
| | 200 × 200 | 2 | 50.3% | 9 | — | — | — | — | 2 | 18 | 6 | 54 | 12 | 108 |
| | 195 × 225 | 2 | 55.2% | 9 | — | — | — | — | 2 | 18 | 6 | 54 | 12 | 108 |
| | 300 × 300 | 1 | 56.6% | 4 | — | — | 1 | 4 | 3 | 12 | 12 | 48 | 35 | 140 |
| | 280 × 350 | 1 | 61.6% | 4 | 1 | 4 | 2 | 8 | 4 | 16 | 16 | 64 | 36 | 144 |
| <2> 620 × 750 | 205 × 205 | 2 | 52.9% | 9 | — | — | — | — | 2 | 18 | 6 | 54 | 12 | 108 |
| | 205 × 219 | 2 | 56.5% | 9 | — | — | — | — | 2 | 18 | 6 | 54 | 15 | 135 |
| | 200 × 223 | 2 | 56.1% | 9 | — | — | — | — | 2 | 18 | 6 | 54 | 15 | 135 |
| | 310 × 250 | 1 | 48.8% | 6 | 1 | 6 | 1 | 6 | 3 | 18 | 9 | 54 | 25 | 150 |
| | 280 × 350 | 1 | 61.6% | 4 | 1 | 4 | 2 | 8 | 4 | 16 | 16 | 64 | 36 | 144 |
| <3> 730 × 920 | 212 × 212 | 2 | 56.5% | 12 | — | — | — | — | — | — | 6 | 72 | 12 | 144 |
| | 182 × 230 | 2 | 52.7% | 16 | — | — | — | — | 2 | 32 | 6 | 96 | 15 | 240 |
| | 335 × 300 | 1 | 63.2% | 6 | 1 | 6 | 2 | 12 | 6 | 36 | 15 | 90 | 35 | 210 |
| | 350 × 270 | 1 | 59.4% | 6 | 1 | 6 | 2 | 12 | 4 | 24 | 16 | 96 | 36 | 216 |
| | 365 × 230 | 1 | 52.8% | 8 | — ↑ ※2 | — ↑ ※3 | 1 | 8 | 4 | 32 | 12 | 96 | 30 | 240 |

A Glass substrate (mm)
B Semiconductor Substrate for Transfer (mm)
C Number of Obtained Wafers
D Use Efficiency of Wafer
E Number of Tiles
※1 The size of wafer(s) is φ450 mm
※2 The number of display panels obtained from a semiconductor substrate for transfer is listed in the left column.
※3 The number of display panels obtained from glass substrates is listed in the right column.

In Table 1, the row <1> shows a relation between the size of a semiconductor substrate for transfer that can be obtained from a silicon wafer (18-inch silicon wafer) of 450 mm in diameter and the use efficiency of a wafer in the case where a glass substrate of 600 mm×720 mm is used. In Table 1, the number of display panels to be obtained in each case of the 15-inch screen, the 11.5-inch screen, the 7-inch screen, the 3.7-inch screen, and the 2.4-inch screen is shown in the right hand. Further, the row <2> and the row <3> show the case of using a glass substrate of 620 mm×750 mm and the case of using a glass substrate of 730 mm×920 mm, respectively.

Table 1 shows that the number of various display panels to be obtained and the use efficiency of a wafer differ depending on the size of a semiconductor substrate for transfer. In this case, the larger number of obtained display panels and higher use efficiency of a wafer may be an index showing high productivity and effective utilization of resources.

A matter that attracts attention here is that a 15-inch display panel can be formed with a transistor formed using single crystal silicon with the use of a silicon wafer of 450 mm in diameter. For example, four semiconductor substrates of 280 mm×350 mm for transfer can be attached to a glass substrate of 600 mm×720 mm by using a silicon wafer of 450 mm in diameter. Accordingly, four 15-inch display panels can be obtained from one glass substrate. When this is applied to the case of an 11.5-inch panel, eight panels can be obtained from one glass substrate. At this time, the use efficiency of a wafer can achieve 60% or more.

Further, in the case of a glass substrate of 730 mm×920 mm, six semiconductor substrates of 335 mm×300 mm for transfer can be attached, and six 15-inch display panels can be obtained. When this is applied to the case of an 11.5-inch panel, 12 panels can be obtained from one glass substrate. At this time, the use efficiency of a wafer can achieve 63% or more.

In this manner, by using a silicon wafer with large diameter, a medium-sized panel that can be used for a monitor of a computer or the like, a portable television, or the like can be manufactured with high productivity while a silicon wafer is effectively utilized.

On the other hand, in the case of a small-sized panel with a screen size of 10 inches or less, by attaching four semiconductor substrates of 280 mm×350 mm for transfer to a glass substrate of 600 mm×720 mm, 16 panels in the conversion to a 7-inch display panel, 64 panels in the conversion to a 3.7-inch display panel, or 144 panels in the conversion to a 2.4-inch display panel can be manufactured. That is, 10 or more display panels having a screen size of greater than or equal to 2 inches and less than or equal to 7 inches can be obtained. It is needless to say that miniaturization is possible by using single crystal silicon. Accordingly, the density of pixels can be improved even in a display panel of 10 inches or less, whereby images with high definition can be displayed.

As seen in the result shown in Table 1, by using a glass substrate of 600 mm×720 mm, in production of so-called small or medium sized panels of 2.4 inches to 15 inches display panels, the number of panels to be obtained can be maximized with a use efficiency of a wafer of 60% or more. Further, in the case of using a glass substrate of 620 mm×750 mm, the number of panels to be obtained can be maximized with a use efficiency of a wafer of 55% or more. Furthermore, in the case of using a glass substrate of 730 mm×920 mm, the number of panels to be obtained can be maximized with a use efficiency of a wafer of 52% or more.

(Number of Single Crystal Semiconductor Film Transferable to Base Substrate)

As described in the above modes, when a semiconductor substrate for transfer is cut out of an approximately circular single crystal semiconductor substrate and the single crystal semiconductor film is transferred on a mother glass substrate, the number of panels to be obtained cannot be maximized as long as the size of the semiconductor substrate 201 for transfer does not fit the external dimension of a display panel. In this embodiment mode, a relation between a semiconductor substrate for transfer and a mother glass substrate is given as an example.

Figure 11A:
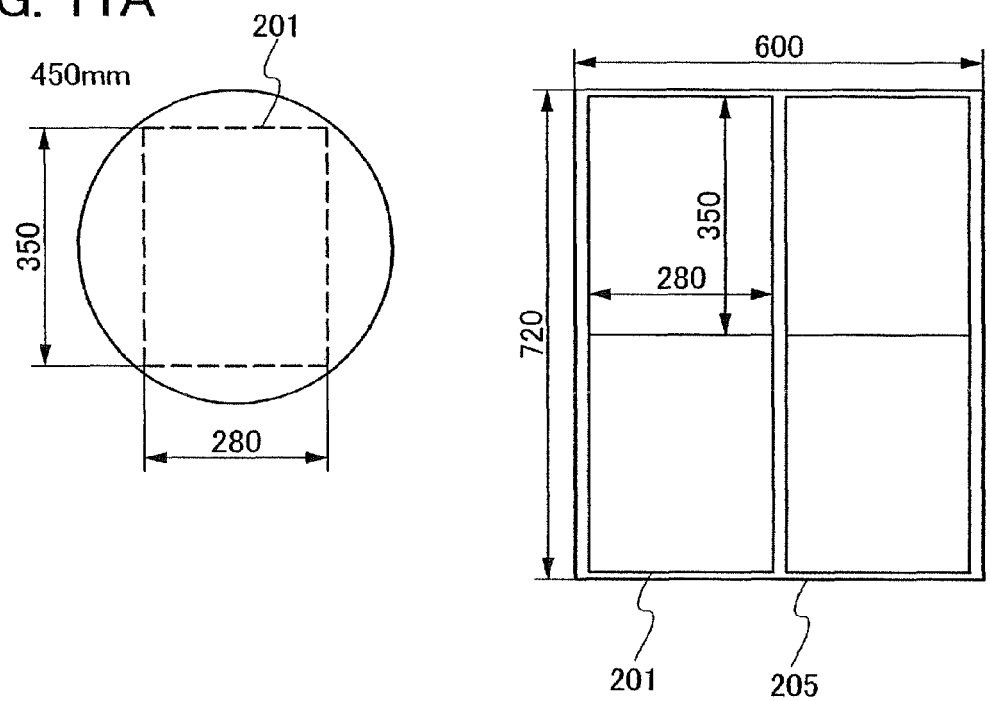
FIGS. 11A and 11B are diagrams each showing a mode in which a semiconductor substrate for transfer is cut out of a silicon wafer of 450 mm in diameter and transferred on a base substrate of 600 mm×720 mm.
Figure 11B:
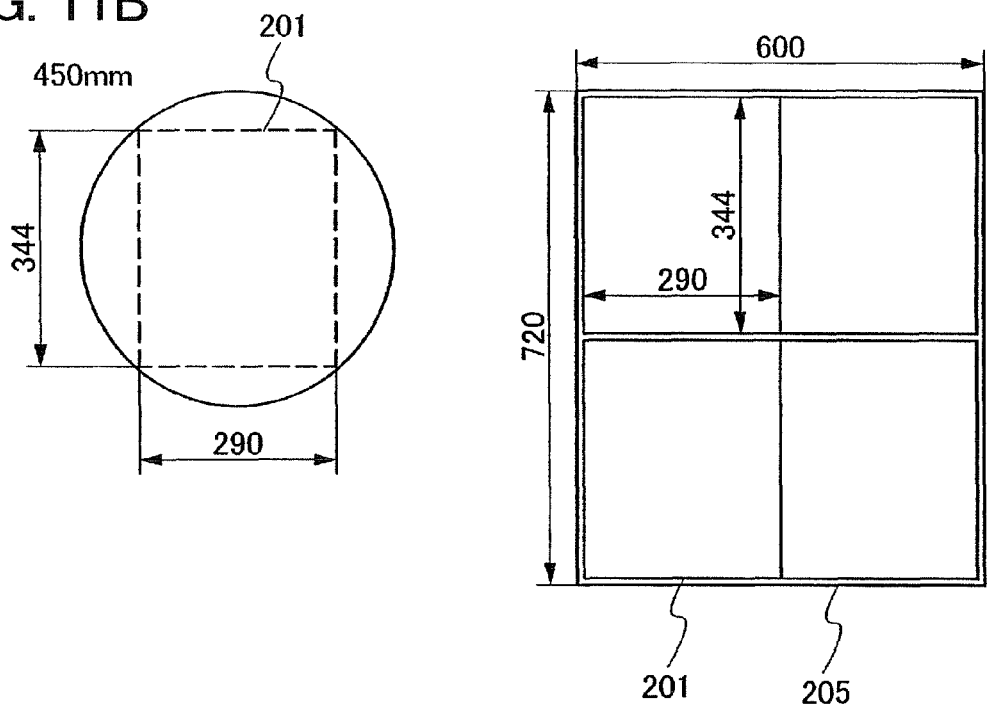

In FIG. 11A, one semiconductor substrate 201 for transfer having a size of 280 mm×350 mm can be obtained from a silicon wafer of 450 mm in diameter, and four semiconductor substrates 201 for transfer can be attached to a base substrate 205 (e.g., glass substrate) of 600 mm×720 mm. In FIG. 11B, one semiconductor substrate 201 for transfer having a size of 290 mm×344 mm can be obtained from a silicon wafer of 450 mm in diameter, and four semiconductor substrates 201 for transfer can be attached to the base substrate 205 of 600 mm×720 mm. In the semiconductor substrate 201 for transfer having a size of 280 mm×350 mm or 290 mm×344 mm, one display panel with a screen size of 15 inches can be manufactured.

In FIG. 12A, one semiconductor substrate 201 for transfer having a size of 195 mm×225 mm can be obtained from a silicon wafer of 300 mm in diameter, and nine semiconductor substrates 201 for transfer can be attached to the base substrate 205 (e.g., glass substrate) of 600 mm×720 mm. In FIG. 12B, one semiconductor substrate 201 for transfer having a size of 141 mm×141 mm can be obtained from a silicon wafer of 200 mm in diameter, and 20 semiconductor substrates 201 for transfer can be attached to the base substrate 205 of 600 mm×720 mm. In the semiconductor substrate 201 for transfer having a size of 195 mm×225 mm, two display panels with a screen size of 7 inches can be manufactured, and 18 display panels with a screen size of 3.7 inches can be manufactured from the base substrate 205. Also in the semiconductor substrate 201 for transfer having a size of 195 mm×225 mm, six display panels with a screen size of 3.7 inches can be manufactured, and 54 display panels with a screen size of 3.7 inches can be manufactured from the base substrate 205. Further, in the semiconductor substrate 201 for transfer having a size of 195 mm×225 mm, 12 display panels with a screen size of 2.4 inches can be manufactured, and 108 display panels with a screen size of 2.4 inches can be manufactured from the base substrate 205.

In FIG. 13A, one semiconductor substrate 201 for transfer having a size of 280 mm×350 mm can be obtained from a silicon wafer of 450 mm in diameter, and four semiconductor substrates 201 for transfer can be attached to the base substrate 205 (e.g., glass substrate) of 620 mm×750 mm. In FIG. 13B, one semiconductor substrate 201 for transfer having a size of 310 mm×250 mm can be obtained from a silicon wafer of 450 mm in diameter, and six semiconductor substrates 201 for transfer can be attached to the base substrate 205 of 620 mm×750 mm. In the semiconductor substrate 201 for transfer having a size of 280 mm×350 mm, one display panel with a screen size of 15 inches can be manufactured, and four display panels with a screen size of 15 inches can be manufactured from the base substrate 205. In the semiconductor substrate 201 for transfer having a size of 310 mm×250 mm, one display panel with a screen size of 15 inches can be manufactured, and six display panels with a screen size of 15 inches can be manufactured from the base substrate 205.

Figure 14A:
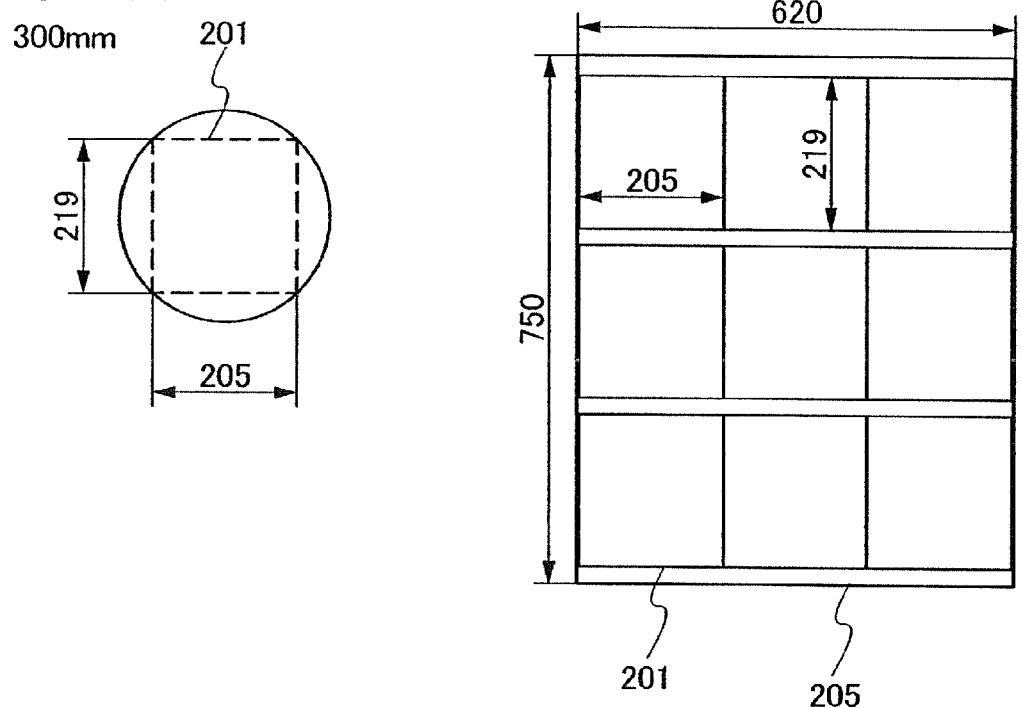
FIGS. 14A and 14B are diagrams each showing a mode in which a semiconductor substrate for transfer is cut out of a silicon wafer of 300 mm in diameter and transferred on a base substrate of 620 mm×750 mm.
Figure 14B:
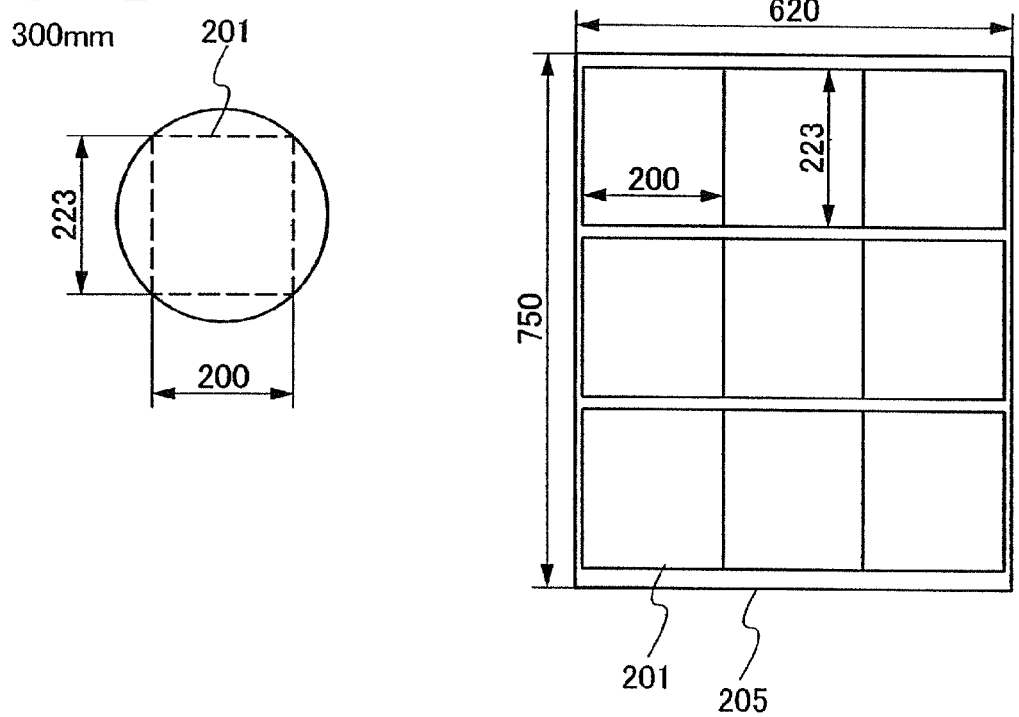

In FIG. 14A, one semiconductor substrate 201 for transfer having a size of 205 mm×219 mm can be obtained from a silicon wafer of 300 mm in diameter, and nine semiconductor substrates 201 for transfer can be attached to the base substrate 205 (e.g., glass substrate) of 620 mm×750 mm. In FIG. 14B, one semiconductor substrate 201 for transfer having a size of 200 mm×223 mm can be obtained from a silicon wafer of 300 mm in diameter, and nine semiconductor substrates 201 for transfer can be attached to the base substrate 205 of 620 mm×750 mm. In the semiconductor substrate 201 for transfer having a size of 205 mm×219 mm or 200 mm×223 mm, two display panels with a screen size of 7 inches can be manufactured, and 18 display panels with a screen size of 7 inches can be manufactured from the base substrate 205. Also in the semiconductor substrate 201 for transfer having a size of 205 mm×219 mm or 200 mm×223 mm, six display panels with a screen size of 3.7 inches can be manufactured, and 54 display panels with a screen size of 3.7 inches can be manufactured from the base substrate 205. Further, in the semiconductor substrate 201 for transfer having a size of 205 mm×219 mm or 200 mm×223 mm, 15 display panels with a screen size of 2.4 inches can be manufactured, and 135 display panels with a screen size of 2.4 inches can be manufactured from the base substrate 205.

In FIG. 15A, one semiconductor substrate 201 for transfer having a size of 280 mm×350 mm can be obtained from a silicon wafer of 450 mm in diameter, and six semiconductor substrates 201 for transfer can be attached to the base substrate 205 (e.g., glass substrate) of 730 mm×920 mm. In FIG. 15B, one semiconductor substrate 201 for transfer having a size of 365 mm×230 mm can be obtained from a silicon wafer of 450 mm in diameter, and eight semiconductor substrates 201 for transfer can be attached to the base substrate 205 of 730 mm×920 mm. In the semiconductor substrate 201 for transfer having a size of 280 mm×350 mm, one display panel with a screen size of 15 inches can be manufactured, and six display panels with a screen size of 15 inches can be manufactured from the base substrate 205. Also in the semiconductor substrate 201 for transfer having a size of 280 mm×350 mm, 36 display panels with a screen size of 2.4 inches can be manufactured, and 216 display panels with a screen size of 2.4 inches can be manufactured from the base substrate 205. Further, in the semiconductor substrate 201 for transfer having a size of 365 mm×230 mm, 30 display panels with a screen size of 2.4 inches can be manufactured, and 240 display panels with a screen size of 2.4 inches can be manufactured from the base substrate 205.

In FIG. 16A, one semiconductor substrate 201 for transfer having a size of 212 mm×212 mm can be obtained from a silicon wafer of 300 mm in diameter, and 12 semiconductor substrates 201 for transfer can be attached to the base substrate 205 (e.g., glass substrate) of 730 mm×920 mm. In FIG. 16B, one semiconductor substrate 201 for transfer having a size of 182 mm×230 mm can be obtained from a silicon wafer of 300 mm in diameter, and 16 semiconductor substrates 201 for transfer can be attached to the base substrate 205 of 730 mm×920 mm. In the semiconductor substrate 201 for transfer having a size of 212 mm×212 mm, six display panels with a screen size of 3.7 inches can be manufactured, and 72 display panels with a screen size of 3.7 inches can be manufactured from the base substrate 205. Also in the semiconductor substrate 201 for transfer having a size of 212 mm×212 mm, 12 display panels with a screen size of 2.4 inches can be manufactured, and 144 display panels with a screen size of 2.4 inches can be manufactured from the base substrate 205. Further, in the semiconductor substrate 201 for transfer having a size of 182 mm×230 mm, six display panels with a screen size of 3.7 inches can be manufactured, and 96 display panels with a screen size of 3.7 inches can be manufactured from the base substrate 205. Furthermore, in the semiconductor substrate 201 for transfer having a size of 182 mm×230 mm, 15 display panels with a screen size of 2.4 inches can be manufactured, and 240 display panels with a screen size of 2.4 inches can be manufactured from the base substrate 205.

In this manner, by manufacturing a semiconductor substrate of a predetermined size for transfer with the use of a single crystal semiconductor substrate (silicon wafer) of 300 mm or more in diameter, and forming a single crystal semiconductor film by arranging a plurality of semiconductor substrates for transfer on a base substrate (glass substrate) of 500 mm or more on one side, a panel with a small-sized screen of 2.4 inches and a panel with a medium-sized screen of 15 inches can be manufactured with high productivity.

(Arrangement of a Single Crystal Semiconductor Film Over a Base Substrate)

Figure 17:
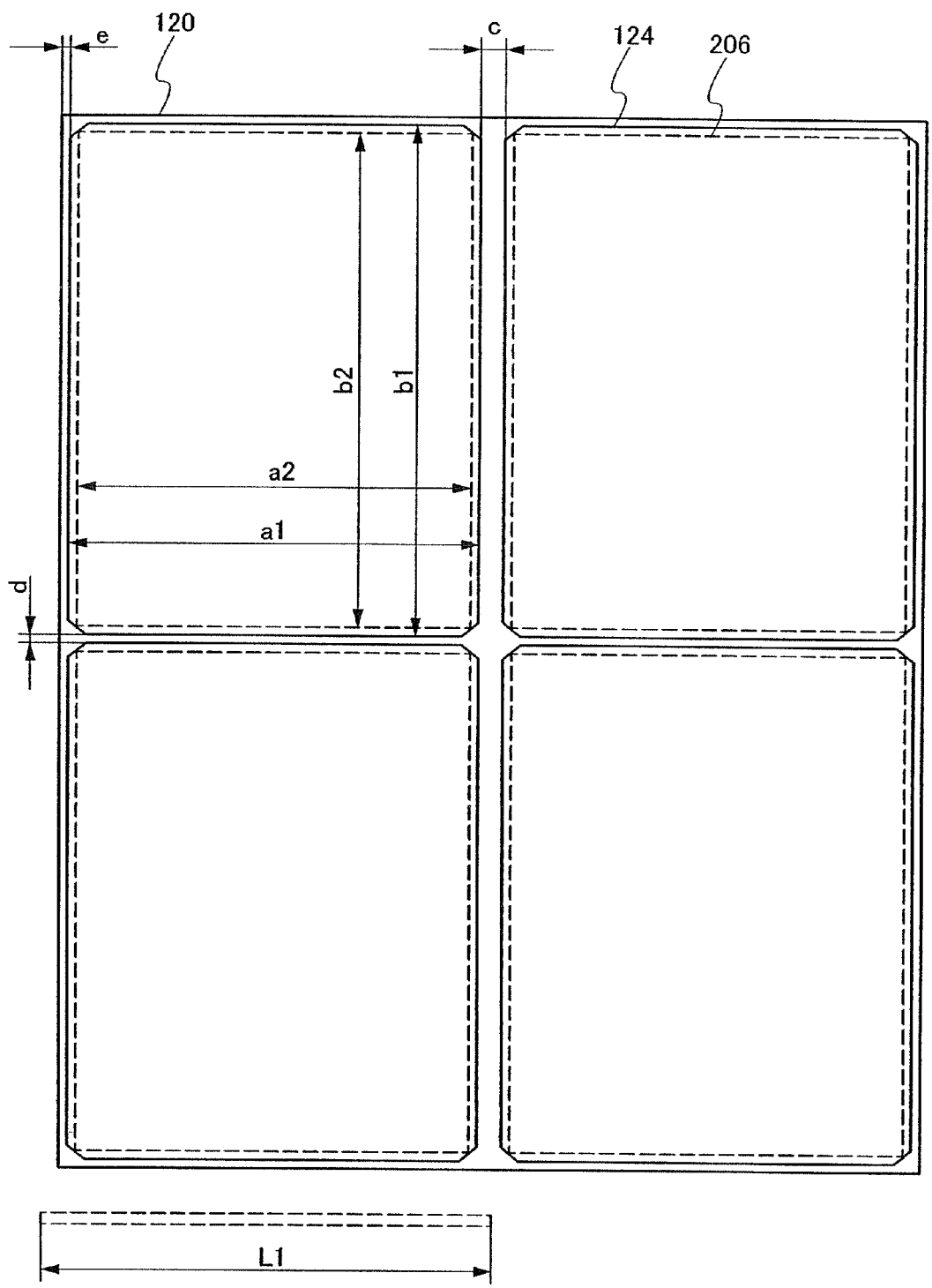
FIG. 17 is a diagram showing an example of an arrangement when a single crystal semiconductor film is provided over a base substrate.

FIG. 17 shows one example of an arrangement when the single crystal semiconductor film 124 is formed over the base substrate 120. The single crystal semiconductor film 124 is cut out of a circular semiconductor substrate so as to be a1×b1 in size and have its vertex at an angle of greater than 90 degrees. A region a2×b2 in size inside the single crystal semiconductor film 124 is used as a panel effective-utilization region 206. Each pattern of a display panel is transferred to the panel effective-utilization region 206 by a photolithography technique. By imaginarily providing the panel effective-utilization region 206 inside the single crystal semiconductor film 124, manufacturing yield can be improved. This is because, even if an end portion of the single crystal semiconductor film 124 has a defect, the panel effective-utilization region 206 can avoid being influenced by the defect.

In an arrangement shown in FIG. 17, spaces between adjacent objects, that is, an adjoining space c and an adjoining space d are different. In arranging the single crystal semiconductor film 124 over the base substrate 120, the adjoining space c which is in a lateral direction is wider than the adjoining space d which is in a longitudinal direction and an end portion space e which is a space between an end portion of the single crystal semiconductor film 124 and an end portion of the base substrate 120.

By setting such an arrangement, in the case where the single crystal semiconductor film 124 is recrystallized or surface treatment is performed on the single crystal semiconductor film 124 by using a linear laser beam with a length of L in a longitudinal direction, which is longer than a1 of the single crystal semiconductor film 124 and shorter than a shorter side of the base substrate 120, an end portion of the linear laser beam can be set in the adjoining space c while the single crystal semiconductor film 124 is irradiated with the linear laser beam. Thus, variations in quality can be prevented because the adjacent single crystal semiconductor films 124 are not irradiated also with the edge of the linear laser beam.

Figure 18:
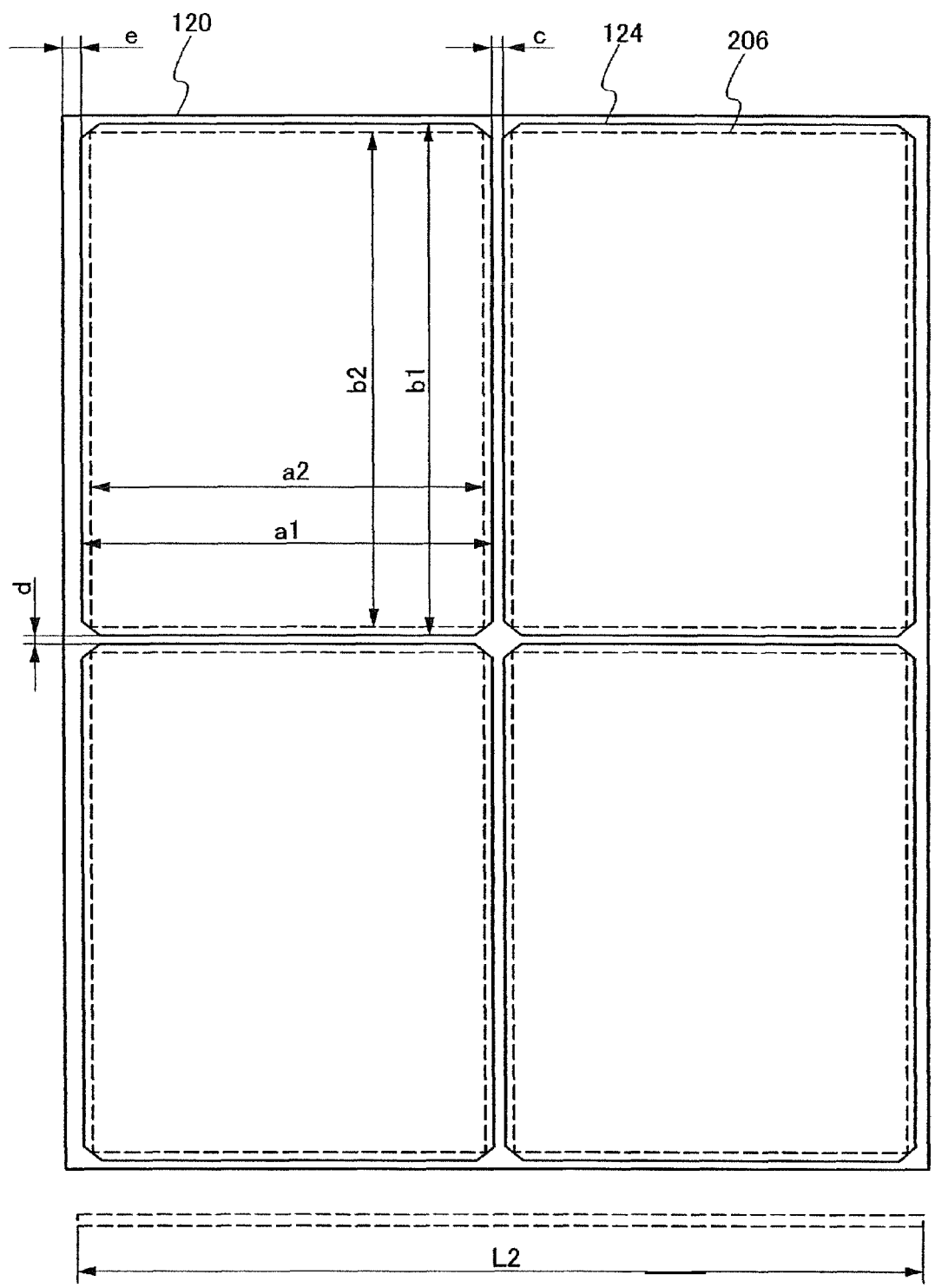
FIG. 18 is a diagram showing an example of an arrangement when a single crystal semiconductor film is provided over a base substrate.

FIG. 18 shows another mode in which four single crystal semiconductor films 124 are provided over one base substrate 120. In an arrangement shown in FIG. 18, spaces between adjacent objects, that is, the adjoining space c and the adjoining space d are the same or substantially the same and the end portion space e which is the space between an end portion of the single crystal semiconductor film 124 and an end portion of the base substrate 120 is wider than each of the adjoining spaces c and d. Such an arrangement of the single crystal semiconductor film 124 is effective when the length L2, which is in a longitudinal direction, of a linear laser beam is the same as or substantially the same as the length of one side of the base substrate 120, that is, the length L2 is long enough to process a plurality of arranged single crystal semiconductor films 124 at the same time.

Embodiment Mode 6

This embodiment mode describes a case in which a display panel is formed using a single crystal semiconductor film provided over a base substrate.

Figure 19:
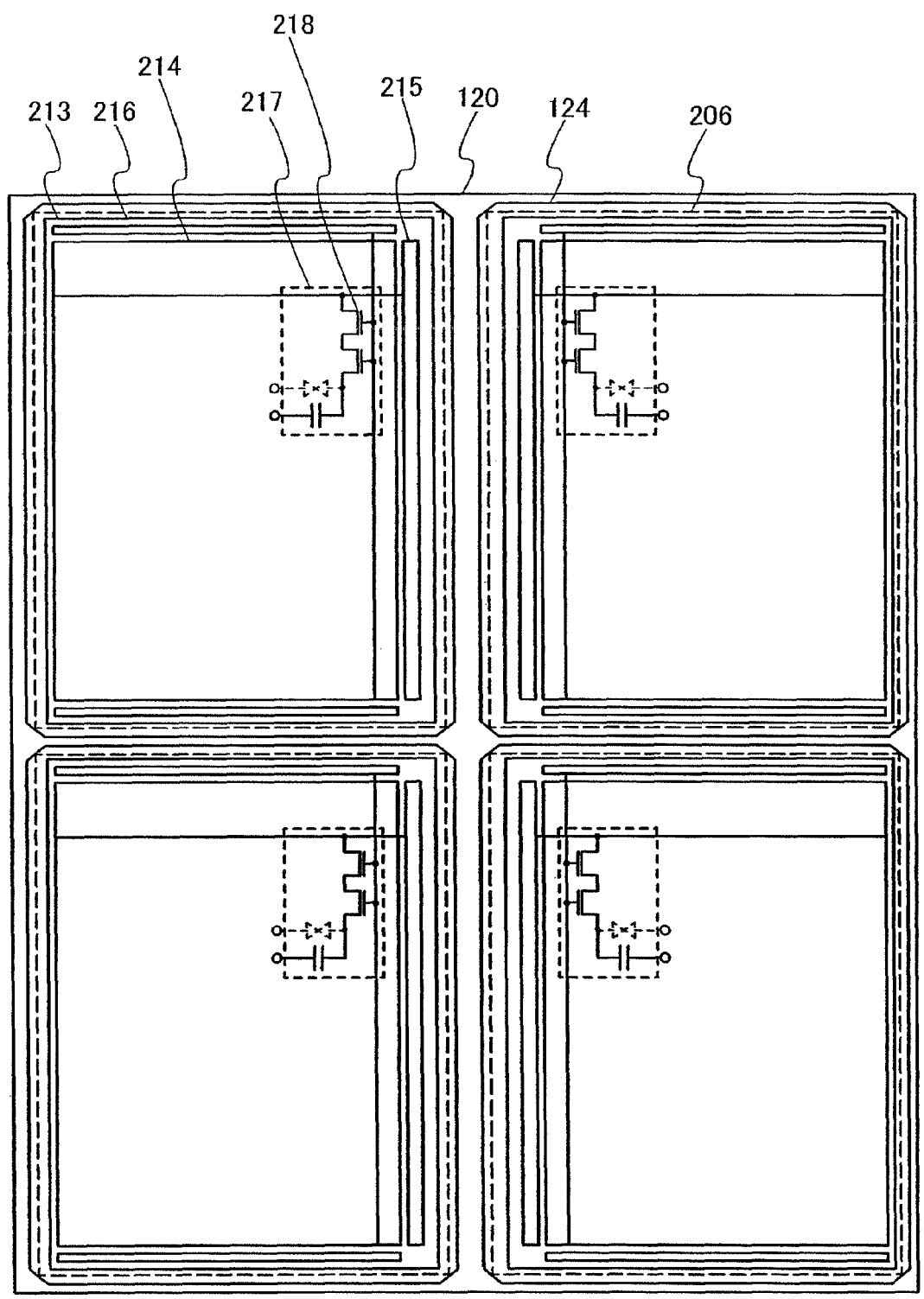
FIG. 19 is a diagram showing an example of forming a display panel with the use of a single crystal semiconductor film provided over a base substrate.

FIG. 19 shows an example of forming a display panel 213 using the single crystal semiconductor film 124 provided over the base substrate 120. A screen region 214 includes a pixel 217. In the pixel 217, a transistor 218 is formed using the single crystal semiconductor film 124. By using a single crystal semiconductor, the size of a transistor can be small so that the aperture ratio of a pixel can be increased. Further, by forming a transistor using a single crystal semiconductor, a liquid crystal display panel which operates at a frame frequency of 120 MHz or more can be easily manufactured. By using the single crystal semiconductor film 124, a data driver circuit 215 and a gate driver circuit 216 can be formed in the display panel 213 in addition to the screen region 214. Furthermore, a pixel processor, a memory, and the like can be formed over the same substrate.

Then, one example of a process for manufacturing a display panel is shown. In the display panel, by manufacturing a transistor using the single crystal semiconductor, a transistor of a pixel, which controls a display medium, and a transistor of a driver circuit can be manufactured over the same substrate.

Figure 20:
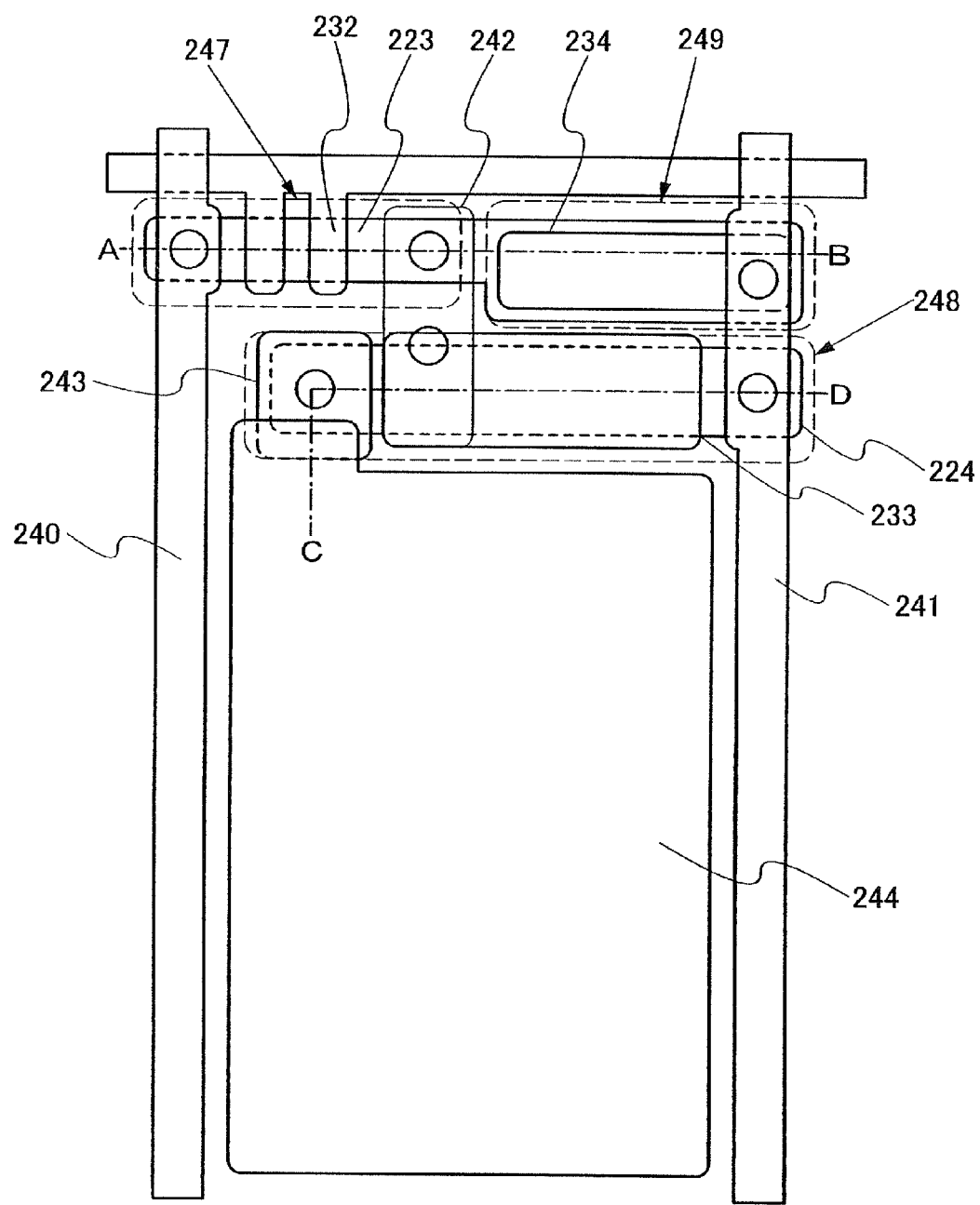
FIG. 20 is a diagram showing an example of a pixel which is used for a display panel and which is provided with a first transistor to which a data signal is input and a second transistor connected to a pixel electrode.

FIG. 20 shows one example of a pixel used for the display panel, which is provided with a first transistor to which a data signal is input and a second transistor which is connected to a pixel electrode. In the pixel, an n-channel transistor 247, a p-channel transistor 248, and a capacitor element 249 are provided. One example of processes for manufacturing a transistor in this pixel and a transistor in a driver circuit which can be manufactured at the same time is described below.

An SOI substrate in which the second insulating film 122, the first insulating film 102, and the single crystal semiconductor film 124 are formed over the base substrate 120 is prepared (FIG. 21A). As the single crystal semiconductor film 124, an n-type single crystal semiconductor film with a resistivity of 10 Ωcm or more and a crystal plane of (100) or (110) is employed. An n-type single crystal semiconductor film with a thickness of 30 nm to 100 nm, for example, 50 nm is used as the single crystal semiconductor film 124. As the second insulating film 122, an insulating film containing aluminum oxide can be used.

The single crystal semiconductor film 124 is etched into a desired shape in accordance with the arrangement of the transistor to form single crystal semiconductor films 221, 222, 223, and 224, which are divided into an island shape (FIG. 21B). A semiconductor film in a region except the single crystal semiconductor films 221, 222, 223, and 224 is removed; however, the base substrate 120 is not exposed because the second insulating film 122 is provided. Accordingly, since the second insulating film 122 is provided, the semiconductor film can be prevented from being contaminated by diffusion of impurities such as an alkaline metal from the base substrate 120.

Since the single crystal semiconductor films 221, 222, 223, and 224 are n-type semiconductor films, the single crystal semiconductor films 222 and 224 each forming a p-channel transistor are provided with masks 225 and a p-type impurity is added to the single crystal semiconductor films 221 and 223. As the p-type impurity, boron is used and added at a concentration of $5\times10^{16}$ atoms/cm$^3$ to $1\times10^{18}$ atoms/cm$^3$.

Next, masks 226 which protect channel regions of the single crystal semiconductor films 221 and 223 and masks 227 which protect the entire single crystal semiconductor films 222 and 224 are formed using a photo resist. Then, as an impurity which imparts n-type conductivity, phosphorus or arsenic is added to the single crystal semiconductor films 221 and 223 (FIG. 22A). The concentration of the impurity is $1\times10^{16}$ atoms/cm$^3$ or $5\times10^{19}$ atoms/cm$^3$. Through this process, a first impurity region 228 is formed in each of the single crystal semiconductor films 221 and 223. The first impurity region 228 serves as a lightly doped drain of an n-channel transistor.

The masks 226 and 227 are removed and a gate insulating film 229 is formed. For example, the gate insulating film 229 is formed, to a thickness of greater than or equal to 10 nm and less than or equal to 150 nm, using silicon oxide or silicon oxynitride by a plasma CVD method, a sputtering method, or the like.

Alternatively, the gate insulating film 229 may be formed by processing the single crystal semiconductor films 221, 222, 223, and 224 with plasma excited by microwaves. For example, surfaces of the single crystal semiconductor films 221, 222, 223, and 224 are oxidized or nitrided by diluting nitrous oxide (N$_2$O) one- to three-fold (flow rate) with Ar and applying electric power of microwaves (2.45 GHz) of 3 kW to 5 kW under a pressure of 10 Pa to 30 Pa. Through this process, an insulating film with a thickness of 1 nm to 10 nm (preferably, 2 nm to 6 nm) is formed. Further, nitrous oxide (N$_2$O) and silane (SiH$_4$) are introduced, electric power of microwaves (2.45 GHz) of 3 kW to 5 kW is applied to the single crystal semiconductor films 221, 222, 223, and 224 under a pressure of 10 Pa to 30 Pa, and a silicon oxynitride film is formed as a gate insulating film by a vapor phase growth method. By combination of a solid phase reaction and a reaction caused by a vapor phase growth method, a gate insulating film with low interface state density and high withstand voltage can be formed.

Gate electrodes 230, 231, 232, and 233 are formed over the gate insulating film 229, corresponding to each of the single crystal semiconductor films 221, 222, 223, and 224 (FIG. 22B), respectively. A capacitor electrode 234 is formed over the single crystal semiconductor film 223. Side surfaces of the gate electrodes are preferably slanted at 30 degrees to 75 degrees, more preferably 35 degrees to 60 degrees. This is for improving coverage of a passivation film. The gate electrode and the capacitor electrode are formed using an element selected from tantalum, tungsten, titanium, molybdenum, aluminum, copper, chromium, neodymium, or the like; or an alloy material or a compound material containing the above-described element as its main component. Further, it is preferable that a nitride layer of the above-described metal be formed on the gate insulating film 229 side to improve adhesion of the gate electrode. For example, the gate electrode is formed of a stacked layer body by stacking a tantalum nitride and tungsten in this order over the gate insulating film. The gate electrode 230 over the single crystal semiconductor film 221 is formed so as to be overlapped with the first impurity region 228. Through this process, a lightly doped drain overlapped with the gate electrode is formed. The first impurity region 228 of the single crystal semiconductor film 223 is not overlapped with the gate electrode 232.

Next, an impurity which imparts p-type or n-type conductivity is added to the semiconductor film to form source and drain regions of the transistor (FIG. 23A). Second impurity regions 235 are formed in the single crystal semiconductor films 221 and 223 with the gate electrodes 230 and 232 used as masks. The second impurity regions 235 are n-type and are formed by addition of phosphorus or arsenic at a concentration of $1\times10^{17}$ atoms/cm$^3$ to $5\times10^{19}$ atoms/cm$^3$. Third impurity regions 236 are formed in the single crystal semiconductor films 222 and 224 with the gate electrodes 231 and 233 used as masks. The third impurity regions 236 are p-type and are formed by addition of boron at a concentration of $1\times10^{17}$ atoms/cm$^3$ to $5\times10^{19}$ atoms/cm$^3$.

Then, a passivation layer 237 and an interlayer insulating film 238 are formed over the gate electrode, contact holes are formed, and then a wiring 239 is formed (FIG. 23B). The passivation layer 237 is preferably formed using silicon nitride. The interlayer insulating film 238 is formed using an inorganic insulating material such as silicon oxide or silicon oxynitride; or an organic insulating material such as polyimide or acrylic. The wiring 239 is formed using a stacked layer body of a metal layer of aluminum, aluminum-neodymium (Al—Nd), magnesium-silver (Mg—Ag), or the like, and a metal layer of tantalum, titanium, molybdenum, tungsten, or chromium which sandwiches the above-described metal layer.

In the pixel shown in FIG. 20, a data line 240, a power supply line 241, a wiring 242 in the pixel, and a wiring 243 connected to the pixel electrode are formed as wirings 239. Further, a pixel electrode 244 is formed so as to be electrically connected to the wiring 243 connected to the pixel electrode.

The pixel electrode 244 can be formed using indium tin oxide (ITO); indium zinc oxide (IZO) in which indium oxide is mixed with zinc oxide; a conductive material in which indium oxide is mixed with silicon oxide; organic indium; organic tin; indium oxide containing tungsten oxide; indium zinc oxide containing tungsten oxide; indium oxide containing titanium oxide; indium tin oxide containing titanium oxide; or a metal such as tungsten, molybdenum, zirconium, hafnium, vanadium, niobium, tantalum, chromium, cobalt, nickel, titanium, platinum, aluminum, copper, or silver; or an alloy or a metal nitride thereof.

Further, a conductive composition containing a conductive high molecular compound (also referred to as a conductive polymer) can also be used as the pixel electrode 244. A thin film of the conductive composition preferably has a sheet resistance of 10000 Ω/square or less. In the case where a thin film of the conductive composition is formed as a pixel electrode layer having a light-transmitting property, light transmittance is preferably greater than or equal to 70% at a wavelength of 550 nm. In addition, the resistivity of the conductive high molecular compound which is contained in the conductive composition is preferably 0.1 Ω·cm or less.

As the above-described conductive high molecular compound, a so-called n electron conjugated conductive high molecular compound can be used. For example, polyaniline and a derivative thereof, polypyrrole and a derivative thereof, polythiophene and a derivative thereof, a copolymer of these materials, and the like can be given.

Through the above-described process, an n-channel transistor 245 and a p-channel transistor 246, which form the driver circuit or other logic circuits, and the n-channel transistor 247, the p-channel transistor 248, and the capacitor element 249, which are included in the pixel can be formed using the single crystal semiconductor film over the base substrate 120. According to this embodiment mode, by using the single crystal semiconductor for manufacturing the transistors in a pixel region and a driver circuit region, operation speed can be improved. Therefore, in the display panel, frame frequency can be increased and display characteristics can be improved. Further, by using the single crystal semiconductor for forming the transistor in the pixel, variations in characteristics are few and images can be displayed without unevenness.

Next, as a display device manufactured using a display panel, one example of a pixel portion in an electroluminescent display panel is described.

Figure 24:
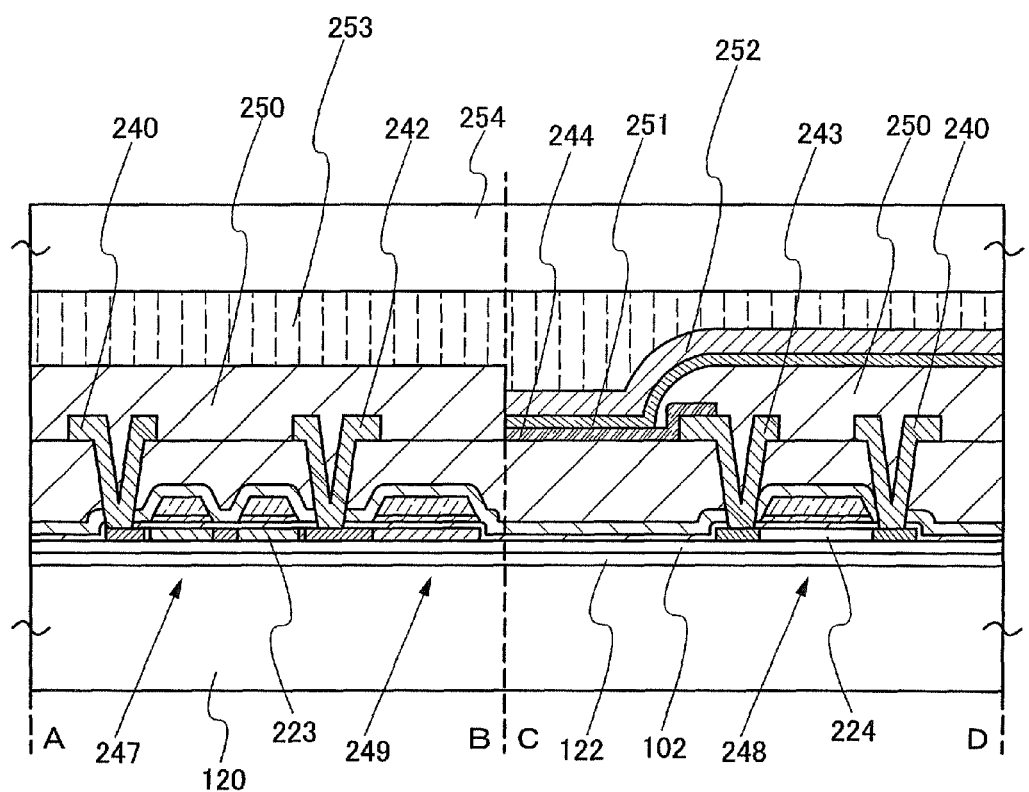
FIG. 24 is a cross-sectional view showing the pixel corresponding to FIG. 20.

FIG. 24 shows a cross-sectional view of the pixel corresponding to FIG. 20. The n-channel transistor 247, the p-channel transistor 248, and the capacitor element 249 are provided in the pixel. In this display device, each pixel is provided with a light-emitting element that includes a layer (EL layer) containing an electroluminescent material between electrodes. The pixel electrode 244 is connected to the p-channel transistor 248. The periphery of the pixel electrode 244 is surrounded by a partition wall insulating film 250. An EL layer 251 is formed over the pixel electrode 244. An electrode 252 facing the pixel electrode 244 is formed over the EL layer 251. The pixel portion is filled with a sealing layer 253 and is provided with a sealing plate 254 as a reinforcing plate.

In the electroluminescent display device of this embodiment mode, such pixels are arranged in matrix to form a display screen. In this case, a channel portion of a transistor of a pixel is formed using a single crystal semiconductor film. Therefore, there are advantages in that characteristics do not vary from transistor to transistor and emission luminance does not vary from pixel to pixel. Therefore, driving with the brightness of a light emitting element controlled by a current becomes easy, and a correction circuit which corrects variations in transistor characteristics becomes unnecessary. Thus, a load on a driver circuit can be reduced.

Figure 25:
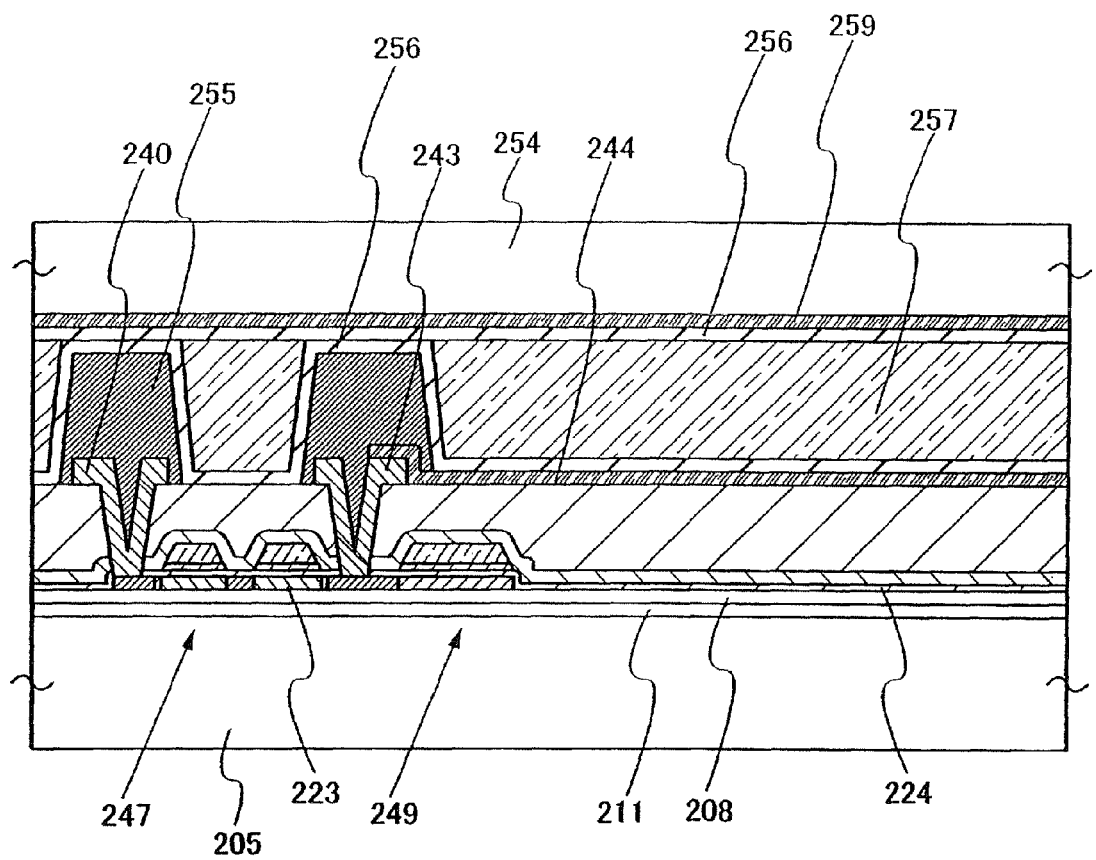
FIG. 25 is a diagram showing an example of a pixel in a liquid crystal display device in which a pixel transistor is formed using a single crystal semiconductor film.

FIG. 25 shows one example of a pixel in a liquid crystal display device in which the n-channel transistor 247 is formed using the single crystal semiconductor film. Since a contact hole which connects the data line 240 and the wiring 243 connected to the pixel electrode has a step in the form of a depression, a spacer 255 is provided so that the depression is filled with it. The counter electrode 259 is provided on the sealing plate 254, and alignment films 256 sandwiching a liquid crystal layer 257 therebetween are provided. According to this embodiment mode, by using a single crystal semiconductor film for forming a transistor in a pixel, the size of the transistor can be small, so that an aperture ratio of the pixel can be increased. Further, by using a single crystal semiconductor for forming a transistor, a liquid crystal display panel which operates at a frame frequency of 120 MHz or more can be easily manufactured.

Embodiment Mode 7

This embodiment mode describes electronic devices employing the above-described display device with reference to FIGS. 26A to 26H and FIGS. 27A to 27C.

In this embodiment mode, the followings are described as electronic devices: a video camera, a digital camera, a goggle type display (a head mounted display), a navigation system, an audio reproducing device (car audio component set, or the like), a computer, a game machine, a portable information terminal (a mobile computer, a mobile phone, a portable game machine, an e-book reader, or the like), and an image reproducing device provided with a recording medium (specifically, a device provided with a display device which can reproduce a recording medium such as a digital versatile disc (DVD) and display the image), and the like.

Figure 26A:
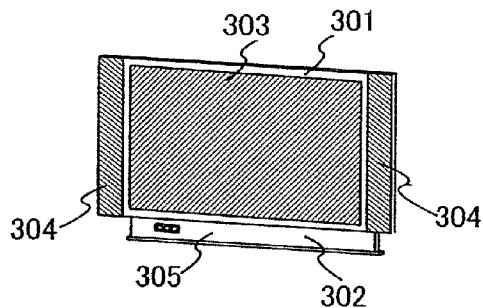
FIGS. 26A to 26H are diagrams showing electronic devices as examples.

FIG. 26A shows a television receiver or a monitor of a personal computer. The television receiver or the monitor of the personal computer in FIG. 26A includes a housing 301, a supporting base 302, a display portion 303, a speaker portion 304, a video inputting terminal 305, and the like. By forming the display portion 303 using a transistor formed using a single crystal semiconductor, a television receiver or monitor of a personal computer with high reliability and high performance can be provided.

Figure 26B:
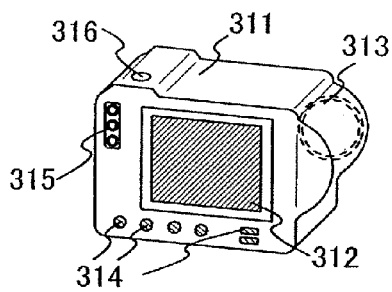

FIG. 26B shows a digital camera. An image receiving portion 313 is provided on the front side of a main body 311. A shutter button 316 is provided on the top side of the main body 311. A display portion 312, operation keys 314, and an external connection port 315 are provided at the backside of the main body 311. By forming the display portion 312 using a transistor formed using a single crystal semiconductor, a digital camera with high reliability and high performance can be provided.

Figure 26C:
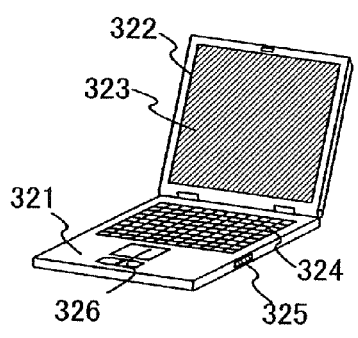

FIG. 26C shows a notebook computer. A main body 321 is provided with a keyboard 324, an external connection port 325, and a pointing device 326. Moreover, the main body 321 has a housing 322 having a display portion 323 attached thereto. By forming the display portion 323 using a transistor formed using a single crystal semiconductor, a notebook computer with high reliability and high performance can be provided.

Figure 26D:
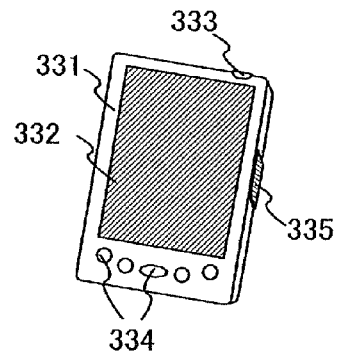

FIG. 26D shows a mobile computer, which includes a main body 331, a display portion 332, a switch 333, operation keys 334, an infrared port 335, and the like. Furthermore, an active matrix display device is provided in the display portion 332. By forming the display portion 332 using a transistor formed using a single crystal semiconductor, a mobile computer with high reliability and high performance can be provided.

Figure 26E:
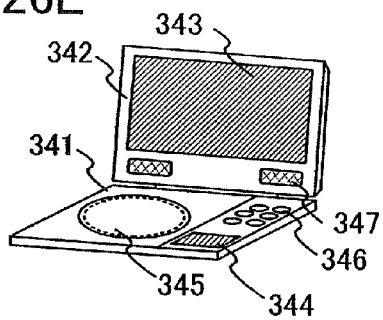

FIG. 26E shows an image reproducing device. A main body 341 is provided with a display portion (B) 344, a recording medium reader 345, and operation keys 346. Moreover, a housing 342 including a speaker portion 347 and a display portion (A) 343 is attached to the main body 341. By forming each of the display portions (A) 343 and (B) 344 using a transistor formed using a single crystal semiconductor, an image reproducing device with high reliability and high performance can be provided.

Figure 26F:
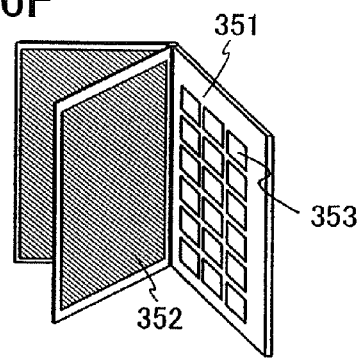

FIG. 26F shows an e-book reader. A main body 351 is provided with operation keys 353. A plurality of display portions 352 is attached to the main body 351. By forming the display portion 352 using a transistor formed using a single crystal semiconductor, an e-book reader with high reliability and high performance can be provided.

Figure 26G:
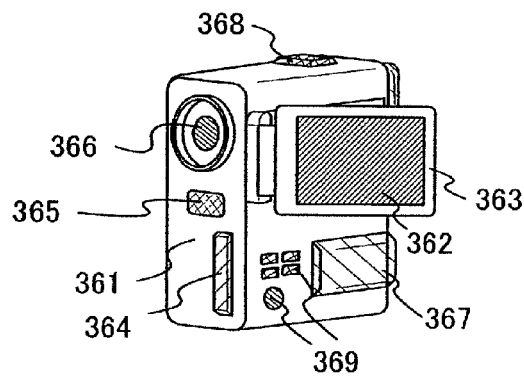

FIG. 26G shows a video camera. A main body 361 is provided with an external connection port 364, a remote controller receiving portion 365, an image receiving portion 366, a battery 367, an audio input portion 368, and operation keys 369. Moreover, a housing 363 including a display portion 362 is attached to the main body 361. By forming the display portion 362 using a transistor formed using a single crystal semiconductor, a video camera with high reliability and high performance can be provided.

Figure 26H:
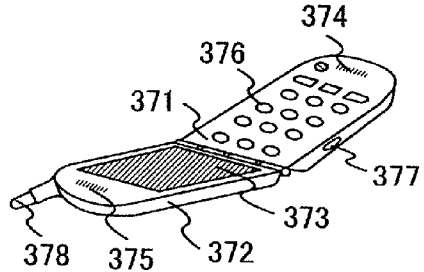

FIG. 26H shows a mobile phone, which includes a main body 371, a housing 372, a display portion 373, an audio input portion 374, an audio output portion 375, operation keys 376, an external connection port 377, an antenna 378, and the like. By forming the display portion 373 using a transistor formed using a single crystal semiconductor, a mobile phone with high reliability and high performance can be provided.

Figure 27A:
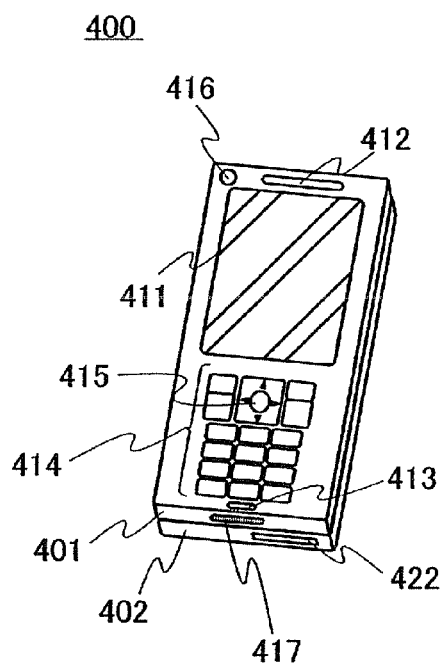
FIGS. 27A to 27C are diagrams showing electronic devices as examples.
Figure 27B:
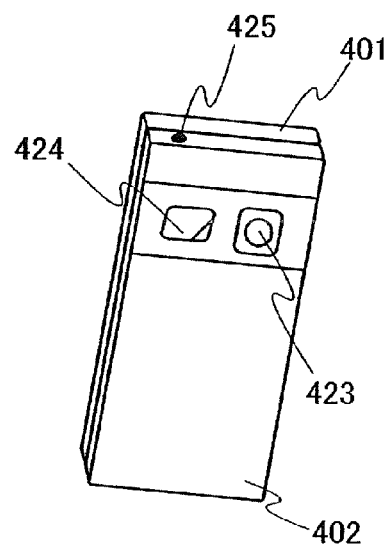
Figure 27C:
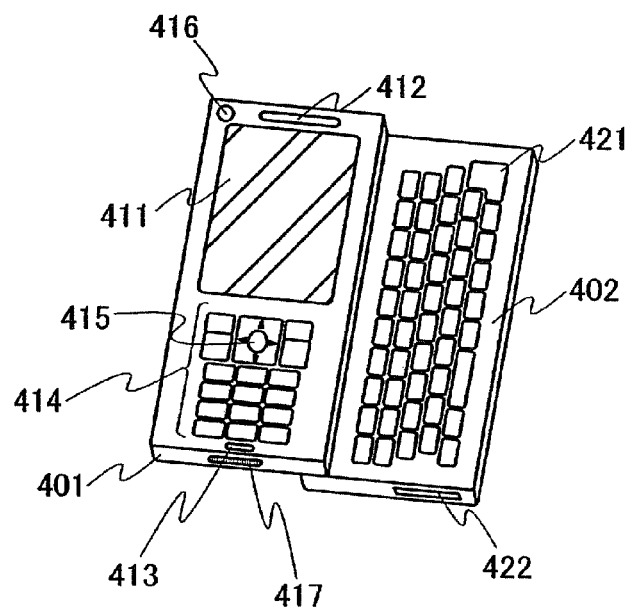

FIGS. 27A to 27C show a structural example of a portable electronic device 400 having functions as a telephone and an information terminal. FIG. 27A is a front view, FIG. 27B is a back view, and FIG. 27C is a developed view. The portable electronic device 400 has functions as both a telephone and an information terminal and is an electronic device so-called a smartphone which is capable of various data processing in addition to voice call.

The portable electronic device 400 includes housings 401 and 402. The housing 401 is provided with a display portion 411, a speaker 412, a microphone 413, operation keys 414, a pointing device 415, a lens 416 for a camera, an external connection terminal 417, and the like. The housing 402 is provided with a keyboard 421, an external memory slot 422, a lens 423 for a camera, a light 424, an earphone terminal 425, and the like. Moreover, an antenna is incorporated into the housing 401. In addition to the above-described structure, a wireless IC chip, a small size memory device, or the like can be incorporated therein.

The display portion 411 includes a transistor formed using a single crystal semiconductor. An image displayed (and direction in which the image is displayed) in the display portion 411 variously changes depending on the usage pattern of the portable electronic device 400. Moreover, since the display portion 411 and the lens 416 for a camera are provided on the same surface, voice call (so-called videophone) with images can be possible. Note that the speaker 412 and the microphone 413 can be used not only for voice call but also for recording, reproducing, or the like. In the case where a still image and a moving image are shot by using the lens 423 for a camera (and the light 424), the display portion 411 is used as a finder. The operation keys 414 are used for incoming/outgoing of phone call, inputting simple information such as e-mail, screen scrolling, moving cursor, and the like.

The housings 401 and 402 overlapped with each other (FIG. 27A) slide and can be developed as shown in FIG. 27C, so that the portable electronic device 400 can be used as an information terminal. In this case, smooth operation with the keyboard 421 and the pointing device 415 can be performed. The external connection terminal 417 can be connected to various cables such as an AC adapter or a USB cable, whereby the portable electronic device 400 can be charged or can perform data communication with a computer or the like. Moreover, by inserting a recording medium into the external memory slot 422, the portable electronic device 400 can deal with storing and moving data with higher capacitance. In addition to the above-described functions, a function of wireless communication by using electromagnetic waves such as infrared rays, a function of receiving television, and the like can be included.

Embodiment 1

This embodiment describes adhesion when a single crystal silicon substrate and a base substrate were bonded to each other using a silicon oxide film formed on the single crystal silicon substrate and an aluminum oxide film serving as the base substrate, which was formed over a glass substrate. Note that it is needless to say that the present invention is not limited to the following embodiments and is specified by the claims of the present invention.

First, a silicon oxide film was formed to a thickness of approximately 100 nm on a single crystal silicon substrate by performing heat treatment. Further, an aluminum oxide film was formed over a surface of a glass substrate.

The silicon oxide film was formed by performing heat treatment on the single crystal silicon substrate in an oxidation atmosphere containing hydrogen chloride (HCl) at a ratio of 3 vol. % with respect to oxygen at a temperature of 950° C. for 200 minutes.

An aluminum oxide film was formed under different conditions using a sputtering method. Specifically, an aluminum oxide film was formed under the following conditions: a condition in which aluminum (Al) was used as a sputtering target, and a high-frequency power source was used while argon and oxygen were introduced (condition 1); a condition in which aluminum oxide was used as a sputtering target, and a high-frequency power source was used while argon and oxygen were introduced (condition 2); and a condition in which aluminum (Al) was used as a sputtering target, a bias voltage was applied by using DC power supply while argon and oxygen were introduced (condition 3). Note that a deposition rate was set to be 0.51 nm/min under the condition 1, 1.74 nm/min under the condition 2, and 0.98 nm/min under the condition 3. In all of the conditions 1 to 3, a gas flow rate of argon was set to be 30 sccm, a gas flow rate of oxygen was set to be 10 sccm, and a film formation pressure was set to be 0.4 Pa. A film formation power was set to be 800 W (13.56 MHz) under the condition 1, 1 kW (13.56 MHz) under the condition 2, and 1 kW (DC) under the condition 3. Further, a high frequency power of 200 W (13.56 MHz) was applied to the substrate side to generate a bias voltage.

Next, surfaces of the aluminum oxide films formed under the different conditions were measured using an atomic force microscope (AFM). After that, a single crystal silicon substrate and a glass substrate were bonded to each other using the aluminum oxide film formed under the different conditions, and its adhesion was observed. Here, the speed at which the entire surfaces of the silicon oxide film formed on the single crystal silicon substrate and of the aluminum oxide film formed over the glass substrate were disposed in close contact with each other was measured after they were bonded to each other, and were compared in each condition.

Note that as the single crystal silicon substrate, a single crystal silicon substrate of 5 inches×5 inches was prepared, and as the glass substrate, a glass substrate of 5 inches×5 inches was prepared. As the glass substrate, a glass substrate manufactured by ASAHI GLASS CO., LTD. (product name: AN 100) was used.

Further, as a comparative example, a case in which a glass substrate not provided with an aluminum oxide film was used is also described. As the comparative example, the speed at which the surfaces of the silicon oxide film formed on the single crystal silicon substrate and of the glass substrate were disposed in close contact with each other was measured.

Table 2 shows the results of surface measurement using an AFM of aluminum oxide films formed under the conditions 1 to 3 and their adhesion.

TABLE 2

| Base Substrate side | Power source | Target | Introduced gas | Bias | Film formation rate [nm/min] | Ra [nm] | Speed of being disposed in close contact | |
|---|---|---|---|---|---|---|---|---|
| Glass\AlOx | RF | Al | Ar/O$_2$ | None | 0.51 | 0.20-0.25 | ◎ | Condition 1 |
| | RF | Al$_2$O$_3$ | Ar/O$_2$ | None | 1.74 | 0.17-0.19 | ◎ | Condition 2 |
| | DC | Al | Ar/O$_2$ | Apply | 0.98 | 0.09-0.13 | ◎ | Condition 3 |
| Glass surface | — | — | — | — | — | 0.12-0.17 | ○ | Comparative example |

It was confirmed that as shown in Table 2, average surface roughness (R$_a$) of the surface of the aluminum oxide film formed over the glass substrate was 0.3 nm or less under the conditions 1 to 3, regardless of film formation conditions. Further, it was also confirmed that when the aluminum oxide film was used as a surface to be bonded, the speed of being disposed in close contact was faster and adhesion to the single crystal silicon substrate was higher than when the glass substrate was bonded to the single crystal silicon substrate with the surface of the glass substrate used as a surface to be bonded.

Embodiment 2

This embodiment describes measurement results of surface energy with respect to adhesion when a single crystal silicon substrate and a base substrate were disposed in close contact with each other using a silicon oxide film formed on the single crystal silicon substrate and an aluminum oxide film serving as a base substrate, which was formed over a glass substrate.

First, as shown in FIGS. 31A to 31D, samples A to D were prepared.

In the sample A, an aluminum oxide film a was formed over a glass substrate, and a surface of the aluminum oxide film a and a surface of a silicon oxide film a formed on a single crystal silicon substrate were bonded to each other.

In the sample B, an aluminum oxide film b was formed over the glass substrate, and a surface of the aluminum oxide film b and the surface of the silicon oxide film a formed on the single crystal silicon substrate were bonded to each other.

In the sample C, an insulating film was not formed over the glass substrate, and a surface of the glass substrate and the surface of the silicon oxide film a formed on the single crystal silicon substrate were bonded to each other.

In the sample D, a silicon oxide film b was formed over the glass substrate, and a surface of the silicon oxide film b and the surface of the silicon oxide film a formed on the single crystal silicon substrate were bonded to each other.

The aluminum oxide film a was formed with aluminum oxide used as a sputtering target using high-frequency power source while argon was introduced. A gas flow rate of argon was set to be 30 sccm.

The aluminum oxide film b was formed with aluminum oxide used as a sputtering target using high-frequency power source while argon and oxygen were introduced. A gas flow rate of argon was set to be 30 sccm, and a gas flow rate of oxygen was set to be 10 sccm.

Note that the aluminum oxide film a and the aluminum oxide film b were formed under the following same conditions: a film formation pressure was set to be 0.4 Pa and a film formation power was set to be 1 kW (13.56 MHz).

The silicon oxide film a was formed by performing heat treatment on the single crystal silicon substrate in an oxidation atmosphere containing hydrogen chloride (HCl) at a ratio of 3 vol. % with respect to oxygen at a temperature of 950° C. for 200 minutes.

The silicon oxide film b was formed by a plasma CVD method using tetraethoxysilane (TEOS) and oxygen as film formation gases under the following conditions: a gas flow rate of TEOS was set to be 15 sccm, a gas flow rate of oxygen was set to be 750 sccm, a film formation pressure was set to be 100 Pa, and a film formation power was set to be 300 W (27.12 MHz).

After the samples A to D were prepared, surface energy at bonding interfaces of the samples A to D was measured. Note that measurement of surface energy was performed by a blade method.

The blade method is a method in which a blade is inserted into a bonding interface between a first substrate and a second substrate which are bonded to each other and surface energy (γ) at the bonding interface is calculated based on a distance L between an end portion into which the blade is inserted and an interface where a crack is caused in accordance with the following formula.

$$\gamma = \frac{3t_b^2 E_1 t_{w1}^3 E_2 t_{w2}^3}{16L^4(E_1 t_{w1}^3 + E_2 t_{w2}^3)} \quad \text{[formula 2]}$$

Figure 32:
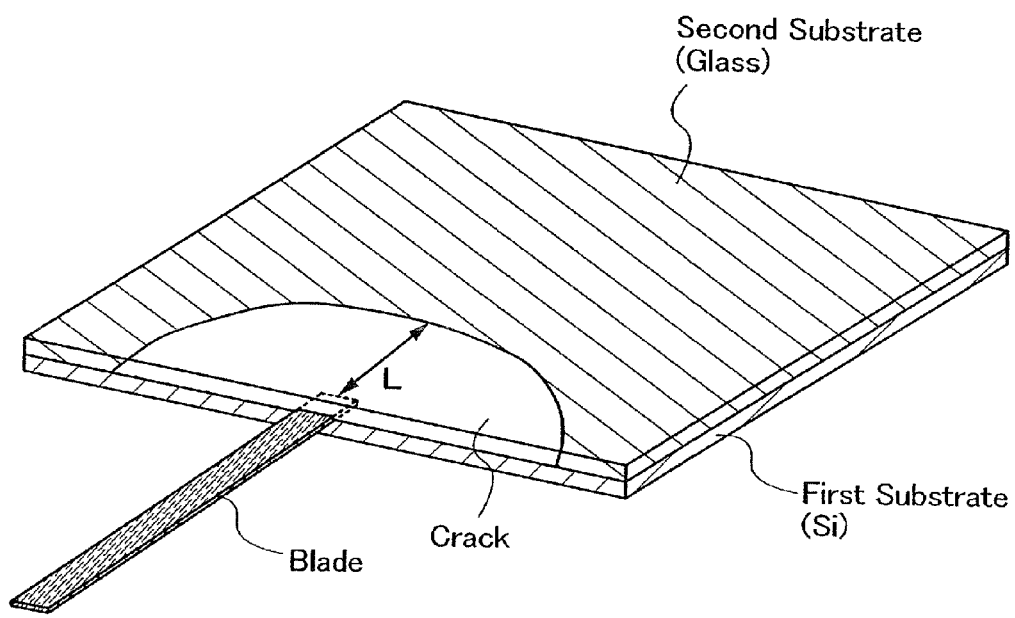
FIG. 32 is a diagram showing a blade method.

Note that, in the above-described formula, t$_b$ represents the thickness of the blade, E$_1$ represents Young's modulus of the first substrate, E$_2$ represents Young's modulus of the second substrate, t$_{w1}$ represents the thickness of the first substrate, t$_{w2}$ represents the thickness of the second substrate, and L represents the distance between an end of the blade and a crack interface (see FIG. 32).

Figure 33:
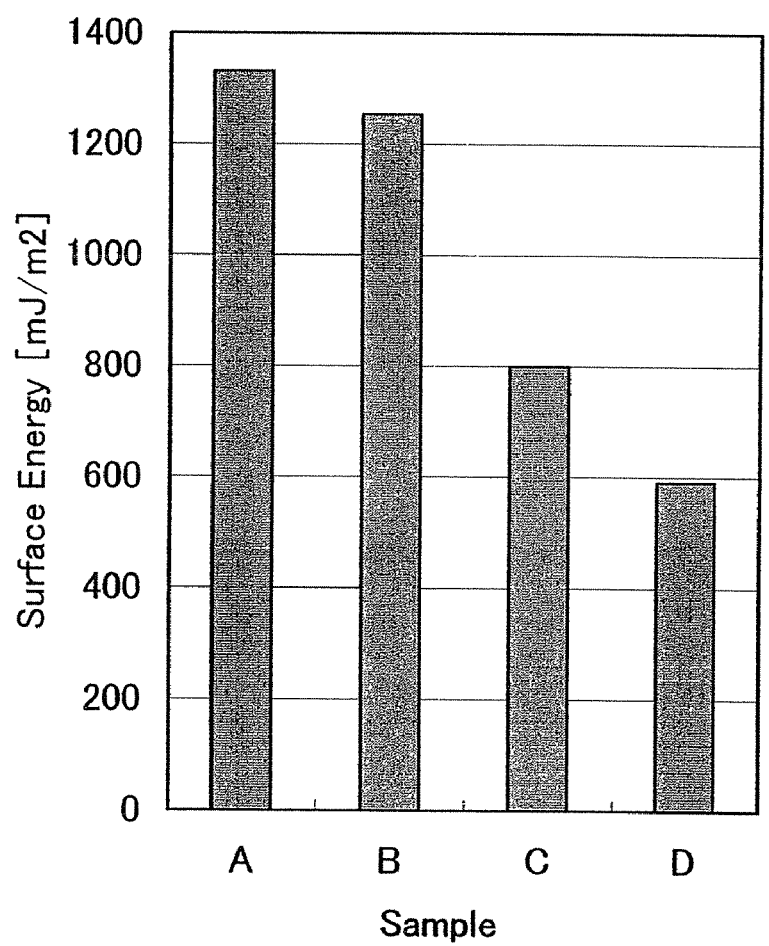
FIG. 33 is a graph showing measurement results of surface energy at bonding interfaces of samples A to D described in Embodiment 2.

FIG. 33 is a graph showing measurement results of surface energy (mJ/m$^2$) at bonding interfaces of the samples A to D.

From the results shown in FIG. 33, it was confirmed that when the aluminum oxide film formed over a glass substrate was bonded, surface energy at the bonding interface was higher than when a glass substrate itself was bonded or a silicon oxide film formed over a glass substrate was bonded. That is, it was thought that by using aluminum oxide, it was possible to improve the bonding strength.

Embodiment 3

This embodiment describes a surface state when planarization treatment was performed on a glass substrate serving as a base substrate.

First, a glass substrate on which chemical mechanical polishing was performed was prepared. Next, planarization treatment was performed on the glass substrate, and surface states of the glass substrate were measured using an atomic force microscope (AFM) before and after planarization treatment. Further, the concentration of Ce contained in glass, which was an abrasive residue, was measured before and after planarization treatment. Note that the concentration of Ce contained in glass was measured by secondary ion mass spectrometry (SIMS).

Planarization treatment was performed on the glass substrate under the following conditions: an electric power used for treatment was set to be 200 W (13.56 MHz), a pressure was set to be 0.6 Pa, a gas flow rate of argon was set to be 50 sccm, and a bias voltage of 500 V was applied to the substrate.

Figure 29A:
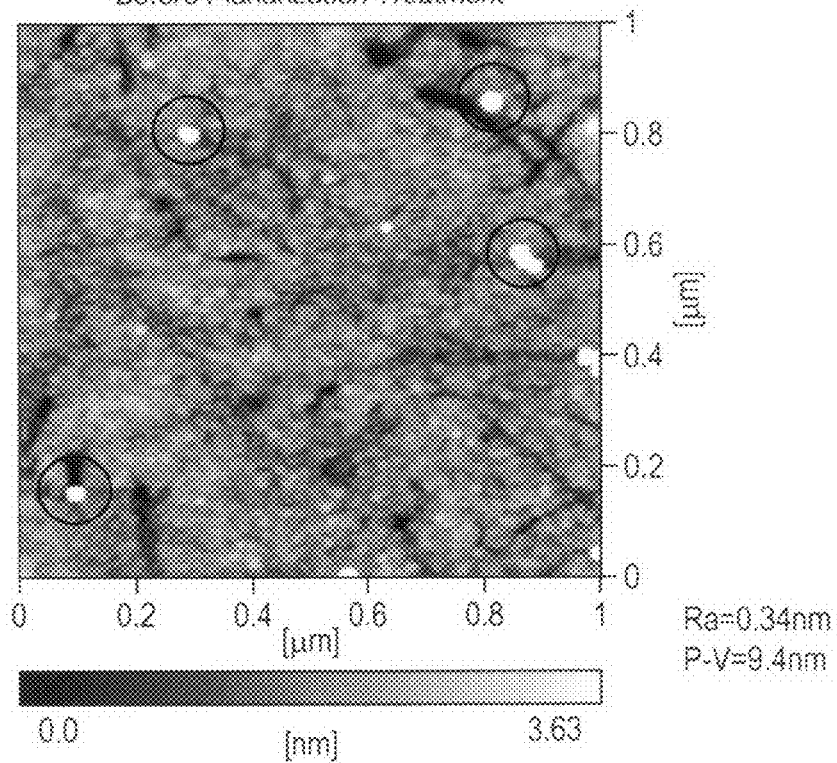
FIGS. 29A and 29B are AFM images showing a surface of a glass substrate before and after planarization treatment.
Figure 29B:
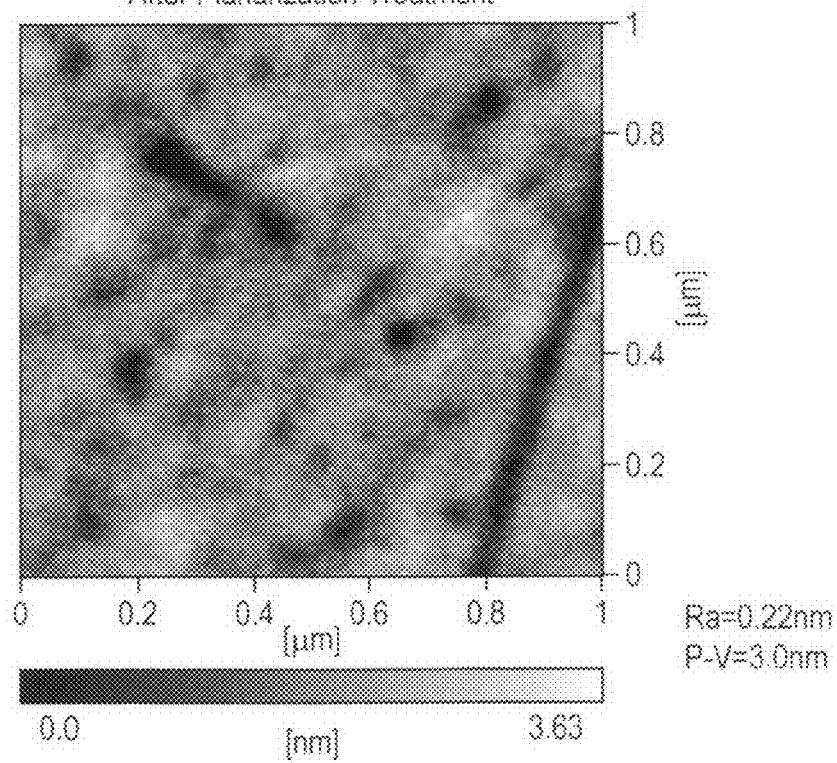
Figure 30:
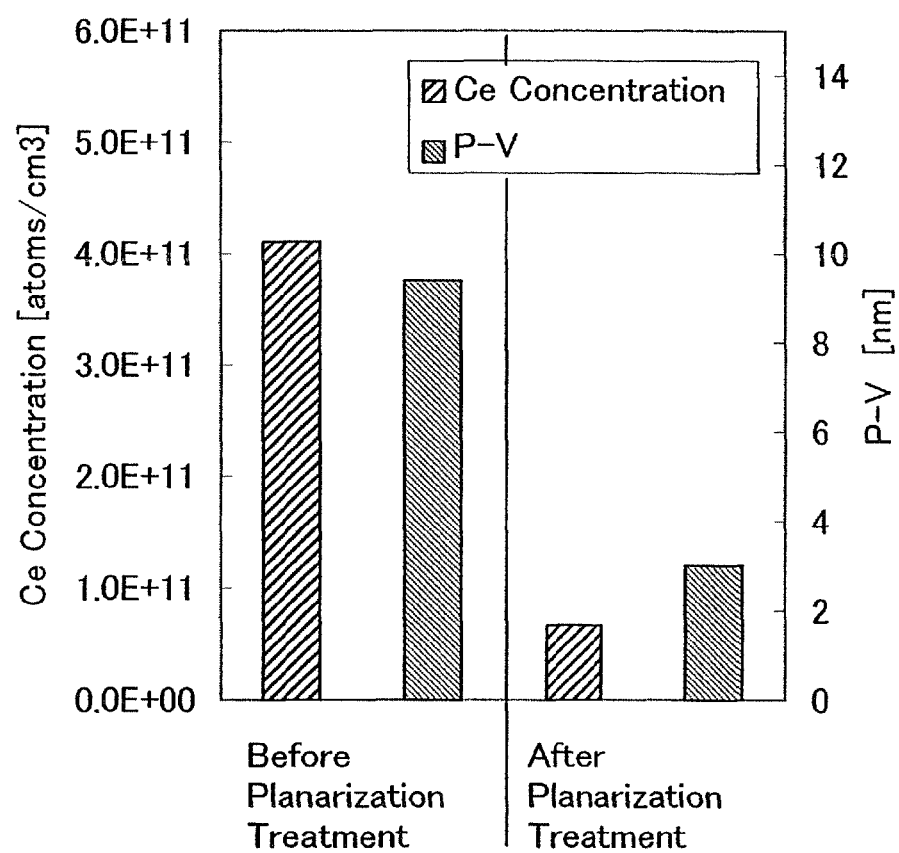
FIG. 30 is a graph showing the concentration of Ce contained in the glass substrate and P–V of a surface of the glass substrate before and after planarization treatment.

FIGS. 29A and 29B are AFM images showing a surface of the glass substrate before and after planarization treatment. FIG. 30 is a graph showing the concentration of Ce contained in the glass substrate before and after planarization treatment and maximum height difference (P–V) of the surface of the glass substrate. Note that in this embodiment, the AFM measuring range was 1 μm×1 μm.

It was observed that cerium oxide ($CeO_2$), which was a residue of an abrasive particle, was attached to the surface of the glass substrate before planarization treatment (see FIG. 29A); however, $CeO_2$ was removed from the surface of the glass substrate after planarization treatment (see FIG. 29B). Further, before planarization treatment, the concentration of cerium (Ce) contained in the glass substrate was $4.1\times10^{11}$ atoms/cm$^3$. After planarization treatment, the concentration of cerium contained in the glass substrate was reduced to $6.7\times10^{10}$ atoms/cm$^3$ (see FIG; 30). From the above result, it was confirmed that planarization treatment made it possible to reduce the concentration of cerium contained in the glass substrate. Furthermore, before planarization treatment, average surface roughness ($R_a$) of the surface of the glass substrate was 0.34 nm and P–V was 9.4 μm. After planarization treatment, $R_a$ of the surface of the glass substrate was reduced to 0.22 nm and P–V was reduced to 3.0 nm. From the above result, it was confirmed that planarization treatment using plasma treatment made it possible to improve planarity of the surface of the glass substrate.

Embodiment 4

This embodiment describes diffusivity of sodium (Na) contained in an aluminum oxide film formed by a sputtering method.

First, an aluminum oxide film was formed over a single crystal silicon substrate by a sputtering method.

Film formation was performed using aluminum as a sputtering target with the use of high-frequency power source while argon and oxygen were introduced. A gas flow rate of argon was set to be 30 sccm, a gas flow rate of oxygen was set to be 10 sccm, a film formation pressure was set to be 0.4 Pa, and a film formation power was set to be 800 W (13.56 MHz).

Subsequently, sodium (Na) was added to an aluminum oxide film, and then sodium contained in the aluminum oxide film was measured. After that, heat treatment was performed, and then sodium contained in the aluminum oxide film was measured again. Note that the concentration of sodium contained in the aluminum oxide film was measured by secondary ion mass spectrometry (SIMS) before and after heat treatment. Note that in this embodiment, the aluminum oxide film was formed directly on the single crystal silicon substrate for measurement in order to analyze diffusivity of sodium contained in the aluminum oxide film.

Further, as a comparative example, a silicon nitride oxide film was formed on the single crystal silicon substrate, and then sodium was added. After that, sodium contained in the silicon nitride oxide film was measured before and after heat treatment. The silicon nitride oxide film was formed by a plasma CVD method.

As addition of sodium to the aluminum oxide film, sodium ions were added to the aluminum oxide film by an ion doping method under the following conditions: an applied voltage was set to be 25 kV and a dosage was set to be $1.7\times10^{14}$ ions/cm$^2$. Further, as addition of sodium to the silicon nitride oxide film, sodium ions were added to the silicon nitride oxide film by an ion doping method under the following conditions: an applied voltage was set to be 20 kV and a dosage was set to be $1.7\times10^{14}$ ions/cm$^2$.

Furthermore, heat treatment was performed in a nitrogen atmosphere at a temperature of 600° C. for four hours.

Figure 34A:
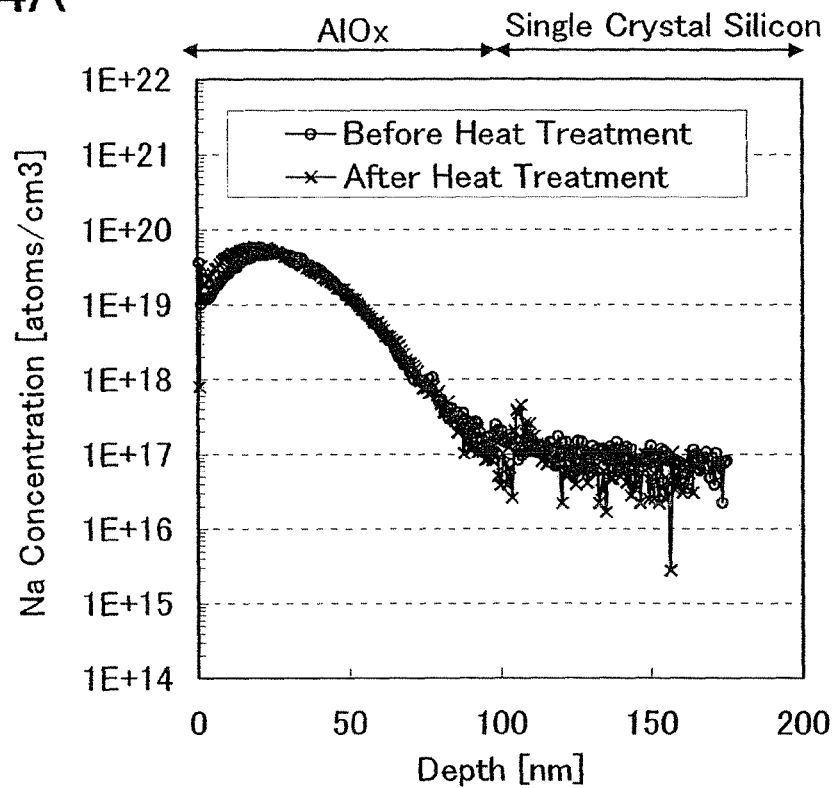
FIGS. 34A and 34B are graphs each showing diffusivity of sodium in an aluminum oxide film before and after heat treatment.

FIG. 34A shows a measurement result of the concentration of sodium contained in the aluminum oxide film before and after heat treatment. Further, FIG. 34B shows measurement results of the concentration of sodium contained in the silicon nitride oxide film before and after heat treatment.

Figure 34B:
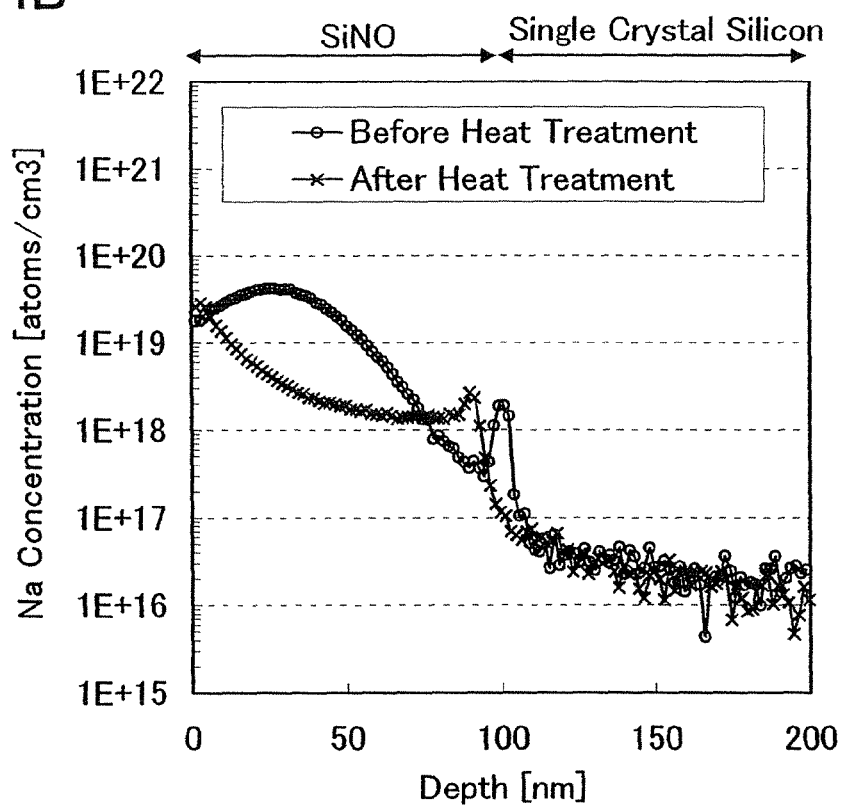

As shown in FIGS. 34A and 34B, change caused by heat treatment in the concentration of the sodium element contained in the aluminum oxide film was small. Thus, it can be said that even if heat treatment is performed, sodium contained in the aluminum oxide film is less likely to be diffused. Accordingly, it was confirmed that formation of the aluminum oxide film between the glass substrate and a single crystal silicon layer made it possible to prevent an impurity such as sodium contained in the glass substrate from being diffused into the single crystal silicon layer.

This application is based on Japanese Patent Application serial nos. 2007-338907 and 2007-339378 filed with Japan Patent Office on Dec. 28, 2007, the entire contents of which are hereby incorporated by reference.

What is claimed is:

1. A method for manufacturing an SOI substrate, comprising the steps of:
   forming a first insulating film comprising silicon over a single crystal semiconductor substrate;
   forming a separation layer in the single crystal semiconductor substrate by introducing ions through a surface of the single crystal semiconductor substrate;
   forming a second insulating film containing aluminum oxide over a base substrate while a planarization treatment is performed;
   bonding a surface of the first insulating film to a surface of the second insulating film by making the single crystal semiconductor substrate and the base substrate face each other; and
   forming a single crystal semiconductor film over the base substrate with the second insulating film and the first insulating film interposed therebetween by performing separation at the separation layer.

2. The method for manufacturing an SOI substrate according to claim 1,
   wherein plasma treatment is performed on the base substrate by applying a bias voltage as the planarization treatment.

3. The method for manufacturing an SOI substrate according to claim 2,
   wherein the plasma treatment is performed using an argon gas.

4. The method for manufacturing an SOI substrate according to claim 1,
   wherein the second insulating film is formed by a sputtering method.

5. The method for manufacturing an SOI substrate according to claim 4,
wherein the sputtering method is employed by using aluminum, an alloy containing aluminum and magnesium, an alloy containing aluminum and strontium, or an alloy containing aluminum, magnesium, and strontium as a target and introducing oxygen.

6. The method for manufacturing an SOI substrate according to claim 4,
wherein the sputtering method is employed by using an aluminum oxide, an oxide containing aluminum and magnesium, an oxide containing aluminum and strontium, or an oxide containing aluminum, magnesium, and strontium as a target and using a high-frequency power source.

7. The method for manufacturing an SOI substrate according to claim 1,
wherein the first insulating film is formed by performing thermal oxidation treatment in an oxidation atmosphere to which halogen is added.

8. The method for manufacturing an SOI substrate according to claim 1,
wherein a glass substrate is used as the base substrate.

9. A method for manufacturing an SOI substrate, comprising the steps of:
forming a first insulating film comprising silicon over a single crystal semiconductor substrate;
forming a separation layer in the single crystal semiconductor substrate by introducing ions through a surface of the single crystal semiconductor substrate;
forming a second insulating film containing aluminum oxide over a base substrate while a planarization treatment is performed;
performing surface treatment on either one or both of a surface of the first insulating film and a surface of the second insulating film before the surface of the first insulating film and the surface of the second insulating film are bonded to each other;
bonding the surface of the first insulating film to the surface of the second insulating film by making the single crystal semiconductor substrate and the base substrate face each other; and
forming a single crystal semiconductor film over the base substrate with the second insulating film and the first insulating film interposed therebetween by performing separation at the separation layer.

10. The method for manufacturing an SOI substrate according to claim 9,
wherein plasma treatment is performed on the base substrate by applying a bias voltage as the planarization treatment.

11. The method for manufacturing an SOI substrate according to claim 10,
wherein the plasma treatment is performed using an argon gas.

12. The method for manufacturing an SOI substrate according to claim 9,
wherein the second insulating film is formed by a sputtering method.

13. The method for manufacturing an SOI substrate according to claim 12,
wherein the sputtering method is employed by using aluminum, an alloy containing aluminum and magnesium, an alloy containing aluminum and strontium, or an alloy containing aluminum, magnesium, and strontium as a target and introducing oxygen.

14. The method for manufacturing an SOI substrate according to claim 12,
wherein the sputtering method is employed by using an aluminum oxide, an oxide containing aluminum and magnesium, an oxide containing aluminum and strontium, or an oxide containing aluminum, magnesium, and strontium as a target and using a high-frequency power source.

15. The method for manufacturing an SOI substrate according to claim 9,
wherein the surface treatment is performed using ozone water.

16. The method for manufacturing an SOI substrate according to claim 9,
wherein the first insulating film is formed by performing thermal oxidation treatment in an oxidation atmosphere to which halogen is added.

17. The method for manufacturing an SOI substrate according to claim 9,
wherein a glass substrate is used as the base substrate.

18. A method for manufacturing an SOI substrate, comprising the steps of:
forming a first insulating film comprising silicon over each of a plurality of single crystal semiconductor substrates;
forming a separation layer in each of the plurality of single crystal semiconductor substrates by introducing ions through a surface of each of the plurality of single crystal semiconductor substrates;
forming a second insulating film containing aluminum oxide over a base substrate while a planarization treatment is performed;
bonding a surface of the first insulating film to a surface of the second insulating film by making each of the plurality of single crystal semiconductor substrates and the base substrate face each other; and
forming a plurality of stacked layer bodies each including the first insulating film and a single crystal semiconductor film over the second insulating film provided over the base substrate by performing separation at the separation layer.

19. The method for manufacturing an SOI substrate according to claim 18,
wherein plasma treatment is performed on the base substrate by applying a bias voltage as the planarization treatment.

20. The method for manufacturing an SOI substrate according to claim 19,
wherein the plasma treatment is performed using an argon gas.

21. The method for manufacturing an SOI substrate according to claim 18,
wherein the second insulating film is formed by a sputtering method.

22. The method for manufacturing an SOI substrate according to claim 21,
wherein the sputtering method is employed by using aluminum, an alloy containing aluminum and magnesium, an alloy containing aluminum and strontium, or an alloy containing aluminum, magnesium, and strontium as a target and introducing oxygen.

23. The method for manufacturing an SOI substrate according to claim 21,
wherein the sputtering method is employed by using an aluminum oxide, an oxide containing aluminum and magnesium, an oxide containing aluminum and strontium, or an oxide containing aluminum, magnesium, and strontium as a target and using a high-frequency power source.

24. The method for manufacturing an SOI substrate according to claim 18,
wherein the first insulating film is formed by performing thermal oxidation treatment in an oxidation atmosphere to which halogen is added.

25. The method for manufacturing an SOI substrate according to claim 18,
wherein a glass substrate is used as the base substrate.

26. A method for manufacturing an SOI substrate, comprising the steps of:
forming a first insulating film comprising silicon over each of a plurality of single crystal semiconductor substrates;
forming a separation layer in each of the plurality of single crystal semiconductor substrates by introducing ions through a surface of each of the plurality of single crystal semiconductor substrates;
forming a second insulating film containing aluminum oxide over a base substrate while a planarization treatment is performed;
performing surface treatment on either one or both of a surface of the first insulating film and a surface of the second insulating film before the surface of the first insulating film and the surface of the second insulating film are bonded to each other
bonding the surface of the first insulating film to the surface of the second insulating film by making each of the plurality of single crystal semiconductor substrates and the base substrate face each other; and
forming a plurality of stacked layer bodies each including the first insulating film and a single crystal semiconductor film over the second insulating film provided over the base substrate by performing separation at the separation layer.

27. The method for manufacturing an SOI substrate according to claim 26,
wherein plasma treatment is performed on the base substrate by applying a bias voltage as the planarization treatment.

28. The method for manufacturing an SOI substrate according to claim 27,
wherein the plasma treatment is performed using an argon gas.

29. The method for manufacturing an SOI substrate according to claim 26,
wherein the second insulating film is formed by a sputtering method.

30. The method for manufacturing an SOI substrate according to claim 29,
wherein the sputtering method is employed by using aluminum, an alloy containing aluminum and magnesium, an alloy containing aluminum and strontium, or an alloy containing aluminum, magnesium, and strontium as a target and introducing oxygen.

31. The method for manufacturing an SOI substrate according to claim 29,
wherein the sputtering method is employed by using an aluminum oxide, an oxide containing aluminum and magnesium, an oxide containing aluminum and strontium, or an oxide containing aluminum, magnesium, and strontium as a target and using a high-frequency power source.

32. The method for manufacturing an SOI substrate according to claim 26,
wherein the surface treatment is performed using ozone water.

33. The method for manufacturing an SOI substrate according to claim 26,
wherein the first insulating film is formed by performing thermal oxidation treatment in an oxidation atmosphere to which halogen is added.

34. The method for manufacturing an SOI substrate according to claim 26,
wherein a glass substrate is used as the base substrate.

* * * * *